(12) United States Patent
Hayashi

(10) Patent No.: US 11,669,175 B2
(45) Date of Patent: Jun. 6, 2023

(54) ELECTRONIC EQUIPMENT

(71) Applicant: Susa Inc., Okayama (JP)

(72) Inventor: Yukinori Hayashi, Okayama (JP)

(73) Assignee: Susa Inc., Okayama (JP)

( * ) Notice: Subject to any disclaimer, the term of this patent is extended or adjusted under 35 U.S.C. 154(b) by 307 days.

(21) Appl. No.: 17/118,764

(22) Filed: Dec. 11, 2020

(65) Prior Publication Data

US 2021/0191535 A1  Jun. 24, 2021

(30) Foreign Application Priority Data

Dec. 17, 2019 (JP) .............................. JP2019-226956
Aug. 31, 2020 (JP) .............................. JP2020-145152

(51) Int. Cl.
  *G06F 3/0354* (2013.01)
  *H05K 5/02* (2006.01)
  *H05K 1/11* (2006.01)

(52) U.S. Cl.
  CPC ......... *G06F 3/03541* (2013.01); *H05K 1/118* (2013.01); *H05K 5/0213* (2013.01)

(58) Field of Classification Search
  None
  See application file for complete search history.

(56) References Cited

U.S. PATENT DOCUMENTS

| 6,541,762 B2 | 4/2003 | Kang et al. |
| 10,318,021 B2 | 6/2019 | Hayashi |
| 2003/0034441 A1 | 2/2003 | Kang et al. |
| 2004/0080496 A1 | 4/2004 | Cheon et al. |

(Continued)

FOREIGN PATENT DOCUMENTS

| CN | 1963732 A | 5/2007 |
| JP | S60-123036 A | 7/1985 |
| JP | H09-267980 A | 10/1997 |

(Continued)

OTHER PUBLICATIONS

Office Action for Korean Patent Application No. 10-2020-0173654 dated Aug. 12, 2022 and its English translation.

*Primary Examiner* — Fred Tzeng

(74) *Attorney, Agent, or Firm* — McCormick, Paulding & Huber PLLC

(57) ABSTRACT

A mouse as an example of an electronic equipment can be used in medical settings and includes a housing that can be gripped by a hand, a substrate which is arranged in a space in the housing and on which an electronic circuit component for calculating a state of the mouse is mounted, and an optical element (lens) which is arranged in a part of a bottom portion (housing bottom portion) of the housing and through which image light from outside enters. The optical element and the electronic circuit component are connected by a transmission unit capable of transmitting the image light. The substrate is arranged so as to be separated from the housing bottom portion upward in a Z direction by a distance between a lower surface of the housing bottom portion and a lower surface of the electronic circuit component in the Z direction and/or by a distance between an upper surface of the housing bottom portion and a lower surface of the substrate in the Z direction. For example, an optical fiber is used as the transmission unit.

24 Claims, 28 Drawing Sheets

(56) References Cited

U.S. PATENT DOCUMENTS

2009/0162808 A1* 6/2009 Nyholm ................ A61C 19/00
433/25
2017/0308188 A1* 10/2017 Hayashi ............. G06F 3/03543

FOREIGN PATENT DOCUMENTS

| JP | H09-319515 | 12/1997 |
|---|---|---|
| JP | 2017-079049 A | 4/2017 |
| KR | 10-2003-0015016 A | 4/2004 |
| KR | 10-2005-0073871 A | 1/2006 |
| KR | 10-2013-0067289 A | 11/2013 |
| TW | 569169 B | 1/2004 |
| TW | I233565 B | 6/2005 |
| TW | I626526 B | 6/2018 |

* cited by examiner

<FIRST EMBODIMENT>

<FIRST EMBODIMENT>

<FIRST EMBODIMENT>
(FIRST WIRING EXAMPLE)

<FIRST EMBODIMENT>

FIRST EXAMPLE

<FIRST EMBODIMENT>

SECOND EXAMPLE

<FIRST EMBODIMENT>

THIRD EXAMPLE

<FIRST EMBODIMENT-FIRST MODIFICATION>

<FIRST EMBODIMENT-FIRST MODIFICATION>

<SECOND EMBODIMENT>

<SECOND EMBODIMENT>

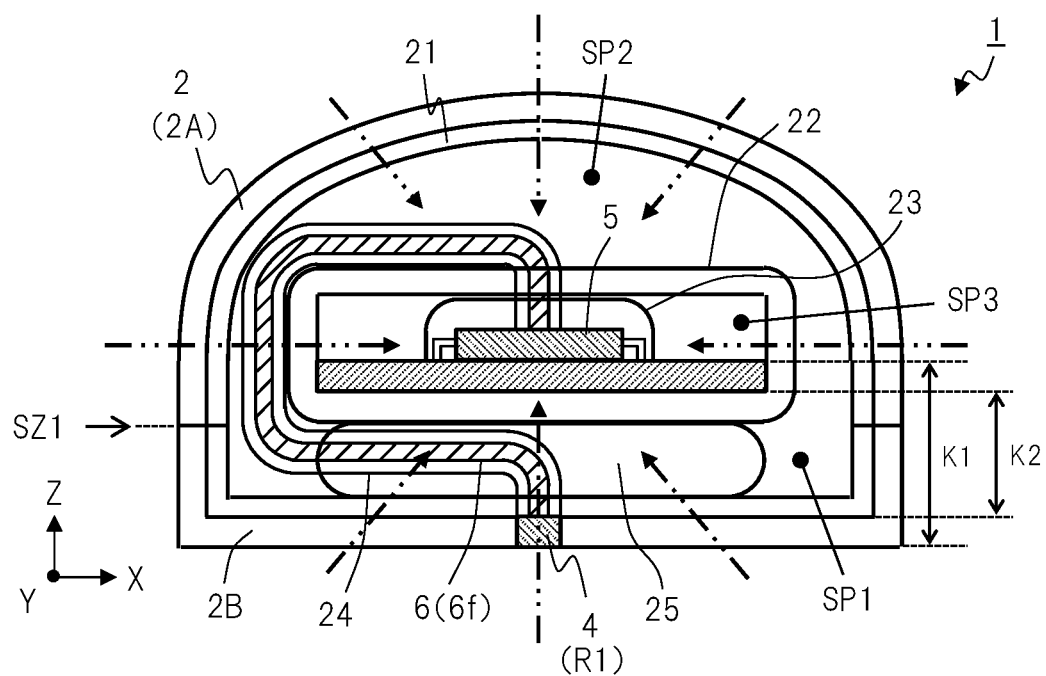

<SECOND EMBODIMENT>

<SECOND EMBODIMENT>

<SECOND EMBODIMENT-SECOND MODIFICATION>

<SECOND EMBODIMENT-SECOND MODIFICATION>

<SECOND EMBODIMENT-THIRD MODIFICATION>

<SECOND EMBODIMENT-FOURTH MODIFICATION>

<SECOND EMBODIMENT-FOURTH MODIFICATION>

<SECOND EMBODIMENT-MODIFICATION
(SECOND WIRING EXAMPLE)>

<SECOND EMBODIMENT-MODIFICATION
(SECOND WIRING EXAMPLE)>

<SECOND EMBODIMENT-MODIFICATION
(THIRD WIRING EXAMPLE)>

<SECOND EMBODIMENT-MODIFICATION
(THIRD WIRING EXAMPLE)>

<SECOND EMBODIMENT-MODIFICATION
(FIRST POSITIONAL RELATIONSHIP EXAMPLE)>

<SECOND EMBODIMENT-MODIFICATION
(FIRST POSITIONAL RELATIONSHIP EXAMPLE)>

<SECOND EMBODIMENT-MODIFICATION
(SECOND POSITIONAL RELATIONSHIP EXAMPLE)>

<SECOND EMBODIMENT-MODIFICATION
(SECOND POSITIONAL RELATIONSHIP EXAMPLE)>

<SECOND EMBODIMENT-MODIFICATION (FOURTH WIRING EXAMPLE)>

<SECOND EMBODIMENT-MODIFICATION (FOURTH WIRING EXAMPLE)>

<SECOND EMBODIMENT-MODIFICATION
(FIFTH WIRING EXAMPLE)>

<THIRD EMBODIMENT>

<FOURTH EMBODIMENT>

<FOURTH EMBODIMENT>

<FIFTH EMBODIMENT>

FIRST EXAMPLE

<FIFTH EMBODIMENT>

SECOND EXAMPLE

<SIXTH EMBODIMENT>

<SIXTH EMBODIMENT-FIFTH MODIFICATION>

<EIGHTH EMBODIMENT>

<EIGHTH EMBODIMENT-MODIFICATION>

FIG. 25
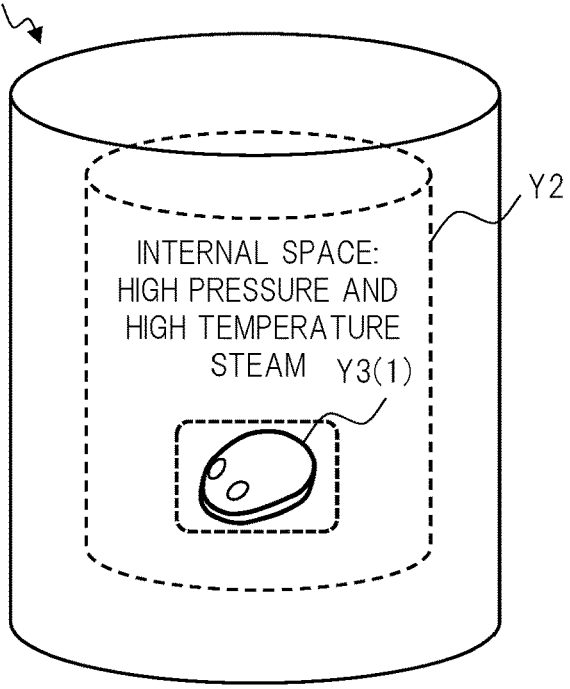
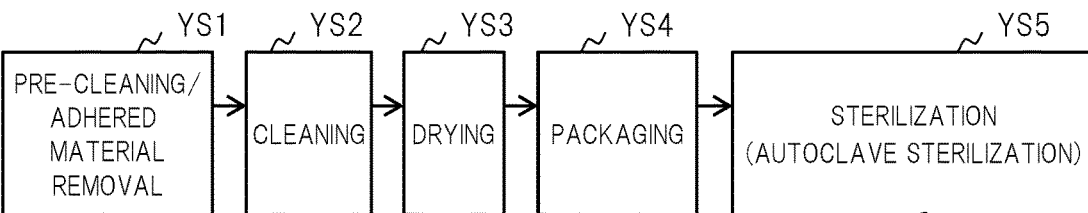
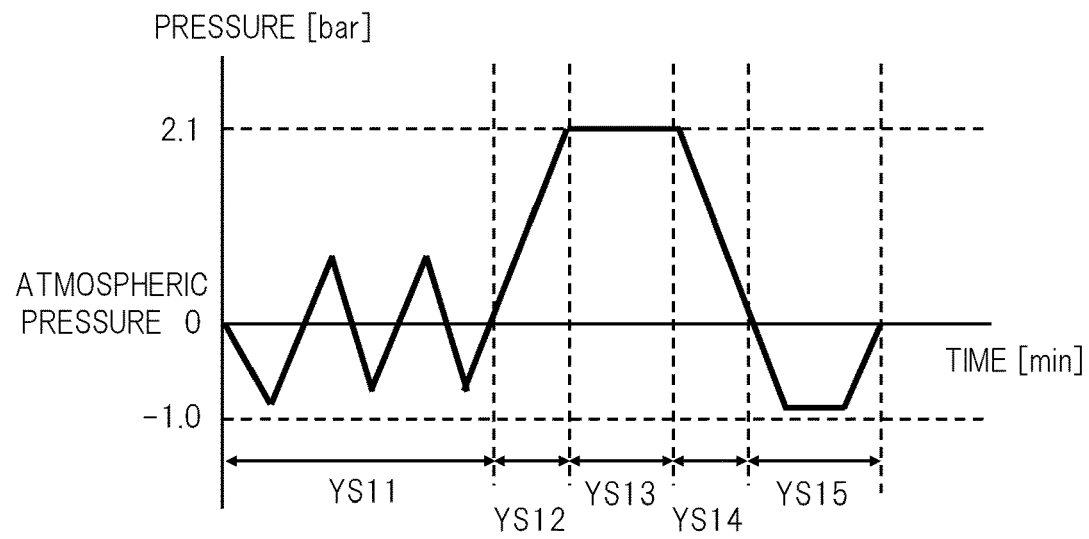

ELECTRONIC EQUIPMENT

CROSS-REFERENCE TO RELATED APPLICATION

The present application claims priority from Japanese Patent Applications No. 2019-226956 filed on Dec. 17, 2019 and No. 2020-145152 filed on Aug. 31, 2020, the contents of which are hereby incorporated by reference into this application.

TECHNICAL FIELD OF THE INVENTION

The present invention relates to an electronic equipment, and more particularly relates to a special electronic equipment suitable for use in medical settings and others among electronic equipments such as a mouse as an input and operation device for a computer, a tablet terminal, a mobile terminal, an intraoral camera, and the like.

BACKGROUND OF THE INVENTION

Examples of the electronic equipment include an optical mouse or the like as a mouse used for general office work. Conventionally, an optical mouse is generally provided with optical components such as a lens and a light guide in an opening at the bottom portion of a mouse housing, and an image sensor, an electronic circuit component, and the like are provided near the optical components inside the mouse housing. The optical mouse realizes the mouse function by detecting images from light entering through the lens by the image sensor and calculating the moving state of the mouse from the difference between the images at each time point by the electronic circuit component.

A system including a computer and a mouse has been widely used in various kinds of environments such as the medical settings including hospitals, and it is certain that its use will continue to expand. For example, there is a need to provide advanced medical treatment using a system including a mouse in an environment such as a doctor's office or an operating room. As an example of use, images for medical treatment and surgery (two-dimensional and three-dimensional images) are displayed on a display screen of the system including a PC or a dedicated medical equipment, and doctors and the like perform medical treatment and surgery while operating the mouse.

As a prior art technology relating to a mouse, Japanese Unexamined Patent Application Publication No. H09-319515 (Patent Document 1) is known. In the Patent Document 1, a mouse as an input device for a computer and a cover for the mouse are described, the cover made of light-transparent synthetic resin is molded with antibacterial treatment, and the cover is attached to the mouse for use.

SUMMARY OF THE INVENTION

Conventionally, medical instruments and the like used in the medical settings have been disinfected and sterilized at the necessary level in order to prevent infection. The sterilization treatment includes, for example, an autoclave treatment. In the autoclave treatment, the object is exposed to a predetermined high temperature and high pressure steam for a predetermined time or longer. For medical mice, disinfection treatment, preferably sterilization treatment is required in order to prevent infection, and the mice are required to have capabilities in terms of heat resistance, water resistance, pressure resistance, waterproofing, and the like.

However, the conventional mouse for general office work cannot withstand the sterilization treatment by the high temperature and high pressure steam such as the autoclave treatment. The optical mouse is configured to include components sensitive to heat and water such as electronic circuit components and others. In the optical mouse, in order to realize the mouse function, constituent elements such as a lens, an image sensor, an electronic circuit component, a light source unit, a power source unit, and the like are arranged in contact with a bottom portion of a housing. Therefore, when the autoclave treatment is applied to the optical mouse, the heat of the high temperature and high pressure steam is directly transmitted to the components in the housing such as the electronic circuit components particularly through the opening at the bottom portion of the housing, and the steam easily infiltrates, with the result that the components are greatly damaged and the mouse function cannot be executed.

An object of the present invention is to provide a special electronic equipment such as a mouse, a tablet terminal, a mobile terminal, and the like capable of withstanding severe treatment conditions of the sterilization treatment by the high temperature and high pressure steam in the autoclave equipment and suitable for use in medical settings and others, totally different from the general electronic equipment for input and operation in the computer for office work.

The typical embodiment of the present invention has the configuration shown below. Namely, an electronic equipment according to one embodiment is an electronic equipment which can be used in medical settings, and the electronic equipment comprises: a housing; a substrate arranged in an internal space of the housing; an electronic circuit component composed of an electronic element mounted on the substrate; an optical element or an imaging element which is arranged in a part of the housing and through which image light from outside enters as an optical signal; and a transmission unit which connects the optical element or the imaging element and the electronic circuit component and can transmit the image light or an electric signal corresponding to the image light between the optical element or the imaging element and the electronic circuit component, wherein the substrate and the electronic circuit component are arranged so as to be separated from the part of the housing where the optical element or the imaging element is arranged, via a first space portion.

According to a typical embodiment of the present invention, it is possible to obtain electronic equipments such as a mouse, a tablet terminal, a mobile terminal, and the like capable of withstanding the sterilization treatment by the high temperature and high pressure steam in the autoclave equipment, capable of being used in medical settings, and capable of contributing to the infection prevention and the improvement in medical efficiency.

BRIEF DESCRIPTIONS OF THE DRAWINGS

FIG. 8 is a transverse cross-sectional view showing a thermal insulation structure and others of the mouse according to the second embodiment;

FIG. 25 is an explanatory diagram of an example in which the autoclave sterilization treatment is applied to the mouse according to the present invention;

DESCRIPTIONS OF THE PREFERRED EMBODIMENTS

Hereinafter, embodiments of the present invention will be described in detail with reference to drawings. Note that the same components are denoted by the same reference signs throughout the drawings in principle, and the repetitive descriptions thereof are omitted.

First Embodiment

A mouse according to the first embodiment as an example of the electronic equipment of the present invention will be described with reference to FIG. 1 to FIG. 6. The mouse according to the first embodiment is a medical mouse to which the autoclave sterilization treatment can be applied for improving the hygienic environment in the medical settings such as hospitals, in other words, a sterilizable mouse. For example, there are cases where a system including a computer or medical equipment to which a mouse is connected is desired to be used for examination or surgery. In that case, by using the sterilized mouse, infection prevention can be ensured, and advanced medical treatment can be realized by using the function of the system such as navigation surgery. For example, by operating the mouse by the surgeon himself/herself, the picture of the three-dimensional image can be acquired more reliably, and the quality of surgery and the like can be improved. Not only does this mouse have the function of the optical mouse, but the sterilization treatment such as autoclave treatment can be applied to the mouse together with medical instruments in the usage environment such as medical settings, thereby bringing the effects of infection prevention and the improvement in medical efficiency.

Figure 2:
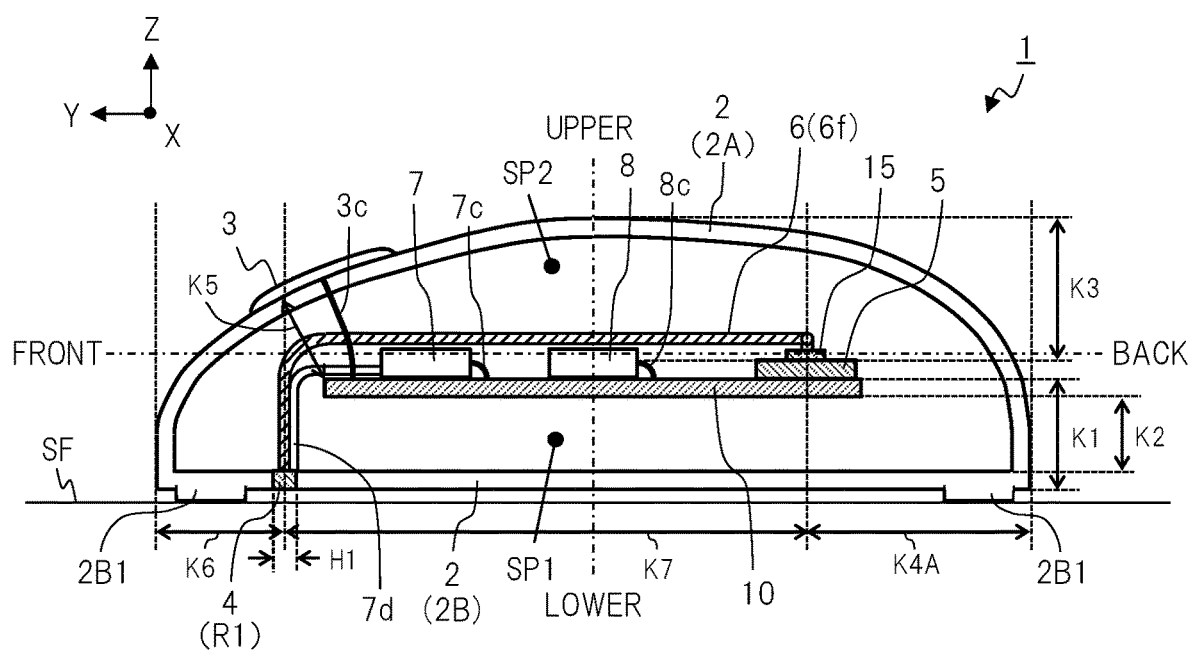
FIG. 2 is a longitudinal cross-sectional view of a main part of the mouse according to the first embodiment.

A basic configuration including a transmission unit will be first described in the first embodiment, and a configuration to which a thermal insulation structure and others are added will be then described in the second and following embodiments. As shown in FIG. 2 and others, the mouse according to the first embodiment has a structure in which constituent elements for the mouse function are arranged so as to be spatially separated by using a transmission unit 6. In this structure, a lens 4 which is an optical element in an opening R1 of a housing bottom portion 2B and components such as an electronic circuit component 5 on a substrate 10 are separated vertically and connected by the transmission unit 6 such as an optical fiber 6f.

[1-1: Overall Mouse]

Figure 1:
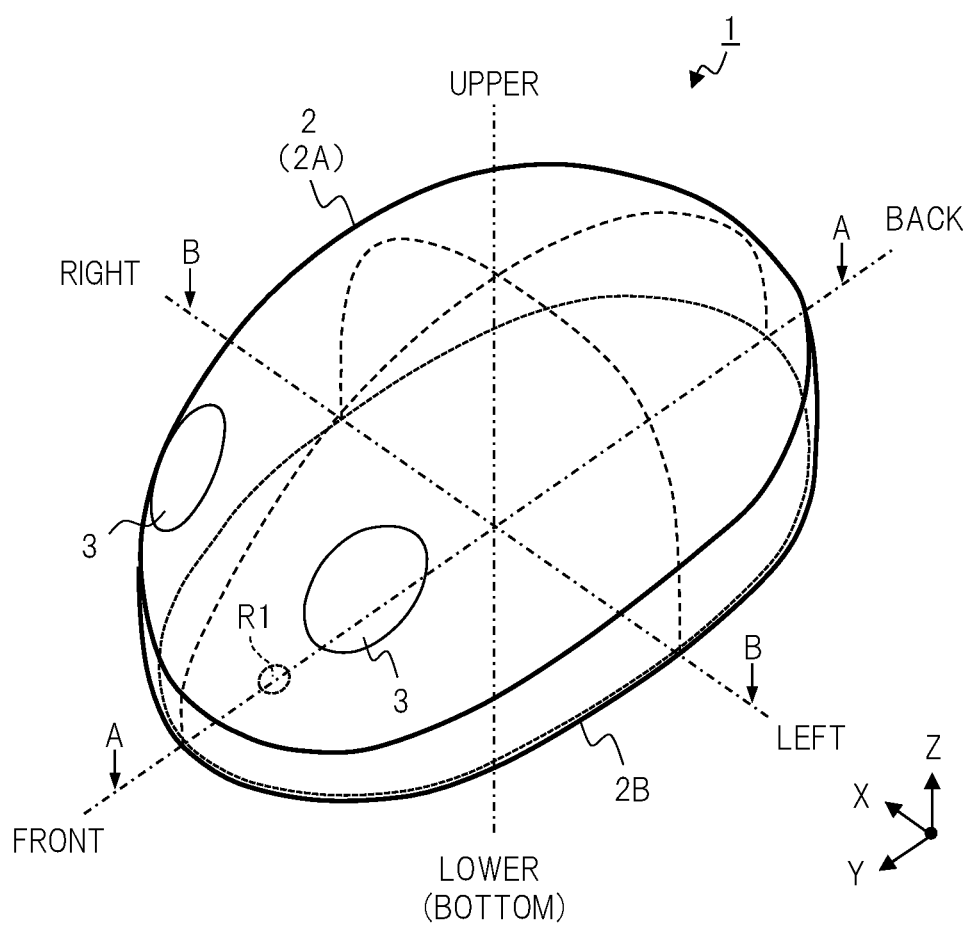
FIG. 1 is a perspective view showing an outer appearance of a mouse according to the first embodiment which is an example of an electronic equipment of the present invention.

FIG. 1 is a perspective view showing a schematic configuration of an overall outer appearance of a mouse 1 which is the mouse according to the first embodiment. The mouse 1 is a medical mouse functioning as an input device for a computer. A housing 2 of the mouse 1 includes a housing upper portion 2A and the housing bottom portion 2B. The housing upper portion 2A is a portion gripped by the hand of a user and has a substantially elliptically curved surface shape or a free curved surface shape. Buttons 3 (sometimes referred to as switch buttons, click buttons, or the like) for input operations, for example, two left and right buttons 3 are provided at a position on a front side of the housing upper portion 2A. The button 3 is a button that can be pressed down with a finger in association with an operation such as a click by the user. The case of the two-button system is shown, but the system is not limited to this, and a system having an arbitrary number of buttons including one button, three buttons, and others is also possible. The housing bottom portion 2B is a substantially flat plate-shaped portion to be placed on a mouse seating surface. The opening R1 in which an optical element or the like is installed is provided at a position of the housing bottom portion 2B dislocated from the central position of the housing 2 in the longitudinal direction. The housing upper portion 2A and the housing bottom portion 2B are joined after the components are housed inside when the mouse is manufactured. As the mouse 1 according to the first embodiment, the mouse of a wireless communication type and a wireless charging type is shown, and there is no cable or the like that comes out to the outside of the housing 2 in this configuration.

Figure 3:
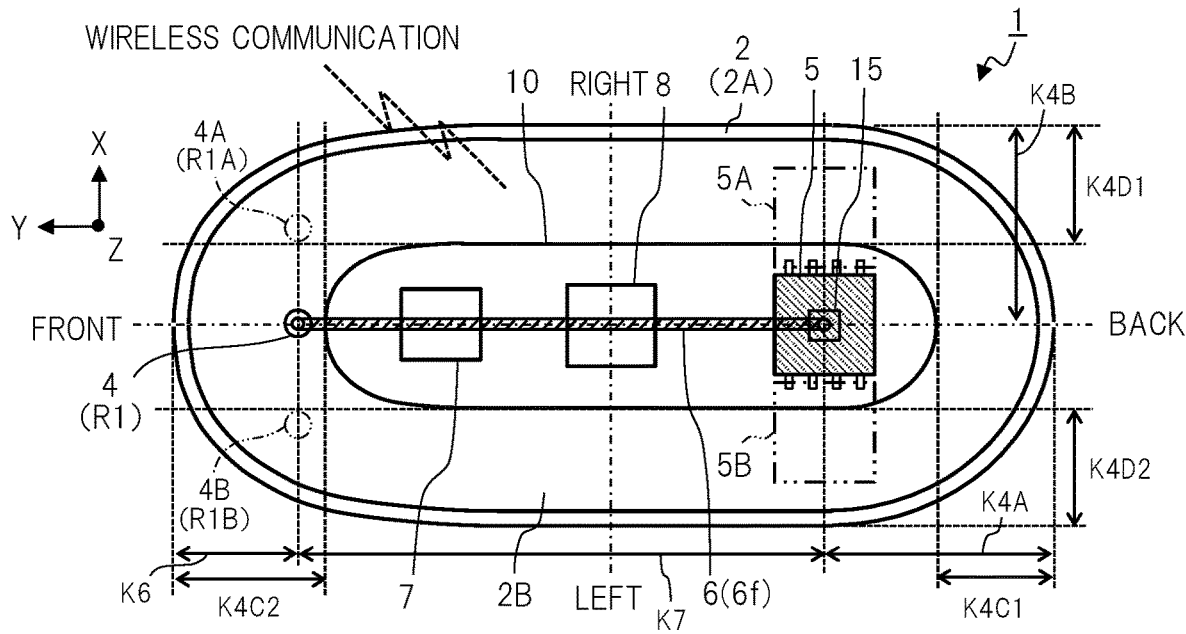
FIG. 3 is a configuration diagram of the main part of the mouse according to the first embodiment on a horizontal plane.

The mouse 1 according to the first embodiment shown in FIG. 2 to FIG. 5 has the configuration (a) in which the optical fiber 6f is used as the transmission unit 6, the configuration (b) in which the transmission unit 6 is provided as the wiring passing on the front side of the housing 2, and the configuration (c) in which a light source unit 7 and a power source unit 8 are provided. Further, this configuration example shows the case (d) in which one electronic circuit component 5 is provided on the substrate 10, and has the positional relationship (e) between the lens 4 in the opening R1 and the electronic circuit component 5 on the substrate 10 in plan view on the horizontal plane, in which the electronic circuit component 5 is arranged at the position on the substrate 10 as far as possible from the opening R1 in the longitudinal direction of the housing 2 (position on the right side opposite to the position of the opening R1 on the left side in FIG. 3), so that the heat conduction due to the heat entering from the outside of the mouse through the opening R1 is prevented. Also, the mouse 1 has the configuration (f) in which not only the electronic circuit component 5 but also the light source unit 7 and the power source unit 8 are arranged on the substrate 10 so as to reduce the heat entering from the outside of the mouse to the substrate 10 from below through the opening R1 as much as possible. In addition, as shown in FIG. 3, the planar shape of the substrate 10 (g) is formed to be a substantially elliptical shape similar to the substantially elliptical shape which is the shape of the inner surface of the structural surface of the housing 2, so that the substrate 10 is separated from the structural surface of the housing 2 as even and as large as possible around the entire circumference of the substrate 10 as described later, thereby reducing the heat and the like entering from the outside through the structural surface of the housing 2 as much as possible. Note that the substrate 10 can be supported by, for example, supporting means preferably made of a thermal insulation material or the like, but the illustration thereof is omitted in FIG. 2 for convenience of clarifying the description.

[1-2: Longitudinal Cross-Section of Mouse]

FIG. 2 shows a schematic longitudinal cross-section of the mouse 1 according to the first embodiment (Y-Z plane corresponding to a line A-A in FIG. 1). FIG. 2 shows the state in which the housing bottom portion 2B is placed on the seating surface SF such as a mouse pad. Convex portions 2B1 are provided at some parts of the housing bottom portion 2B. The convex portions 2B1 are formed by, for example, polishing and coating. Thus, a space for taking the light is formed between the seating surface SF and the main surface of the housing bottom portion 2B.

The button 3 of the housing 2 shown in FIG. 2 is of the configuration type having no rod or the like. The button 3 is electrically connected to the electronic circuit component 5 on the substrate 10 through a wiring 3c (for example, a heat-resistant cord). The button 3 may be made of, for example, a member having the heat resistance property, the water resistance property, the pressure resistance property, etc., and if the button does not have the heat resistance property, the water resistance property, the pressure resistance property, etc., the button 3 may be separately covered with a cover having the heat resistant property, the water resistance property, the pressure resistance property, etc. The button 3 is made of, for example, a flexible (elastic) resin or the like, and is deformed into an uneven shape in response to a pressing operation by the user. A switch circuit (not shown) under the button 3 is electrically turned on/off in accordance with the deformation of the button 3, and on/off signals are output through the wiring 3*c*. Note that the configuration in which the button 3 is a part of the housing 2 is also possible.

The mouse 1 has elements such as the lens 4, the substrate 10, the light source unit 7, the power source unit 8, and the transmission unit 6 arranged in the housing 2. The optical mouse function of this mouse 1 is mainly configured by the connection of the lens 4, the transmission unit 6, an image sensor 15 (details thereof will be described later with reference to FIG. 5), and the electronic circuit component 5. An internal space of the housing 2 is roughly divided into a first space portion SP1 under the substrate 10 and a second space portion SP2 over the substrate 10. The lens 4 is arranged in the opening R1 of the housing bottom portion 2B. The lens 4 is an optical element which is arranged in a part of the housing bottom portion 2B (opening R1) and through which light from outside (image light) enters as an optical signal (in other words, image light entering unit). The lens 4 may be composed of not only one lens but also a plurality of lenses and may have a component such as a mirror. The lens 4 is fixed in tight contact with the housing bottom portion 2B. The lens 4 collects the light from the seating surface SF outside the housing 2 as image light (optical signal), and the collected light enters through the lens 4 to one end of the transmission unit 6.

The substrate 10 has electronic components such as the electronic circuit component 5 mounted thereon, and the image sensor 15 is connected to the electronic circuit component 5 as shown in FIG. 5 described later. The electronic circuit component 5 and the image sensor 15 are the objects to be protected from the heat and water (steam) during the sterilization treatment. The electronic circuit component 5 in this case is a single integrated part for realizing the controller of the mouse function, the wireless communication function, the wireless charging control function, and others. The controller of the electronic circuit component 5 controls the image processing using the image of the image sensor 15, the input operation of the button 3, and others, and further controls the wireless communication and the wireless charging. The controller of the electronic circuit component 5 calculates the moving state of the mouse 1 from the difference between the images at each time point based on the images detected by the image sensor 15. Also, the controller detects the state of the button 3 such as the on/off state. The controller transmits the information indicating the state of the mouse 1 to the external computer or the like through the wireless communication circuit. Note that the case where there is only one electronic circuit component 5 is shown, but the configuration is not limited to this, and a plurality of electronic circuit components and other components may be provided on the substrate 10 as described later.

The transmission unit 6 is composed of the optical fiber 6*f* (in other words, image fiber, optical cable, or the like). In this mouse 1, the optical fiber 6*f* of image light direct transmission type is applied to the transmission unit 6. This optical fiber 6*f* is a part that optically transmits the image light as the optical signal, which enters through the lens 4, directly to the image sensor 15. The optical fiber 6*f* optically connects the lens 4 and the image sensor 15. For example, one end of the optical fiber 6*f* is connected to the lens 4, and the other end is connected to the image sensor 15. These connections may be the physical connection or the optical connection that ensures the image light direct transmission. Note that the configuration of this connection is not limited. Since the optical fiber 6*f* has flexibility, it is possible to bend the transmission path.

Figure 4:
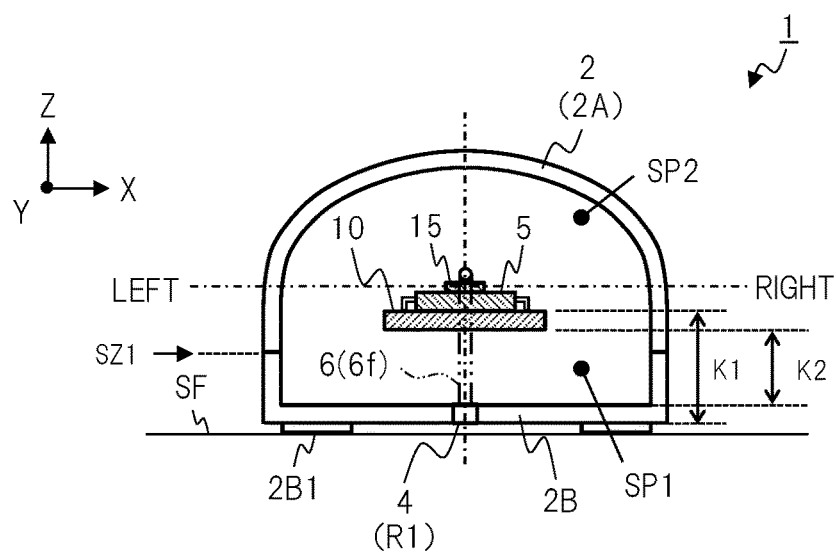
FIG. 4 is a transverse cross-sectional view of the main part of the mouse according to the first embodiment.

In the wiring example of FIG. 2 to FIG. 4 (referred to as first wiring example), the optical fiber 6*f* is, for example, the wiring that passes near the front surface in the housing 2, and is connected to the image sensor 15 on the upper surface of the electronic circuit component 5 on the upper surface of the substrate 10.

The light source unit 7 is a part that generates and supplies the illumination light (light emitting element) and is composed of, for example, the LED element, but the light source unit 7 is not limited to this and may be composed of a laser light source or the like. The light source unit 7 supplies the generated illumination light to the lens 4 in the opening R1. In this example, the light source unit 7 is arranged on the substrate 10. The light source unit 7 is connected to the electronic circuit component 5 on the substrate 10 through a wiring 7*c*. The electronic circuit component 5 controls the light emission of the light source unit 7 by the light source control signal. The arrangement position of the light source unit 7 is optional and is not particularly limited. The illumination light from the light source unit 7 is supplied to the lens 4 by, for example, a light source unit wiring 7*d*. Note that an optical component such as a light guide may be used to supply the illumination light. As the light source unit wiring 7*d*, for example, an optical fiber may be used as in the transmission unit 6. When a plurality of optical fibers are used for the transmission unit 6 and the light source unit 7, the optical fibers may be bundled. Even in the case of the configuration in which the light source unit 7 is not provided as shown in FIG. 6 described later, the mouse function can be executed if the illumination light in the usage environment is sufficient.

The power source unit 8 is connected to the substrate 10 through a wiring 8*c*. For example, the power source unit 8 is arranged at the position near the center on the substrate 10. The power source unit 8 supplies electric power to each component such as the electronic circuit component 5. The arrangement position of the power source unit 8 is optional and is not particularly limited. The power source unit 8 is a wireless charging unit in the first embodiment, and is a part including a circuit and a secondary battery that receive wireless charging by the wireless charging method from the wireless power supplying unit of the seating surface SF (for example, mouse pad). The wireless charging method is not limited, and known methods such as a magnetic field coupling method, an electric field coupling method, a laser method, a microwave method, an ultrasonic method, and the like can be applied.

The power source unit 8 is not limited to the wireless charging unit and may be a primary battery. In this case, it may be a replaceable primary battery that is replaced through a lid of the housing 2. The part including the lid is configured to have the waterproofing property, the heat resistance property, etc. The power source unit 8 may be a secondary battery of a type having the terminals exposed on the outer surface of the housing 2. In this case, for example, the exposed terminals are made to be smooth with respect to the main surface of the housing bottom portion 2B. By making them smooth, the property that stain does not easily adhere (stain resistance) and the property that stain can be easily removed (easy cleanability) can be provided.

In this example, the power source unit 8 is arranged on the substrate 10 as a whole. However, as described in the following embodiments and modifications, the power source unit 8 is not limited to this, and at least a part of the power source unit 8 may be arranged on the substrate 10. Further, a substrate for mounting the light source unit 7, a substrate for mounting the power source unit 8, a substrate for mounting a communication unit or communication means, and the like may be provided in addition to the substrate 10. The plurality of substrates are housed in the housing 2. In the housing 2, the plurality of substrates may be arranged in parallel in the horizontal direction or may be arranged so as to be overlapped in the vertical direction. The plurality of substrates may be formed as a three-dimensional stepped or layered structure. Each of the substrates may be arranged upright in the housing 2 or may be obliquely arranged with respect to the horizontal direction. When the plurality of substrates are separately provided, the positional layout in consideration of the temperature and the degree of thermal insulation of each component can be achieved easily and in more detail.

In this mouse 1, by applying the optical fiber 6f to the transmission unit 6, the part of the lens 4 and the like in the opening R1 in the housing bottom portion 2B can be separated as far as possible from the part of the image sensor 15, the electronic circuit component 5, and the like in the housing 2. Furthermore, in the first embodiment, the electronic circuit component 5 and the like are arranged at the position near the right-side end portion of the housing 2 in the longitudinal direction (position on the back side of the mouse 1), as the preferred position separated as far as possible from the opening R1 provided near one end portion of the housing bottom portion 2B in the longitudinal direction (position near the left-side end portion and on the front side of the mouse 1 in FIG. 2 and FIG. 3). Thus, since the optical fiber 6f becomes longer, the heat and the like transmitted from the lens 4 in the opening R1 to the electronic circuit component 5 and the image sensor 15 can be reduced as much as possible.

As described above, in the mouse 1 according to the first embodiment, as the positional relationship between the lens 4 in the opening R1 and the electronic circuit component 5 and the image sensor 15 on the substrate 10 in plan view on the horizontal plane, the electronic circuit component 5 is arranged at the position on the substrate 10 separated as far as possible from the opening R1 in the longitudinal direction of the housing 2 (position on the back side of the mouse 1, that is, right-side position in FIG. 3 opposite to the position of the opening R1 on the front side of the mouse 1, that is, the left-side position in FIG. 3), so that the heat conduction due to the heat entering from the outside of the mouse 1 through the opening R1 is prevented as much as possible. Therefore, for example, even in the case where the sterilization treatment by the high temperature and high pressure steam in the autoclave equipment is applied to the mouse 1, it is possible to prevent as much as possible the electronic circuit component 5 and the image sensor 15 from being damaged and broken down by the heat entering from the outside of the mouse through the opening R1 and the lens 4 and transmitted to the electronic circuit component 5 and the image sensor 15.

Also, the planar shape of the substrate 10 is formed to be a substantially elliptical shape similar to the substantially elliptical shape of the housing 2 as shown in FIG. 3, so that the substrate 10 is separated from the inner surface of the structural surface of the housing 2 as even and as large as possible around the entire circumference of the substrate 10, thereby reducing the heat and the like entering from the outside through the structural surface of the housing 2 as much as possible. In addition, by forming the substrate 10 to have a substantially elliptical shape, the area of the substrate 10 is reduced as much as possible, so that it is possible to prevent the heat accumulated in the substrate 10 from being transmitted to the electronic circuit component 5 and the like by the heat conduction. As a result, also from the aspect of the planar shape of the substrate 10, the heat accumulation in the substrate 10 and the heat conduction to the electronic circuit component 5 and the image sensor 15 can be prevented, and the damage and the breakdown of the electronic circuit component 5 and the image sensor 15 due to the heat attack can be prevented as much as possible.

In the first embodiment, as shown by the above description, FIG. 2, FIG. 3, and others, all of the electronic circuit component 5, the light source unit 7, and the power source unit 8 are arranged on the substrate 10. As a result, even in the case where the sterilization treatment by the high temperature and high pressure steam in the autoclave equipment is applied to the mouse 1, since all of the electronic circuit component 5, the light source unit 7, and the power source unit 8 are separated from the housing bottom portion 2B by a distance K1 described below or more, it is possible to prevent the influence by the high heat, high pressure, and water due to the high temperature and high pressure steam from being transmitted to all of the electronic circuit component 5, the light source unit 7, and the power source unit 8, so that it is possible to protect all of the electronic circuit component 5, the light source unit 7, and the power source unit 8 from the damage and the breakdown due to the high heat, high pressure, and water.

In the first embodiment, for the protection from the damage and the breakdown due to the high heat, high pressure, and water, the arrangement of the electronic circuit component 5 and others in the housing 2 of the mouse 1 is particularly important, and thus the arrangement and the distance of the electronic circuit component 5, the substrate 10, the image sensor 15, and others in the housing 2 of the mouse 1 in the X, Y, and Z directions will be described below in detail.

As shown in FIG. 2, the distance K1 is the distance between the lower surface of the housing bottom portion 2B and the lower surface of the electronic circuit component 5 in the Z direction corresponding to the vertical direction in FIG. 2. A distance K2 is the distance between the upper surface of the housing bottom portion 2B and the lower surface of the substrate 10 in the Z direction, and is the distance in the first space portion SP1. By securing the distance K1 and the distance K2, it is possible to obtain an effect of preventing the upward heat conduction from the outside of the housing bottom portion 2B. Since the first space portion SP1 is provided in the mouse 1 by using the transmission unit 6, it is possible to improve the thermal insulation property and the like by the presence of this space. In the design of the distance K2 and others in this space, suitable distances can be selected in consideration of the thermal insulation property and the like.

Further, a distance K3 is the distance between the upper surface of the electronic circuit component 5 and the outer surface of the housing upper portion 2A in the Z direction in association with the second space portion SP2 above the electronic circuit component 5. Since the distance K3 is sufficiently secured, it is possible to protect the electronic circuit component 5 from the heat and the like transmitted downward from the outside of the housing upper portion 2A.

A distance K4A (FIG. 2 and FIG. 3) is the distance between the center of the electronic circuit component 5 and the lower side surface of one end portion of the housing upper portion 2A in the longitudinal direction (right end portion in FIG. 2 and FIG. 3), in the longitudinal direction of the housing 2 of the mouse 1 in FIG. 2 and FIG. 3, that is, the Y direction corresponding to the front-back direction. In the first embodiment, the distance K4A is set to be as short as possible, and a distance K6 which is the distance between the lower side surface of the other end portion of the housing upper portion 2A in the longitudinal direction (left end portion in FIG. 2 and FIG. 3) and the opening R1 and the lens 4 is also set to be as short as possible. As a result, in the first embodiment, a distance K7 which is the distance in the horizontal direction between the opening R1 and the lens 4 and the electronic circuit component 5 is set to be as long as possible. Namely, the opening R1 and the lens 4 and the electronic circuit component 5 are separated as far as possible in both the horizontal direction and the vertical direction, thereby preventing the high heat and the like entering the mouse 1 from the part of the opening R1 and the lens 4 from reaching the electronic circuit component 5 as much as possible.

On the other hand, a distance K4B (FIG. 3) is the distance in the X direction orthogonal to the Y direction between the center of the electronic circuit component 5 and the outer side surface of the housing upper portion 2A in the transverse direction. Therefore, since the electronic circuit component 5 of the mouse 1 is located at equal distance in the X direction of the horizontal direction, the electronic circuit component 5 is arranged at the central position (center portion) of the housing 2 of the mouse 1 in the X direction.

Also, as described above, in the mouse 1 according to the first embodiment, as the positional relationship between the lens 4 in the opening R1 and the electronic circuit component 5 and the image sensor 15 on the substrate 10 in plan view on the horizontal plane, the lens 4 and the electronic circuit component 5 are separated as far as possible. Namely, as described above, the electronic circuit component 5 is arranged at the position near the right-side end portion of the housing 2 in the longitudinal direction where the distance between the center of the electronic circuit component 5 and the lower right side surface of the housing upper portion 2A is the distance K4A as shown in FIG. 2 and FIG. 3. On the other hand, the opening R1 and the lens 4 located in the opening are arranged at the position near the left-side end portion of the housing 2 on the opposite side to the electronic circuit component 5 in the longitudinal direction where the distance from the lower left side surface of the housing upper portion 2A is the distance K6. As a result, the opening R1 and the lens 4 and the electronic circuit component 5 are separated in the horizontal direction by the distance k7, and it is preferable that the distance K7 is as long as possible in order to prevent high heat and the like that have entered the housing 2 through the opening R1 and the lens 4 from reaching the electronic circuit component 5 that is sensitive to heat and the like. In the first embodiment, by the abovementioned arrangement relationship in which the distance K7 between the opening R1 and the lens 4 and the electronic circuit component 5 is made as long as possible, the opening R1 and the lens 4 and the electronic circuit component 5 are separated to the maximum in the horizontal direction and the vertical direction. Therefore, for example, even in the case where the sterilization treatment by the high temperature and high pressure steam in the autoclave equipment is applied to the mouse 1, it is possible to prevent to the maximum the electronic circuit component 5 and the image sensor 15 from being damaged and broken down by the heat, pressure, and water that have entered the mouse 1 through the opening R1 and the lens 4 and have reached the electronic circuit component 5 and the image sensor 15, so that the electronic circuit component 5 and the image sensor 15 that are sensitive to heat and the like can be protected to the maximum.

In the first embodiment, the opening R1 and the lens 4 and the electronic circuit component 5 are separated in the Z direction of the vertical direction and the Y direction of the horizontal direction. Alternatively, as indicated by the two-dot chain lines in FIG. 3, it is also possible to separate the opening R1 and the lens 4 and the electronic circuit component 5 by dislocating them in either the Y direction of the horizontal direction or the X direction of the horizontal direction from the central position of the mouse 1 in the longitudinal direction. Consequently, the electronic circuit component 5 is separated from the opening R1 and the lens 4 in all of the Z direction of the vertical direction, the Y direction of the horizontal direction, and the X direction of the horizontal direction. As a result, the separation distance between the electronic circuit component 5 and the opening R1 and the lens 4 is three-dimensionally maximized in all of the Z direction, the Y direction, and the X direction, so that it is possible to prevent to the maximum the heat and the water entering the mouse 1 from the part of the opening R1 and the lens 4 from reaching the electronic circuit component 5.

In this case, the position to which the opening R1 and the lens 4 are dislocated in the X direction and the position to which the electronic circuit component 5 is dislocated in the X direction are arranged in the diagonal direction, that is, are arranged to opposite sides in the X direction so as to have the positional relationship between the opening R1A and the lens 4A and the electronic circuit component 5B or the positional relationship between the opening R1B and the lens 4B and the electronic circuit component 5A shown in FIG. 3, whereby the opening R1 and the lens 4 and the electronic circuit component 5 are separated from each other in the diagonal direction as far as possible in all of the Z direction of the vertical direction, the Y direction of the horizontal direction, and the X direction of the horizontal direction. Therefore, the separation distance between the opening R1 and the lens 4 and the electronic circuit component 5 is three-dimensionally maximized in all of the Z direction, the Y direction, and the X direction, and it is possible to obtain the advantage of protecting the electronic circuit component 5 and the like which are sensitive to heat to the maximum.

Further, as described above, in the first embodiment, the planar shape of the substrate 10 is formed to be a substantially elliptical shape similar to the substantially elliptical shape of the inner surface of the structural surface of the housing 2 as shown in FIG. 3, so that the substrate 10 is separated from the structural surface of the housing 2 as even and as large as possible around the entire circumference of the substrate 10, thereby reducing the heat and the like entering from the outside through the structural surface of the housing 2 as much as possible. Also, the area of the substrate 10 is reduced as much as possible so as to prevent the heat accumulated in the substrate 10 from being transmitted by the heat conduction to the electronic circuit component 5 and the like. Furthermore, the following measures for preventing the heat conduction are also implemented.

In the first embodiment, in order to prevent the heat conduction to the electronic circuit component 5 and the image sensor 15 through the substrate 10 as much as possible, the end surfaces of the substrate 10 in the longitudinal direction and the transverse direction are also arranged so as to be spatially separated from the outer surface of the housing upper portion 2A of the housing 2 of the mouse 1. Namely, as shown in FIG. 3, as the separation distance of the substrate 10 in the Y direction of the horizontal direction, the end surfaces (right end surface and left end surface in FIG. 3) of the substrate 10 in the longitudinal direction (front-back direction) in FIG. 3 are separated from the right-side outer surface and the left-side outer surface of the housing upper portion 2A in the longitudinal direction by a distance K4C1 and a distance K4C2, respectively.

In addition, as the separation distance of the substrate 10 in the X direction orthogonal to the Y direction of the horizontal direction (transverse direction of the housing 2 of the mouse 1 in FIG. 3, that is, lateral direction seen from the right to the left in FIG. 3, namely, far side and near side), the side surfaces of the substrate 10 in the transverse direction in FIG. 3 (end surface on the far side and end surface on the near side in FIG. 3) are separated from the right-side outer surface (far side in FIG. 3) and the left-side outer surface (near side in FIG. 3) of the housing upper portion 2A of the housing 2 of the mouse 1 in the transverse direction by a distance K4D1 and a distance K4D2, respectively. Note that, although it is preferable that the distances K4C1 and K4C2 are made equal to each other and the distances K4D1 and K4D2 are made equal to each other in terms of the balance in heat resistance property and others, they may be different depending on the external and internal structure of the housing 2 of the mouse 1, the component arrangement, the usage conditions, and the like.

Therefore, in addition to forming the planar shape of the substrate 10 to be a substantially elliptical shape similar to the substantially elliptical shape of the inner surface of the structural surface of the housing 2, the substrate 10 in the first embodiment is separated from the outer surface of the housing bottom portion 2B of the housing 2 of the mouse 1 by the distance K1 (see FIG. 2), and further the four end surfaces of the substrate 10 in the horizontal direction are separated from the outer surface of the housing upper portion 2A of the housing 2 of the mouse 1 in the horizontal direction by the distances K4C1 and K4C2 and the distances K4D1 and K4D2, respectively, as shown in FIG. 3. Accordingly, the substrate 10 is sufficiently separated from the structural surface of the housing 2 as much as possible not only in the vertical direction but also in the horizontal direction, so that the heat conduction from the housing upper portion 2A and the housing bottom portion 2B of the housing 2 of the mouse 1 to the substrate 10 and the heat accumulation in the substrate 10 can be suppressed to the minimum. As a result, the heat conduction from the substrate 10 having the relatively large mass to the electronic circuit component 5, the light source unit 7, and the power source unit 8 having relatively small mass and to the image sensor 15 and others through the electronic circuit component 5 can be reduced to the minimum, so that the damage, the breakdown, and the deterioration of the electronic circuit component 5, the image sensor 15, and others due to the high heat can be effectively prevented.

A distance K5 is the distance between one end portion (left end portion in FIG. 2) of the substrate 10 and the outer surface of the housing upper portion 2A closest to the one end portion. Namely, the substrate 10 is separated from the outer surface of the housing upper portion 2A by the distance K5. In this case, in the first embodiment, since the planar shape of the substrate 10 is formed to be a substantially elliptical shape similar to the substantially elliptical shape of the inner surface of the structural surface of the housing 2, both end surfaces of the substrate 10 in the longitudinal direction do not have the linear shape, but have the arc-shaped curved shape, so that the distance K5, that is, the separation distance between both end surfaces of the substrate 10 in the longitudinal direction and the inner surface of the structural surface of the housing 2 can be secured as long as possible across the entire length of the both end surfaces in comparison with the case where the both end surfaces of the substrate 10 have the linear shape. As described above, since the separation distance K5 from the outer surface of the housing upper portion 2A to the substrate 10 can be sufficiently secured, it is also possible to prevent the heat conduction from the surface of the housing upper portion 2A to the end portion of the substrate 10.

[Preferred Examples of Distances K1 to K7 and Others]

Here, the preferred examples of the dimensions such as the distances K1 to K7 and others will be described. First, assuming the case in which the overall height of the mouse 1 is 30 to 50 mm (preferably 40 mm), the entire length is 80 to 130 mm (preferably 110 mm), and the overall width is 45 to 75 mm (preferably 55 to 65 mm), the following specific dimensions are considered as preferred dimensions although depending on the thicknesses and others of the substrate 10, the housing 2, and the housing bottom portion 2B, that is: the distance K1 is 10 to 25 mm (preferably 12 to 20 mm), the distance K2 is 5 to 20 mm (preferably 7 to 15 mm), the distance K3 is 20 to 35 mm (preferably 12 to 25 mm), the distance K4A is 15 to 50 mm (preferably 20 to 30 mm), the distance K4B is 22.5 to 37.5 mm (half the width of the mouse), the distance K4C1 is 9 to 30 mm (preferably 12 to 20 mm), the distance K4C2 is 15 to 80 mm (preferably 40 to 75 mm), the distance K4D1 is equal to K4D2 and is 7 to 20 mm (preferably 15 to 18 mm), the distance K5 is 13 to 90 mm (preferably 45 to 85 mm), the distance K6 is 8 to 50 mm (preferably 10 to 20 mm), and the distance K7 is 30 to 90 mm (preferably 60 to 80 mm).

Of course, the above-mentioned dimensions are not limited to the examples listed above and can be varied depending on the dimensions of the mouse 1, the housing 2, the electronic circuit component 5, the substrate 10, and others.

By setting the dimensions of the distances K1 to K7 as those listed above, in particular, setting the dimensions of the distances K1 and K2 as those listed above, and by setting the dimensions of the distances K4A, K6, and K7, in particular, the distance K7 to be as large as possible, even in the case where the sterilization treatment by the high temperature and high pressure steam in the autoclave equipment is applied to the mouse 1, it is possible to prevent the influence by the high heat, high pressure, and water due to the high temperature and high pressure steam from reaching the electronic circuit component 5 particularly because of securing the distances K1, K2, and K7, thereby protecting the electronic circuit component 5 and others from being damaged and broken down due to the high heat, high pressure, and water.

As to the distances K1 to K7 mentioned above, the ratios among these distances K1 to K7 are also important factors for obtaining the functional effect of the present invention (protection of electronic circuit component 5 and others) in addition to the respective dimensions listed above. As the preferred ratios, the relationship that the distance K1 is longer than the distance K2 and the distance K1 is nearly equal to the distance K3 or equal to or shorter than the distance K3 is confirmed among the distances K1 to K7 by the inventor. When the ratio of the distances K1 to K5 is expressed numerically based on this relationship, the ratio of K1:K2:K3:K4A:K4B:K5=3:2:4:5:5:11 to 14 is considered as a preferred ratio, and the ratio of K4A:K6:K7=2:1:6 is also considered as a preferred ratio.

By setting the distances K1 to K7 to have the ratios described above, even in the case where the sterilization treatment by the high temperature and high pressure steam in the autoclave equipment is applied to the mouse 1, it is possible to prevent the influence by the high heat, high pressure, and water due to the high temperature and high pressure steam from reaching the electronic circuit component 5 particularly because of securing the distances K1 and K2, thereby protecting the electronic circuit component 5 from being damaged and broken down due to the high heat, high pressure, and water.

Further, among the ratios mentioned above, the ratio between the overall height of the mouse 1 and the distance K1 is particularly important for the present invention. For example, in the case where the overall height of the mouse 1 is set to 40 mm, optimizing the dimensions of the distances K1 to K7 and the ratios among them is very beneficial because the mouse 1 can withstand the sterilization treatment by the high temperature and high pressure steam even if the mouse 1 is exposed to the sever processing conditions such as those of the autoclave treatment.

As described above, in the mouse 1 according to the first embodiment, the separation distances corresponding to the distances K1 to K7 are secured from any direction for the electronic circuit component 5 which is the object to be protected from the high heat and the like, and the arrangement position of the electronic circuit component 5 is selected such that the heat and the like from outside entering the mouse 1 from the part of the opening R1 and the lens 4 is not transmitted to the electronic circuit component 5 from any direction. The arrangement positions of the electronic circuit component 5 and others are not limited to those of the first embodiment, and can be selected in consideration of the required heat resistance property and the like.

With the configuration described above, in the mouse 1 according to the first embodiment, adverse effects such as the heat from outside are less likely to be transmitted to the electronic circuit components 5 and the like on the substrate 10 during the sterilization treatment. Therefore, the mouse 1 according to the first embodiment can protect the electronic circuit component 5 and the like from the damage and breakdown due to the high heat, high pressure, and water and can withstand the sterilization treatment by the high temperature and high pressure steam in the autoclave equipment or the like.

In the first embodiment, the opening R1 of the housing bottom portion 2B is formed to be as small as possible in order to minimize the infiltration of heat and water (steam) during the sterilization treatment and to facilitate the water proofing and pressure resistance. Since the optical fiber 6f is applied as the transmission unit 6 in the mouse 1, the area or the like of the opening R1 in which the lens 4 is provided can be reduced. The area and volume of the opening R1 and the lens 4 are designed to be those necessary and sufficient for taking in the image light, and are then suppressed to the minimum. A width H1 indicates the width of the opening R1 and the lens 4 in the Y direction. The lens 4, a sealing material, and the like are fixed in the opening R1 such that there is no gap for the water to enter. As a result, the opening R1 is enhanced in capabilities such as heat resistance, water resistance, and pressure resistance relating to the sterilization treatment. Also, if the occupied area of the opening R1 becomes smaller, more other components can be arranged by that much, and the functions can be further improved.

Note that, in FIG. 2, the components such as the substrate 10 are arranged at illustrated positions by any means in the internal space of the housing 2. The substrate 10 may be physically connected to the housing 2 or may be simply housed in the housing 2 without such a connection, with the position thereof being movable. In the configuration example of FIG. 2, the substrate 10 is not connected to the housing 2. As described later, the substrate 10 may be mounted on an object arranged in the first space portion SP1.

Also, in this mouse 1, the lens 4 is arranged via the space (first space portion SP1) having the distance K2 downward from the lower surface of the substrate 10 located on the lower side in the Z direction, whereas the electronic circuit component 5 and others are arranged on the upper surface of the substrate 10 located on the upper side in the Z direction. The optical fiber 6f of the transmission unit 6 extends from the lens 4 to the electronic circuit component 5 via the side surface of the substrate 10. In this way, since the opening R1 and the lens 4 of the housing bottom portion 2B and the electronic circuit component 5 are separated by the distance K7 in the horizontal direction and the distance K1 or K2 in the vertical direction, that is, are arranged with a sufficient separation distance in terms of thermodynamics, the heat conduction from the opening R1 and the lens 4 to the electronic circuit component 5 is less likely to occur, and the electronic circuit component 5 is protected from damage or breakdown.

Also, not only the transmission unit 6 but also other components may be arranged in the first space portion SP1. Since the wireless charging unit may be particularly arranged as the power source unit 8 in this space, the performance of the wireless charging can be easily enhanced in this case. When the wireless communication method and the wireless charging method are applied, the wired cable and the mechanism including an opening for the cable are unnecessary, they are more advantageous with respect to the sterilization treatment.

Further, since the optical fiber 6f is applied in this mouse 1, the degree of freedom in the arrangement of the lens 4, the image sensor 15, and others can be improved, and there is also an advantage that the arrangement of the lens 4, the image sensor 15, and others does not require so high accuracy. In this mouse 1, the electronic circuit component 5, the image sensor 15, and others can be arranged at the preferable positions, distances, orientations, and others with respect to the position of the lens 4 in the opening R1 in consideration of the heat resistance property and others.

As to the optical fiber 6f and other wirings (for example, the wiring 3c of the button 3, the wiring 7c of the light source unit 7, the wiring 8c of the power source unit 8, and the like), those having the thermal insulation property and others in themselves may be applied, or a fourth thermal insulation layer described later may be provided.

[1-3: Planar Configuration of Mouse]

FIG. 3 schematically shows the mouse 1 according to the first embodiment seen in plan view on the horizontal plane (X-Y plane). FIG. 3 particularly shows the configuration of the substrate 10 located at a certain position in the Z direction. In this example, the housing 2 and others have a substantially symmetrical shape. One end of the optical fiber 6f, which is the transmission unit 6, is connected to the lens 4 in the opening R1 arranged at the position away from the side surface of the left-side end portion (FIG. 2 and FIG. 3) of the housing upper portion 2A of the mouse 1 by the distance K6. Although the mouse 1 according to the first embodiment has a wireless communication function, it may be configured to have a wired communication function. However, in that case, the housing 2 needs to have an opening through which the wired communication cable passes, and measures in terms of the thermal insulation property, the waterproofing property, and the like are implemented to the opening.

[1-4: Transverse Cross-Section of Mouse]

FIG. 4 schematically shows the transverse cross-section (X-Z plane corresponding to the line B-B in FIG. 1) of the mouse 1 according to the first embodiment. In this example, the transmission unit 6 is laid out so as to pass through the front-side space and the second space portion SP2 in the housing 2, but it may be laid out in a different manner as described later. As the wiring configuration, the optical fiber 6f extends upward in the Z direction from the position of the lens 4 in the opening R1 through the first space portion SP1 and the front-side space in the housing 2, and reaches the position higher than the substrate 10. The optical fiber 6f then extends backward from the position in the second space portion SP2 in the Y direction above the substrate 10, and reaches the electronic circuit component 5 on the back side on the substrate 10. Then, the other end of the optical fiber 6f is connected to the upper side of the image sensor 15 on the electronic circuit component 5.

For example, the housing 2 is configured by bonding the housing upper portion 2A and the housing bottom portion 2B. In the Z direction, a position SZ1 indicates an example of the bonding position between the housing upper portion 2A and the housing bottom portion 2B. The position SZ1 is three-dimensionally optional and is not particularly limited. Further, although the substrate 10 is arranged at the position higher than the position SZ1 in this example, the position is not limited to this. The position SZ1 may vary in accordance with the position of the outer circumference of the housing 2, that is, a curved bonding surface is also possible. Alternatively, the housing 2 may be composed of three or more parts. Further, around the bonding position between the housing upper portion 2A and the housing bottom portion 2B, the thermal insulation material and the sealing material for thermal insulation and waterproofing are provided so as to enhance the thermal insulation property and the waterproofing property. Though described later, the housing 2 is made of a material having a predetermined property (referred to as first property) including the heat resistance property, the thermal insulation property, the water resistance property, the waterproofing property, the pressure resistance property, etc.

[1-5: Image Sensor]

Figure 5A:
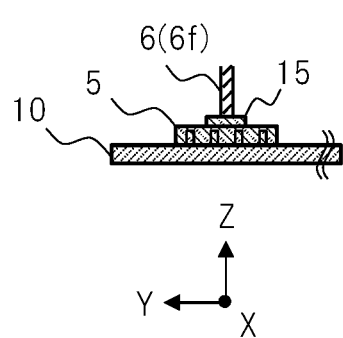
FIG. 5A is a diagram showing a configuration example of an image sensor of the mouse according to the first embodiment.
Figure 5B:
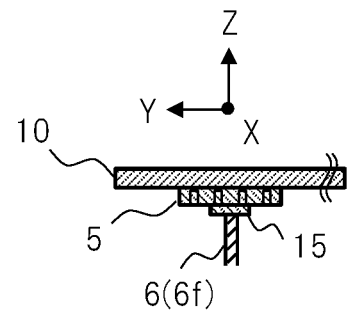
FIG. 5B is a diagram showing a configuration example of the image sensor of the mouse according to the first embodiment.
Figure 5C:
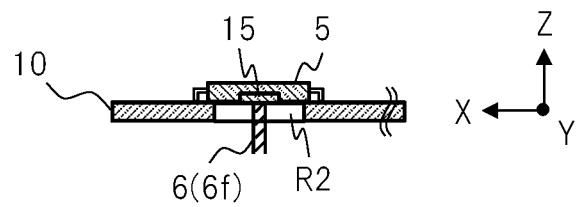
FIG. 5C is a diagram showing a configuration example of the image sensor of the mouse according to the first embodiment.

FIG. 5 shows configuration examples of the connection among the electronic circuit component 5, the image sensor 15, and the optical fiber 6f of the transmission unit 6 according to the first embodiment. FIG. 5A shows the first example, FIG. 5B shows the second example as a modification, and FIG. 5C shows the third example as a modification.

In FIG. 5A, the electronic circuit component 5 is connected so as to be mounted on the upper side in the Z direction on the upper surface of the substrate 10. The image sensor 15 is mounted on the upper surface of the electronic circuit component 5. The other end of the optical fiber 6f is connected to the upper surface of the image sensor 15. A plurality of pixels (light receiving elements) are formed on the upper surface of the image sensor 15. The image sensor 15 receives the image light from the optical fiber 6f and converts it into data of pixel values in each pixel. The electronic circuit component 5 receives the input of the image signal from the image sensor 15, and performs the calculation described above.

In FIG. 5B, the electronic circuit component 5 is connected so as to be mounted on the lower side in the Z direction on the lower surface of the substrate 10. The image sensor 15 is connected to the lower surface of the electronic circuit component 5 (upper surface as viewed from the electronic circuit component 5). The other end of the optical fiber 6f is connected to the lower surface of the image sensor 15 (upper surface as viewed from the image sensor 15).

In FIG. 5C, the electronic circuit component 5 is mounted on the upper side of a through opening R2 provided at a part of the substrate 10. In this electronic circuit component 5, the image sensor 15 is integrally mounted on the lower surface side. Then, the other end of the optical fiber 6f is connected to the lower surface of the image sensor 15.

The connection among the transmission unit 6, the electronic circuit component 5, and the image sensor 15 is not limited to these examples. The configuration in which the electronic circuit component 5 and the image sensor 15 are integrated is also possible.

[Description of Example in which Autoclave Sterilization Treatment is Applied to Mouse of this Embodiment]

The case in which the autoclave treatment which is a kind of the sterilization treatment in the medical settings is applied to the mouse of this embodiment will be schematically described with reference to FIG. 25. Here, an autoclave equipment Y1 is the equipment that performs the autoclave treatment for the object to be sterilized. As an example of the autoclave equipment Y1, the pre-vacuum sterilizer is known. In this example, the object to be sterilized is the mouse 1 according to the first embodiment that has been used in the medical settings. The autoclave equipment Y1 stores the mouse 1 which is an object Y3 of the sterilization treatment in an internal space (in other words, sterilization chamber) Y2 of a pressure-resistant container. During the sterilization treatment, the internal space Y2 is filled with the high temperature and high pressure steam, and the object Y3 is exposed to the steam for a predetermined time or more. The autoclave equipment Y1 controls the temperature, pressure, time, and others in accordance with the setting. As an example, the autoclave equipment Y1 includes an electric heater or the like, and may generate infrared rays or the like.

In the medical settings, infection control based on standard preventive measures is important. Standard preventive measures include cleaning, disinfection, and sterilization of medical instruments. Cleaning is to remove foreign matters from an object. Disinfection is to remove all or a large number of microorganisms from an object except bacterial spores. Sterilization is to completely remove or kill microorganisms. The required levels for cleaning, disinfection, and sterilization vary depending on the object. Cleaning and disinfection can eliminate bacteria and the like to some extent, but they cannot completely eliminate them. Since medical mice are operated by hand, appropriate levels of measures are required. Conventionally, the surface of the mouse has been disinfected, but sterilization thereof has not been implemented.

The sterilization includes such methods as the autoclave sterilization, the gas sterilization, and the chemical sterilization. The autoclave sterilization is the most popular as the safest and most reliable method for the case of the objects that can withstand sterilization conditions because of its high operability and no residual toxicity. The pre-vacuum method in a class B autoclave equipment is the method in which a vacuum state is formed in the internal space Y2 during the sterilization step and the drying step, and is effective for objects of any shape. The flow in an example of the sterilization treatment is as follows. This flow includes, in order, a pre-cleaning/adhered material removal step YS1, a cleaning step YS2, a drying step YS3, a packaging step YS4, and a sterilization step YS5. The cleaning step YS2 includes, for example, a method such as immersion using a cleaning agent. The packaging step YS4 is a step of packaging the mouse 1, which is the object of the sterilization treatment, in a sterilization bag.

When the class B autoclave sterilization treatment using the pre-vacuum autoclave equipment Y1 is applied, the sterilization step YS5 further includes the following steps. That is, the step YS5 includes a vacuum/steam supplying step YS11, a pressurization/heating step YS12, a sterilization step YS13, a depressurization/steam exhausting step YS14, and a drying step YS15. The vacuum/steam supplying step YS11 is the step of removing air from the internal space Y2 and filling the entire internal space Y2 with saturated steam. The pressurization/heating step YS12 is the step of pressurizing and heating the internal space Y2. The sterilization step YS13 is the step of performing the treatment under the conditions that, for example, the temperature of the steam in the internal space Y2 is maintained at a predetermined temperature within the range of 121 to 137° C., the pressure is maintained at a predetermined pressure within the range of 2 to 2.2 bar (2.1 bar in the example of FIG. 25), and the predetermined time is set to, for example, 20 minutes or more. The depressurization/steam exhausting step YS14 is the step of depressurizing the internal space Y2 and exhausting the steam.

The mouse 1 which is the object Y3 of the sterilization treatment needs to have the capability of withstanding the high temperature and high pressure steam and others in the sterilization step YS13 and the drying step YS15, and the mouse 1 according to this embodiment sufficiently has the capability. By the flow including the sterilization step YS5, bacteria attached to the mouse which is the object Y3 are eliminated. After the treatment, the object Y3 is taken out from the autoclave equipment Y1 and is then housed.

The housing and the electronic circuit component constituting the general mouse for input and operation in the computer cannot withstand the steam with the predetermined temperature and pressure and are damaged and deteriorated during the sterilization treatment. On the other hand, in the mouse 1 according to the first embodiment and others, the structure including the housing and the electronic circuit component is designed to have the heat resistance, thermal insulation, water resistance, waterproofing, pressure resistance, etc. so as to withstand the steam with the predetermined temperature and pressure during the sterilization treatment. The parts made of a material sensitive to heat (for example, general plastic) are not used in the mouse 1 according to the first embodiment as much as possible, and if used, measures such as a thermal insulation material are used in combination. In order to withstand all of the cleaning, the disinfection, and the sterilization described above, the mouse according to the first embodiment has the predetermined level of the thermal insulation property, the heat resistance property, the waterproofing property, the water resistance property, the pressure resistance property, etc. The mouse 1 according to the first embodiment may be configured to have the capability of withstanding the disinfection treatment that is lower level, but it is more desirably configured to have the capability of withstanding the class B autoclave sterilization treatment.

[1-6: Effect and Others]

(a) As described above, in the mouse 1 according to the first embodiment, the lens 4 of the housing bottom portion 2B and the electronic circuit component 5 and the image sensor on the substrate 10 are arranged so as to be separated from each other by the distances K1 and K2 in the vertical direction and by the distance K7 in the horizontal direction, and it is thus possible to prevent the heat and the like that have entered the mouse 1 from the opening R1 and the lens 4 from reaching the electronic circuit components 5 and the image sensor 15 to the maximum. Consequently, the mouse 1 can withstand the sterilization treatment by the high temperature and high pressure steam even when exposed to severe treatment conditions such as those of the autoclave treatment. As a result, the usage environment of the computer system including the mouse 1 can be expanded to the medical settings and the like. In particular, in the medical settings, advanced medical treatment and surgery can be performed by using the system including the sterilized mouse.

(b) Also, in the first embodiment, as shown by the descriptions above, FIG. 2, FIG. 3, and others, all of the electronic circuit component 5, the light source unit 7, and the power source unit 8 are arranged on the substrate 10. Therefore, even in the case where the sterilization treatment by the high temperature and high pressure steam in the autoclave equipment is applied to the mouse 1, it is possible to prevent the influence by the high heat, high pressure, and water due to the high temperature and high pressure steam from reaching all of the electronic circuit component 5, the light source unit 7, and the power source unit 8 because all of the electronic circuit component 5, the light source unit 7, and the power source unit 8 are separated from the housing bottom portion 2B by the distance K1 or more, and it is possible to protect all of the electronic circuit component 5, the light source unit 7, and the power source unit 8 from being damaged and broken down by the high heat, high pressure, and water.

(c) Further, in the first embodiment, the planar shape of the substrate 10 is formed to be a substantially elliptical shape similar to the substantially elliptical shape of the inner surface of the structural surface of the housing 2 as shown in FIG. 3, so that the substrate 10 is separated from the inner surface of the structural surface of the housing 2 as even and as large as possible around the entire circumference of the substrate 10, thereby reducing the heat and the like entering from the outside through the structural surface of the housing 2 as much as possible. In addition, by forming the substrate 10 to have a substantially elliptical shape, the area of the substrate 10 is reduced as much as possible, so that it is possible to prevent the heat accumulated in the substrate 10 from being transmitted to the electronic circuit component 5 and the like. As a result, also from the aspect of the planar shape of the substrate 10, the heat accumulation in the substrate 10 and the heat conduction to the electronic circuit component 5 and the image sensor 15 can be prevented, and the damage and the breakdown of the electronic circuit component 5 and the image sensor 15 due to the heat attack can be prevented as much as possible.

(d) In the mouse according to the first embodiment, by setting the ratios of the distances K1 to K7 to those listed above, even in the case where the sterilization treatment by the high temperature and high pressure steam in the autoclave equipment is applied to the mouse 1, it is possible to prevent the influence by the high heat, high pressure, and water due to the high temperature and high pressure steam from reaching the electronic circuit component 5 particularly because of securing the distances K1 and K2, thereby protecting the electronic circuit component 5 from being damaged and broken down by the high heat, high pressure, and water.

(e) Further, since the mouse according to the first embodiment has the configuration in which the lens 4 of the housing bottom portion 2B and the electronic circuit component 5 and the image sensor 15 on the substrate 10 are arranged so as to be separated via the transmission unit 6, the preferable arrangement of the electronic circuit component 5 and others is possible, and it is possible to protect the electronic circuit component 5 and others from heat and water from outside.

[1-7: First Modification]

Figure 6A:
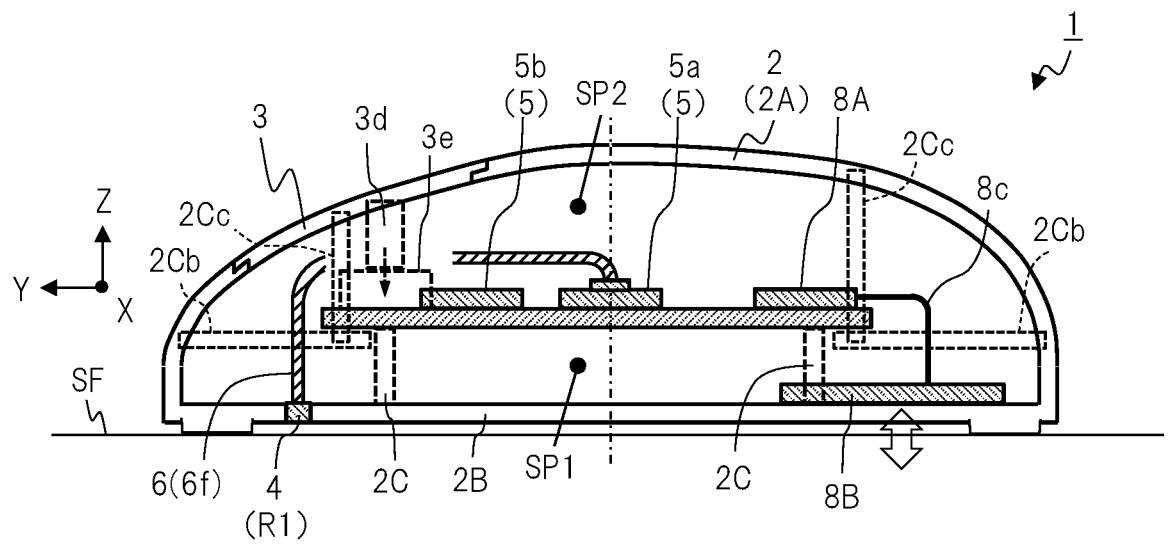
FIG. 6A is a diagram showing a configuration of a mouse according to a modification (first modification) of the first embodiment.
Figure 6B:
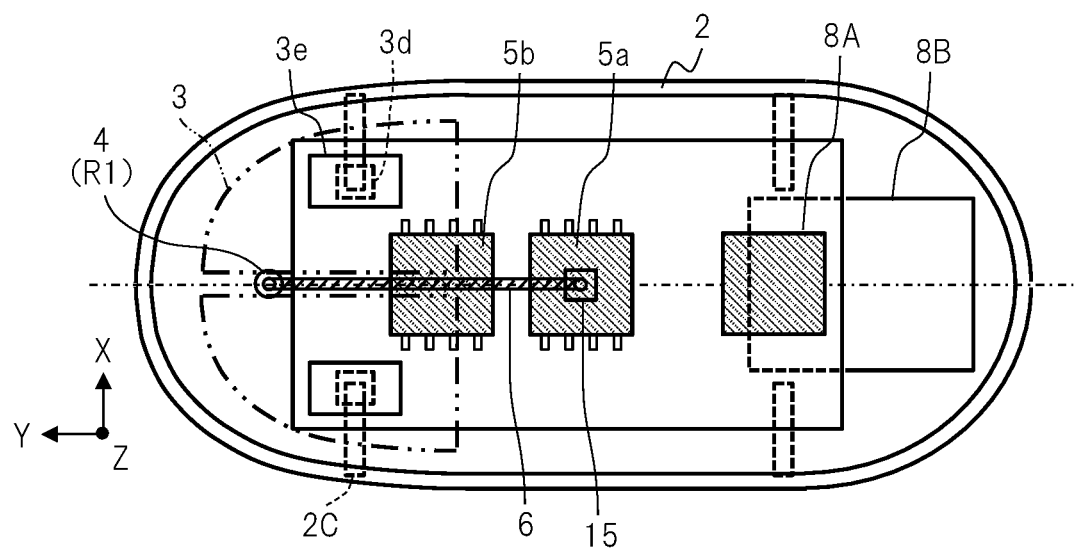
FIG. 6B is a diagram showing the configuration of the mouse according to the modification (first modification) of the first embodiment.

FIG. 6 shows the mouse 1 according to a modification (first modification) of the first embodiment. FIG. 6A shows the longitudinal cross-section thereof, and FIG. 6B shows the planar configuration thereof. The mouse 1 according to the first modification shows the case of the configuration (a) in which the light source unit 7 (or illumination device such as LED) is not provided, the configuration (b) in which a plurality of electronic circuit components 5 are provided on the substrate 10, the configuration (c) in which the power source unit 8 is divided into a secondary battery 8A and a wireless charging unit 8B, the configuration (d) in which the button 3 is of the type having a rod, and the configuration (e) in which the housing 2 has a substrate supporting portion. Note that, for convenience of clarifying the illustration, the illustration of an intermediate part of the transmission unit 6 is omitted in some cases in FIG. 6 and subsequent drawings.

The configuration (a) in which the light source unit 7 is not provided is as follows. In this configuration, the illumination light or the like in the usage environment of the mouse 1 is used as the light source for the image detection. The illumination light may be, for example, the light emitted from the mouse pad. Since there is a gap between the housing bottom portion 2B and the seating surface SF, the illumination light enters from the gap.

The configuration (b) in which a plurality of electronic circuit components 5 are provided on the substrate 10 is as follows. In this example, an electronic circuit component 5a and an electronic circuit component 5b are mounted on the upper surface of the substrate 10. The plurality of electronic circuit components 5 are objects to be protected from heat and water. Therefore, for example, the electronic circuit component 5a is arranged at the position near the center in the housing 2. On the other hand, the opening R1 and the lens 4 are arranged near the left end of the housing bottom portion 2B in FIG. 6, and the electronic circuit component 5a is arranged so as to be separated from the opening R1 and the lens 4 in both the horizontal direction and the vertical direction. The electronic circuit component 5a is the part constituting the controller of the mouse function, and the image sensor 15 is also mounted. The electronic circuit component 5b is the part constituting the wireless communication function, and is arranged at, for example, the position on the front side in the Y direction. The controller of the electronic circuit component 5a calculates the state of the mouse 1 by processing the image signal from the image sensor 15, and communicates with outside by processing the input of the button 3 and controlling the wireless communication function of the electronic circuit component 5b. It is possible to select the suitable arrangement position of each electronic circuit component 5 in consideration of the heat resistance property and others. The wireless communication circuit of the electronic circuit component 5b transmits the data relating to the state of the mouse 1 to the external computer and the like. Note that the wireless communication method is not particularly limited, and methods such as the infrared method, the Bluetooth (registered trademark), and others can be applied.

Note that the electronic circuit components 5a and 5b may be arranged so as to be separated also in the X direction of the horizontal direction other than the Y direction of the horizontal direction as in FIG. 6B.

The configuration (c) in which the power source unit 8 is divided into a secondary battery 8A and a wireless charging unit 8B is as follows. The wireless charging unit 8B is composed of, for example, a circuit such as a power receiving coil, receives power from a wireless power supplying unit (power transmitting coil or the like) such as an external mouse pad by an electromagnetic induction method or the like, and charges the supplied power in the secondary battery 8A through the wiring 8c. In this example, the wireless charging unit 8B is arranged at the position on the back side on the upper surface of the housing bottom portion 2B, and the secondary battery 2A is arranged at the position on the back side on the upper surface of the substrate 10. The secondary battery 2A is assumed as a heat-sensitive component, and is arranged at the position separated upward from the housing bottom portion 2B, similarly to the electronic circuit component 5. Since the wireless charging unit 8B can be arranged in the first space portion SP1 between the housing bottom portion 2B and the substrate 10, it is easy to secure a large area, that is, it is easy to increase the wireless power supply efficiency.

As a modification, the wireless charging unit 8B may be the power source unit of the type exposed on the outer surface of the housing bottom portion 2B or may be the power source unit of the type having a contact terminal exposed on the outer surface of the housing bottom portion 2B. In this case, measure of providing a cover having the thermal insulation property and the waterproofing property for the exposed part and the like are implemented. The part exposed on the outer surface of the housing 2 may have a convex shape or a concave shape, but the shape smooth with respect to the outer surface of the housing 2 is desirable. By making them smooth, the stain resistance and the easy cleanability can be provided.

The configuration (d) in which the button 3 is of the type having a rod, in other words, the configuration of a physical switch is as follows. The button 3 having the curved surface continuous to the outer surface of the housing upper portion 2A is provided at the position on the front side on the outer surface of the housing upper portion 2A. The button 3 is made of, for example, a hard resin, and moves in the vertical direction by the pressing operation of the user. A rod 3d is fixed under the button 3 so as to protrude therefrom. The rod 3d moves in the vertical direction along with the movement of the button 3. A switch 3e is provided at the position on the front side on the upper surface of the substrate 10 so as to be aligned with the position of the rod 3d. The rod 3d moves downward and physically comes in contact with the switch 3e. As a result, the circuit in the switch 3e changes from the off state to the on state. The switch 3e is connected to the electronic circuit component 5a through the circuit of the substrate 10. The controller of the electronic circuit component 5a confirms the operation state of the button 3 by receiving and processing the input of the on/off signal from the switch 3e. Note that measures of providing a thermal insulation property and the like described later may be implemented for the rod 3d and the switch 3e. The configuration relating to the button 3 is optional and not particularly limited, and measures for the heat resistance and the waterproofing are implemented around the button 3 regardless of the configuration.

The configuration (e) in which the housing 2 has a substrate supporting portion is as follows. In this example, a support portion 2C is provided so as to extend upward from a part of the housing bottom portion 2A. In FIG. 6B, the support portions 2C are provided at four locations of the housing bottom portion 2B so as to correspond to the four locations on the front, back, left, and right of the substrate 10. In each of the support portions 2C, a lower end thereof is supported on the housing bottom portion 2B and an upper end thereof supports the substrate 10. Consequently, the substrate 10 is arranged at the predetermined position in the housing 2, that is, the position separated from the surface of the housing 2 as far as possible. The substrate 10 may be fixed to the support portions 2C or may be simply placed on the support portions 2C. The support portion 2C may be composed of a part such as a screw as fixing means. The positions of the support portions 2C are not particularly limited. As a modification, support portions 2Cb and 2Cc (FIG. 6) are shown. The support portions 2Cb are provided so as to extend from the side surface of the housing upper portion 2A in the horizontal direction, and support the substrate 10 at the tip ends thereof. The support portions 2Cc are provided so as to extend downward from the upper surface of the housing upper portion 2A, and fix the substrate 10 at the tip ends thereof. Note that the support portion 2C is preferably made of a thermal insulation material, or measures of providing a thermal insulation property and the like described later may be implemented for the support portion 2C.

As another configuration example, a pressure regulating mechanism may be provided in the housing 2. Since the high heat and high pressure are applied to the housing 2 during the sterilization treatment, it is more preferable to provide the pressure regulating mechanism for regulating the pressure in the housing 2. The pressure regulating mechanism may be a pressure regulating valve or the like. The pressure regulating mechanism may be mounted on the button 3 or the opening R1.

Second Embodiment

A mouse according to the second embodiment of the present invention will be described with reference to FIG. 7 to FIG. 18. Hereinafter, the components in the second embodiment and others different from those of the first embodiment will be described. In the configuration of the mouse according to the second embodiment, measures for thermal insulation and waterproofing are further added to the configuration of the mouse according to the first embodiment.

In the configuration example of the mouse according to the second embodiment shown in FIG. 7 and others, the configuration of the mouse according to the first embodiment shown in FIG. 2 and others is used in common as a basis, and a thermal insulation structure with plural layers (in other words, sealed thermal insulation structure) is added thereto. This thermal insulation structure includes plural layers or plural kinds of thermal insulation materials. In this mouse, the thermal insulation structure with plural layers is provided depending on the degree of the required heat resistance property and the like in the usage environment (environment change in the degree of disinfection and sterilization performed in accordance with the medical settings where the mouse is used). If the required heat resistance property and the like may be lower, the modifications of omitting a part of the thermal insulation layers or providing only a part of the thermal insulation layers are of course possible.

Also, the opening R1 and the lens 4 in the second embodiment are arranged on the front side of the mouse 1, that is, at the position near the left end of the housing bottom portion 2B in FIG. 7 and others, so that the opening R1 and the lens 4 are separated from the electronic circuit component 5 as far as possible in the horizontal direction as in the first embodiment. Note that the opening R1, the lens 4, the electronic circuit component 5, and others may be arranged at the positions different from those of any of the first and second embodiments depending on the usage environment, usage conditions, and the like of the mouse 1.

[2-1: Mouse, First Wiring Example]

Figure 7A:
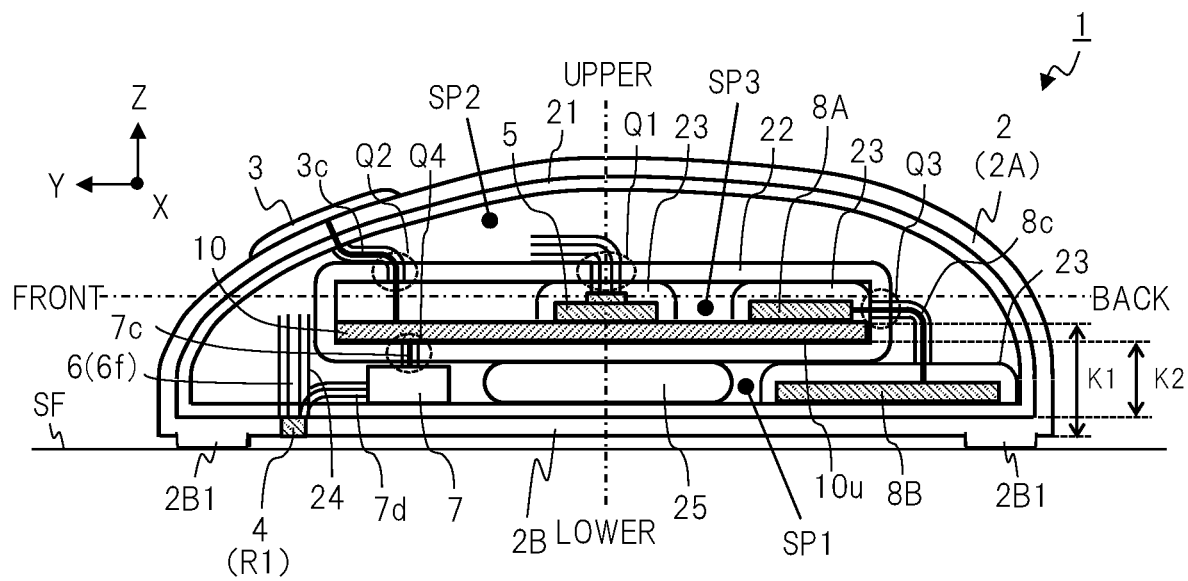
FIG. 7A is a diagram showing a configuration of a main part of a mouse according to the second embodiment of the present invention.
Figure 7B:
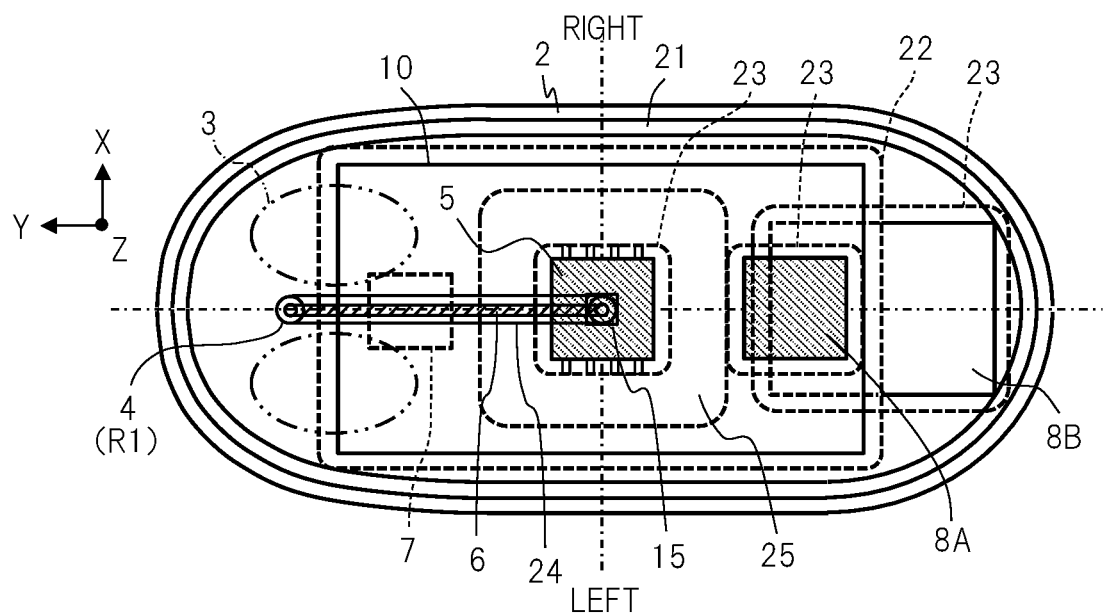
FIG. 7B is a diagram showing the configuration of the main part of the mouse according to the second embodiment of the present invention.

FIG. 7A shows the longitudinal cross-section of the mouse 1 which is the mouse according to the second embodiment, and FIG. 7B shows the planar configuration thereof. This mouse 1 includes the configuration elements similar to those of FIG. 2 and a plurality of thermal insulation layers are additionally provided as a whole. The thermal insulation structure having the plurality of thermal insulation layers roughly includes a first thermal insulation layer 21, a second thermal insulation layer 22, a third thermal insulation layer 23, a fourth thermal insulation layer 24, and a fifth thermal insulation layer 25. Each of the thermal insulation layers may have the same properties or may have different properties.

(1) The first thermal insulation layer 21 is a housing thermal insulation material and is arranged to be in contact with the surface (outer surface or inner surface) of the housing 2. In this example, in particular, the first thermal insulation layer 21 is provided to be in contact with the inner surface of the housing 2. When the first thermal insulation layer 21 is provided on the outer surface of the housing 2, it may serve as a cover or coating having a thermal insulation property. The housing 2 may have the multi-layered configuration including an inner shell and an outer shell as described later, and in such a case, the first thermal insulation layer 21 may be formed as one of the outer shell and the inner shell or as the layer sandwiched between the outer shell and the inner shell. Alternatively, a coating or element may be arranged on an outer surface and an inner surface of the outer shell, on an outer surface and an inner surface of the inner shell, and between the outer shell and the inner shell so as to provide the thermal insulation function.

(2) The second thermal insulation layer 22 is a substrate thermal insulation material and is arranged so as to surround the substrate 10 in all directions at the position separated from the housing 2. In other words, the substrate 10 is housed in the second thermal insulation layer 22. A third space portion SP3 is formed in the second thermal insulation layer 22. The second thermal insulation layer 22 is arranged inside the housing 2 and the first thermal insulation layer 21. The second thermal insulation layer 22 and the first thermal insulation layer 21 are not in contact with each other, and there is a space therebetween.

(3) The third thermal insulation layer 23 is an individual component thermal insulation material and is arranged so as to cover each of the individual components such as the electronic circuit component 5, the secondary battery 8A, and the wireless charging unit 8B. The third thermal insulation layer 23 is provided so as to protect the component sensitive to heat. The third thermal insulation layer 23 may be provided for the light source unit 7 and the third thermal insulation layer 23 of the wireless charging unit 8B may be omitted. The third thermal insulation layer 23 may be provided so as to surround the whole individual component. Although the case of the third thermal insulation layer 23 covering the upper surface side of the wireless charging unit 8B is shown, the third thermal insulation layer 23 may cover the whole wireless charging unit 8B including the lower surface side thereof. Also, when the third thermal insulation layer 23 is provided under the substrate 10, it can serve to have an important function to support and fix the substrate 10. If the components such as the electronic circuit component 5 themselves have a sealing property and a thermal insulation property (for example, packaged products), the third thermal insulation layer 23 may be omitted.

(4) The fourth thermal insulation layer 24 is a wiring thermal insulation material and is arranged so as to cover each of the wirings such as the optical fiber 6f of the transmission unit 6, the wiring 3c of the button 3, the wiring 8c of the power source unit 8 (secondary battery 8A and wireless charging unit 8B), the wiring 7c of the light source unit 7, the light source unit wiring 7d, and the like. If the wiring itself has a heat resistance property and the like, the fourth thermal insulation layer 24 for the wiring may be omitted.

(5) The fifth thermal insulation layer 25 is a spacer thermal insulation material and is arranged in the first space portion SP1 between the housing bottom portion 2B and the substrate 10 or the second thermal insulation layer 22 so as to be in contact with, for example, the first thermal insulation layer 21 and the second thermal insulation layer 22. In particular, the fifth thermal insulation layer 25 is arranged centering on the position below the position near center where the electronic circuit component 5 is located, thereby enhancing the thermal insulation effect to the electronic circuit component 5. The fifth thermal insulation layer 25 may be arranged so as to cover the transmission unit 6, the fourth thermal insulation layer 24, and the like. Further, the second thermal insulation layer 22 including the substrate 10 is placed and supported on the upper side of the fifth thermal insulation layer 25. Thus, the substrate 10 and the like are positioned. Namely, the fifth thermal insulation layer 25 functions as a spacer, and can further serve to have an important function to support and/or fix the substrate 10 when it is arranged under the substrate 10. The second thermal insulation layer 22 may be fixed to the fifth thermal insulation layer 25.

The optical fiber 6f of the transmission unit 6 enters the third space portion SP3 in the second thermal insulation layer 22 through, for example, an opening Q1 in a part of the upper surface of the second thermal insulation layer 22, and is connected to the electronic circuit component 5 and the like. The wiring 3c from the button 3 enters the third space portion SP3 through an opening in a part of the second thermal insulation layer 22, and is connected to the substrate 10. The wiring 8c from the wireless charging unit 8B enters the third space portion SP3 through an opening Q3 in a part of the second thermal insulation layer 22, and is connected to the secondary battery 8A. The wiring 7c from the light source unit 7 enters the third space portion SP3 through an opening Q4 in a part of the second thermal insulation layer 22, and is connected to the substrate 10. In the second thermal insulation layer 22, the fourth thermal insulation layer 24 may be omitted. The thermal insulation property and the like may be improved by providing a sealing material or the like in each of the openings Q1, Q2, Q3, and Q4. From the viewpoint of thermal insulation, it is prefer-able that the number of openings such as the opening Q1 in the second thermal insulation layer 22 is as small as possible. Therefore, a plurality of openings may be combined into one opening.

In the first space portion SP1, the light source unit 7 and the wireless charging unit 8B are more preferably provided on the upper surface of the first thermal insulation layer 21, but may be provided on the upper surface of the housing bottom portion 2B when the heat resistance property and the like are high. Various components and thermal insulation layers can be arranged as needed in the vacant region in the first space portion SP1. Therefore, it is advantageous in terms of the improvement in the mouse function and the thermal insulation property.

Note that, in this example, the transmission unit 6 is configured as the wiring that extends to the electronic circuit component 5 and the like at the central position via the front side, and the substrate 10 has no cutout and through hole provided therein. However, the transmission unit 6 is not limited to this, and it is also possible to provide a region such as the cutout or the through hole in the substrate 10 and form the desirable wiring passing through the region if the wiring needs to be shortened.

Also, a thermal insulation coating or a heat barrier coating may be applied to at least a part of the surface of the substrate 10 (upper surface, lower surface, or the like). For example, the thermal insulation coating may be applied to the lower surface 10u of the substrate 10 in FIG. 7. Consequently, the heat conduction to the inside of the substrate 10 can be reduced and the influence on the component such as the electronic circuit component 5 due to the heat conduction through the substrate 10 can be reduced. Further, the amount of the thermal insulation material to be provided can be reduced by the presence of the thermal insulation coating of the substrate 10.

(6) In the second embodiment, the electronic circuit component 5 is arranged at the position separated in all directions from the inner surface of the structural surface of the outer housing 2 in the internal space of the housing 2, for example, at the position near the center of the internal space. Further, also in the second embodiment, the opening R1 in which the lens 4 is mounted is provided at the position near the left end of the housing bottom portion 2B (FIG. 7 and others) as in the first embodiment. Namely, also in the mouse 1 according to the second embodiment, the arrangement positions of the electronic circuit component 5 and the substrate 10 which are the objects to be protected from heat and water during the sterilization treatment are designed in consideration of the distances to all surfaces of the housing 2. In particular, the electronic circuit component 5 is arranged at the position near the center of the internal space of the housing 2 so as to be separated as far as possible from all surfaces of the housing 2.

Consequently, the degree of freedom of the arrangement relating to the position of the component such as the electronic circuit component 5 with respect to the position of the lens 4 in the opening R1 of the housing bottom portion 2B (position near the left end in FIG. 7) can be improved. In particular, in the mouse according to the second embodiment, each component such as the electronic circuit component 5 can be arranged at the suitable position in consideration of the resistance to heat and water and the distance from the housing 2 in view of the sterilization treatment. As a result, capabilities such as the heat resistance property, the water resistance property, the waterproofing property, and the pressure resistance property of the mouse 1 are enhanced, and the mouse capable of withstanding the sterilization treatment can be realized.

In other words, the distance K1 and the distance K3 in the vertical direction (FIG. 2) of the housing 2 of the mouse 1 are almost equal to each other, the center of the substrate 10 and the electronic circuit component 5 is separated in the Y direction from the lower side surface of the housing upper portion 2A by the distance K4A in the longitudinal direction of the housing 2, and the center of the electronic circuit component 5 is separated in the X direction orthogonal to the Y direction by the distance K4B which is the distance between the center of the electronic circuit component 5 and the outer side surface of the housing upper portion 2A in the transverse direction. Accordingly, the substrate 10 and the electronic circuit component 5 are located almost at the center of the internal space of the housing 2 of the mouse 1 in all directions such as the vertical direction (Z direction), the longitudinal direction (Y direction), and the transverse direction (X direction) of the housing 2 of the mouse 1. In particular, the electronic circuit component 5 is arranged in the state of being separated in all directions from the inner surface of the housing 2 of the mouse 1. Further, the opening R1 and the lens 4 are arranged at the position far from the electronic circuit component 5, that is, the position near the left end of the housing bottom portion 2B corresponding to the front side of the mouse 1, and are largely separated in the horizontal direction and the vertical direction from the electronic circuit component 5 arranged on the opposite side. Therefore, even when the mouse 1 is exposed to the high temperature and high pressure steam in the autoclave treatment from all directions, the influence due to the high temperature and high pressure steam can be eliminated from any directions including the opening R1 and the lens 4, so that it is possible to prevent the occurrence of the damage and the breakdown.

By locating at least the electronic circuit component 5 and the substrate 10 at the center of the internal space of the housing 2 of the mouse 1 (including the positions almost at the center or near the center), the electronic circuit component 5 and the substrate 10 can secure the sufficient distance from the inner surface of the structural surface of the housing 2, so that the influence by the high heat, high pressure, water, and the like from all directions can be eliminated by the thermal insulation effect by the air or the insulation material described later and it is possible to prevent the occurrence of the damage and the breakdown even when the sterilization treatment by the high temperature and high pressure steam in the autoclave equipment is applied.

[2-2: Thermal Insulation Structure]

FIG. 8 shows a transverse cross-sectional view of the mouse 1 corresponding to FIG. 7. Also, FIG. 8 is an explanatory diagram relating to the first configuration example of the thermal insulation structure with plural layers. Hereinafter, the layers will be described in the order approximately from the outer side to the inner side. Note that the thermal insulation is a generic term of the prevention of the heat transfer. The housing 2 and each thermal insulation layer of the mouse 1 have the resistance and strength against the change in the temperature and the pressure during the autoclave treatment. Note that FIG. 8 shows the case in which the transmission unit 6 is the wiring passing through the vicinity of one side surface of the housing 2 in the X direction.

First, the housing 2 has a predetermined property (referred to as first property) including the heat resistance property, the thermal insulation property, the water resistance property (including the steam resistance property), the waterproofing property, (in other word, the sealing property), the pressure resistance property, the durability (resistance to repetitive use, temperature change, and the like), etc. Also, the housing 2 preferably has the stain resistance and the easy cleanability by the shape such as the curved surface and the like. Further, the housing 2 has chemical resistance to water, disinfectants, and the like. The housing 2 is made of, for example, a hard resin such as a super engineering plastic. The super engineering plastic is an engineering plastic having strength, heat resistance, water resistance, and the like. The housing 2 may be made of a material mixed with thermal insulation particles. The housing 2 may be made of a material containing a reinforced resin such as glass fiber or carbon fiber. The housing 2 and each thermal insulation layer are not limited to single layer and may be composed of a plurality of layers.

2. The first thermal insulation layer 21 has a property (referred to as second property) including the heat resistance property, the thermal insulation property, the durability, etc. The first thermal insulation layer may be provided on the overall housing 2 or may be provided on a part of the housing 2. For example, the first thermal insulation layer 21 may be provided only on the housing bottom portion 2B. The first thermal insulation layer 21 may be the coating on the housing 2.

3. There is an air space between the first thermal insulation layer 21 and the second thermal insulation layer 22 including the substrate 10, and it has the thermal insulation property. The space includes the first space portion SP1 and the second space portion SP2. A thermal insulation material, a heat absorbing material, a filler, and the like may be additionally arranged in this space as described later.

4. The fourth thermal insulation layer 24 (for example, fourth thermal insulation layer 24 of the transmission unit 6) is arranged in the space in the housing 2 such as the first space portion SP1 and the second space portion SP2. The fourth thermal insulation layer 24 is preferably not in contact with the first thermal insulation layer 21. For example, the fourth thermal insulation layer 24 similarly has the second property. The fourth thermal insulation layer 24 may be composed of a plurality of layers.

5. For example, the second thermal insulation layer 22 similarly has the second property. Further, the second thermal insulation layer 22 may be composed of a plurality of layers. The third space portion SP3 is provided in the second thermal insulation layer 22. The third space portion SP3 is an air space, but it may be a space filled with Ar gas, a space in a nearly vacuum state, or a space filled with a thermal insulation material as a modification. In this case, the second thermal insulation layer 22 has the sealing property. Note that it is desirable that the substrate 10 and the second thermal insulation layer 22 are configured to have a space so as not to be in contact with the housing 2, and this would be better in terms of the heat conductivity.

6. For example, the third thermal insulation layer 23 in the second thermal insulation layer 22 similarly has the second property and further has the insulation property. In addition, the thermal insulation coating having, for example, the same property as the third thermal insulation layer 23 may be applied to each surface of the substrate 10 and the mounted components such as the electronic circuit component 5.

In FIG. 8, examples of the directions of the heat transmitted from outside of the mouse 1 during the sterilization treatment in the autoclave equipment Y1 in FIG. 25 are shown by arrows. Here, the directions are shown while focusing on the electronic circuit component 5. The directions in which the heat enters are all directions, but only eight directions are shown here. In the mouse 1 according to the second embodiment, the electronic circuit component 5 and others are arranged at the position near the center of the housing 2 by using the transmission unit 6. Therefore, even when the heat from outside is conducted to the electronic circuit component 5 from each direction of the surface of the housing 2 during the sterilization treatment, the distance is thermodynamically large, and thus the heat is less likely to be conducted. Further, since a plurality of thermal insulation layers are provided in each direction, it is difficult to conduct the heat to the electronic circuit component 5. In particular, since the electronic circuit component 5 is largely separated from the opening R1 of the housing bottom portion 2B in the horizontal direction and the vertical direction and each thermal insulation layer is provided, the heat conduction from the opening R1 and the lens 4 can be prevented. It is possible to insulate the heat by each thermal insulation layer before the heat reaches the electronic circuit component 5, and it is possible to control the temperature distribution in the internal space of the housing 2. As a result, the electronic circuit component 5 and the like are protected from heat.

Since the thermal insulation material and the like can be arranged between the housing 2 and the object to be protected in the second embodiment, it is also possible to select the arrangement position so as to shorten the distance between the housing 2 and the object to be protected in consideration of the functions of the thermal insulation material and the like.

Each of the thermal insulation layers is not limited to the configuration example in FIG. 9, and they can be used in combination. For example, the configuration in which the first thermal insulation layer 21, the second thermal insulation layer 22, and the fifth thermal insulation layer 25 are provided is possible. In addition, the configuration is not limited to that having the thermal insulation layer provided in all directions of the surface of the housing 2, and it is also possible to select the region whose thermal insulation property needs to be improved and provide the thermal insulation layer for the region. For example, each thermal insulation layer may be provided only for the region corresponding to the housing bottom portion 2B.

[2-3: Connection Between Lens and Transmission Unit]

Figure 9A:
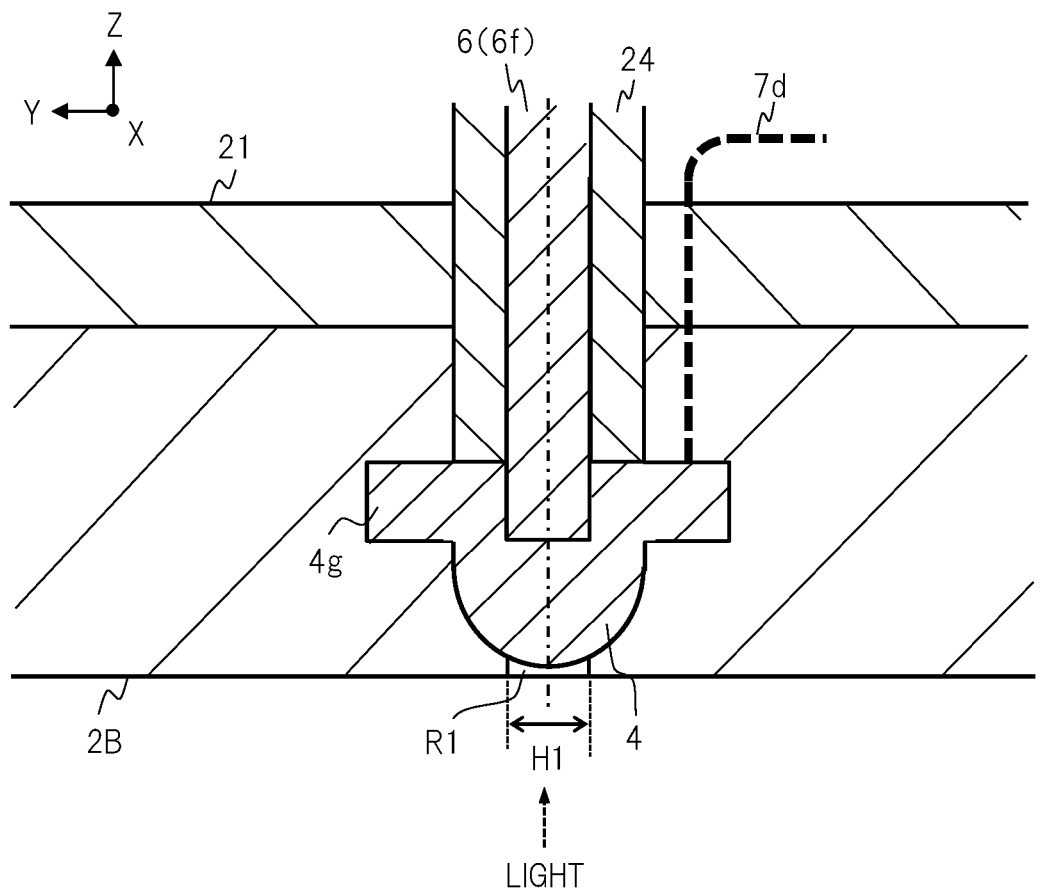
FIG. 9A is a diagram showing an example of a connection configuration between a lens and a transmission unit in the mouse according to the second embodiment.
Figure 9B:
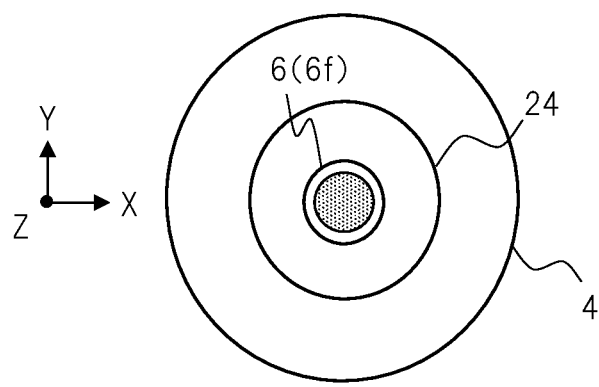
FIG. 9B is a diagram showing the example of the connection configuration between the lens and the transmission unit in the mouse according to the second embodiment.

FIG. 9 is a schematic diagram showing an example of a connection configuration between the lens 4 in the opening R1 of the housing bottom portion 2B and the optical fiber 6*f* of the transmission unit 6 in the mouse 1 according to the second embodiment. FIG. 9A shows the transverse cross-section thereof, and FIG. 9B shows the planar configuration thereof. The first thermal insulation layer 21 is arranged on the upper surface of the housing bottom portion 2B. In the region of the opening R1 having the width H1, the lens 4, the optical fiber 6*f*, and the fourth thermal insulation layer 24 are arranged. As shown in FIG. 9B, the lens 4, the optical fiber 6*f*, and the like have, for example, an axisymmetric shape. It is preferable that the lens 4 has the heat resistance property, the water resistance property, the pressure resistance property, the durability, the property of no or little deformation and discoloration due to temperature change, and the like.

The lens 4 is fixed in the housing bottom portion 2B. A flange portion 4*g* of the lens 4 is a portion for fixing the position and sealing. The curved surface of the lens 4 (it is a convex surface here, but is not limited to this) is arranged so as not to protrude from the lower surface of the housing bottom portion 2B. The space between the curved surface of the lens 4 in the opening R1 and the lower surface of the housing bottom portion 2B is designed to have a shape with as few irregularities as possible for the stain resistance and the easy cleanability. Alternatively, a cover having the light transparent property, the heat resistance property, the waterproofing property, and the like may be arranged in the space so as to be smooth with respect to the lower surface of the housing bottom portion 2B. Alternatively, a part of the lens 4 or the cover having the curved surface may protrude downward from the main surface of the housing bottom portion 2B. At the position of the central axis of the lens 4, one end of the optical fiber 6*f* is fixed. The outer circumference of the optical fiber 6*f* is covered with the fourth thermal insulation layer 24. At the time of manufacturing, for example, respective components may be fixed by forming the housing bottom portion 2B by injection molding. An adhesive, a thermal insulation material, a sealing material, for example, a resin packing (O-ring), or the like may be provided in the vicinity of the flange portion 4*g*. The connection as described above may be reinforced by providing adhesiveness to the first thermal insulation layer 21, the fourth thermal insulation layer 24, the fifth thermal insulation layer 25, and the like. It is desirable that the adhesive and the sealing material have the heat resistance property. In this example, a part of the optical fiber 6*f* and a part of the fourth thermal insulation layer 24 are embedded in the housing bottom portion 2B, but the configuration is not limited to this. As another configuration example, when the housing 2 is composed of an outer shell and an inner shell, the lens 4 may be fixed between the outer shell and the inner shell. Further, when there is the light source unit wiring 7*d* from the light source unit 7 described above, for example, the configuration in which one end of the light source unit wiring 7*d* (schematically indicated by a broken line) using an optical fiber is optically connected to the lens 4 in the housing bottom portion 2B is also possible.

[2-4: Effect and Others]

(a) As described above, in the mouse according to the second embodiment, the thermal insulation property and the waterproofing property can be further enhanced by providing the thermal insulation structure with plural layers as compared with the first embodiment. Also, with this configuration, it is possible to withstand the class B autoclave sterilization treatment (FIG. 25). In the medical settings, it is possible to use the sterilized mouse in the surgery or the like. Note that, when components having the heat resistance property and the like are used for all of the components in the housing 2, the heat resistance structure in the housing 2 is unnecessary or can be omitted, and the configuration of the first embodiment may be adopted.

(b) In the mouse according to the second embodiment, by locating at least the electronic circuit component 5 and the substrate 10 at the center of the internal space of the housing 2 of the mouse 1 (including the positions almost at the center or near the center), the electronic circuit component 5 and the substrate 10 can secure the sufficient distance from the inner surface of the structural surface of the housing 2, so that the influence by the high heat, high pressure, water, and the like from all directions can be eliminated by the thermal insulation effect by the air or the insulation material and it is possible to prevent the occurrence of the damage and the breakdown even when the sterilization treatment by the high temperature and high pressure steam in the autoclave equipment is applied.

[2-5: Second Modification]

Figure 10A:
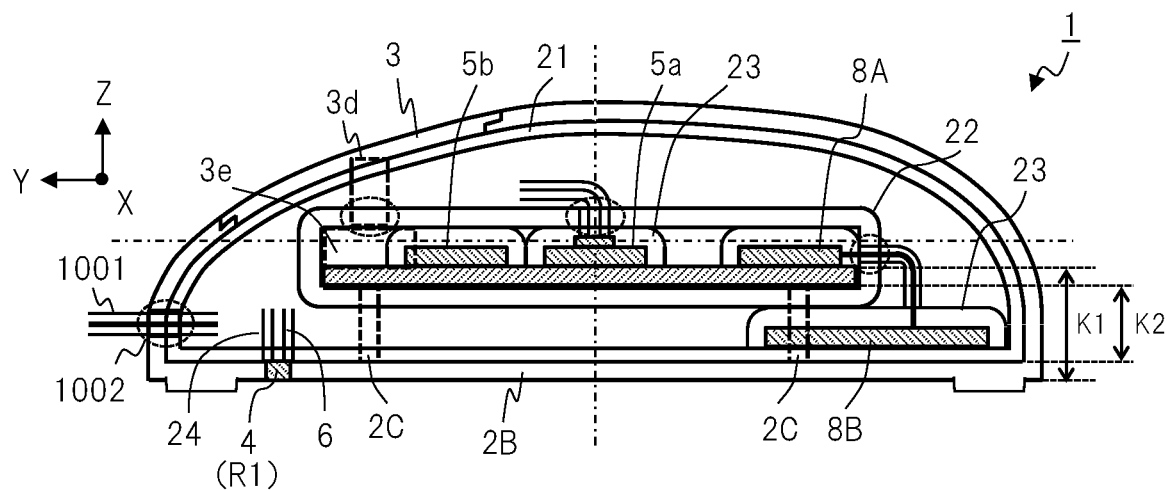
FIG. 10A is a diagram showing a configuration of a mouse according to a modification (second modification) of the second embodiment.
Figure 10B:
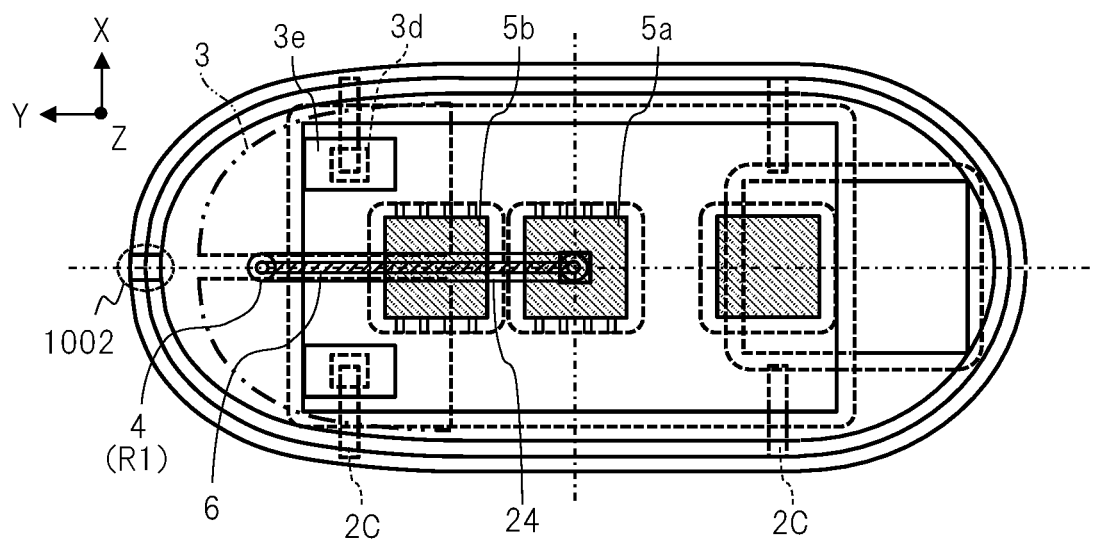
FIG. 10B is a diagram showing the configuration of the mouse according to the modification (second modification) of the second embodiment.

FIG. 10 shows a configuration of the mouse 1 according to the second modification as a modification of the mouse according to the second embodiment. FIG. 10A shows the longitudinal cross-section thereof, and FIG. 10B shows the planar configuration thereof. In the configuration of the second modification, the configuration of the first modification shown in FIG. 6 is used in common as a basis, and a thermal insulation structure is added thereto. The first thermal insulation layer 21 is provided on the inner surface of the housing 2. The rod 3d of the button 3 and the supporting portions 2C of the housing bottom portion 2B penetrate a part of the first thermal insulation layer 21 and the second thermal insulation layer 22. Note that the configuration in which the second thermal insulation layer 22 is sandwiched between the rod 3d and the switch 3e is also possible. The substrate 10 having the plurality of electronic circuit components 5 (5a, 5b), the secondary battery 8A, and the switch 3e is housed in the second thermal insulation layer 22. Each of the electronic circuit components 5a and 5b and the secondary battery 8A is covered with the third thermal insulation layer 23. When the third thermal insulation layer 23 is arranged under the substrate 10 as in this example, it can serve to have an important function to support and/or fix the substrate 10 at least partially.

As another modification, in the mouse 1 having a wired communication function, an opening 1002 for a wired communication cable 1001 may be provided in a part of the housing 2, for example, at a position on a front side of the housing upper portion 2A. The wired communication cable 1001 and the opening 1002 have the thermal insulation property, the sealing property, and the like. In addition, a terminal or a power cable for the power source unit 8 may be provided so as to come out of the housing 2. In this case, the thermal insulation property, the sealing property, and the like are similarly provided to the terminal, the power cable, and the opening for them. In this case, battery is unnecessary in the housing 2. Further, it is preferable that the metal parts in the components such as connectors (not shown) relating to the wired communication cable 1001 and the power cable have the rust prevention property.

As another modification, the configuration in which a region such as a cutout or a through hole is provided in a part of a surface of the substrate 10 and a corresponding part of the second thermal insulation layer 22 and the wiring of the transmission unit 6 passes through the region is also possible.

[2-6: Third Modification]

Figure 11:
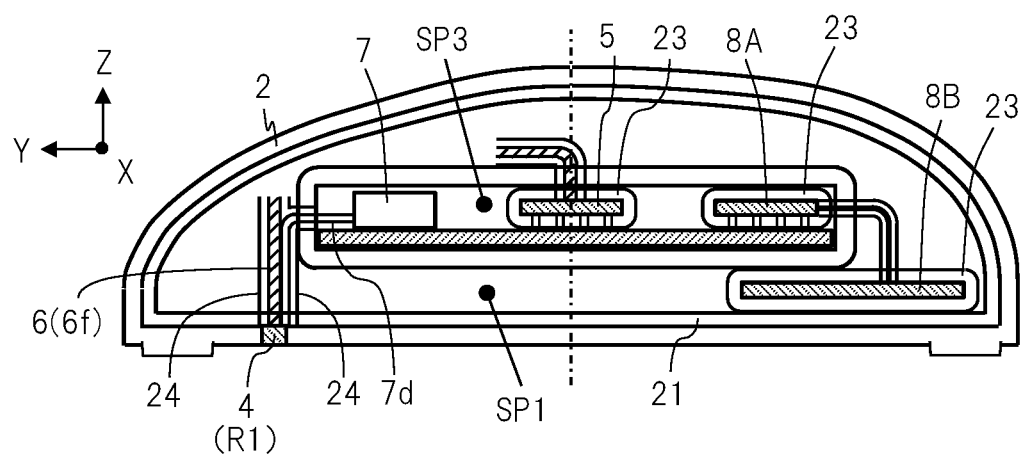
FIG. 11 is a diagram showing a configuration of a mouse according to a modification (third modification) of the second embodiment.

FIG. 11 shows the longitudinal cross-section of a configuration of the mouse 1 according to the third modification as a modification of the mouse according to the second embodiment. In this third modification, the light source unit 7 is provided on the substrate 10 and they are surrounded by the second thermal insulation layer 22. For example, an LED element is mounted as the light source unit 7 at the position on the front side on the upper surface of the substrate 10. The light source unit 7 is controlled by the electronic circuit component 5 through the circuit of the substrate 10. For example, the light source unit wiring 7d from the light source unit 7 comes out to the first space portion SP1 through the opening in a part of the second thermal insulation layer 22 and is connected to the lens 4. For example, an optical fiber is used as the light source unit wiring 7d, and the light source unit wiring 7d is covered with the fourth thermal insulation layer 24. The light source unit wiring 7d and the optical fiber 6f of the transmission unit 6 may be bundled by the fourth thermal insulation layer 24 and the fifth thermal insulation layer 25.

Also, in the third modification, each of the electronic circuit component 5 and the secondary battery 8A in the third space portion SP3 in the second thermal insulation layer 22 and the wireless charging unit 8B on the housing bottom portion 2B is almost entirely surrounded by the third thermal insulation layer 23. In the third modification, individual components such as the secondary battery 8A are mounted on the substrate 10 via a part of the third thermal insulation layer 23, and a part of the third thermal insulation layer 23 is arranged also between the lower surface of the individual components such as the secondary battery 8A and the upper surface of the substrate 10. The wireless charging unit 8B is arranged on the first thermal insulation layer 21 via a part of the third thermal insulation layer 23. When the third thermal insulation layer 23 is arranged under the substrate 10 as in this example, it can serve to have an important function to support and/or fix the substrate 10 at least partially.

[2-7: Fourth Modification]

Figure 12A:
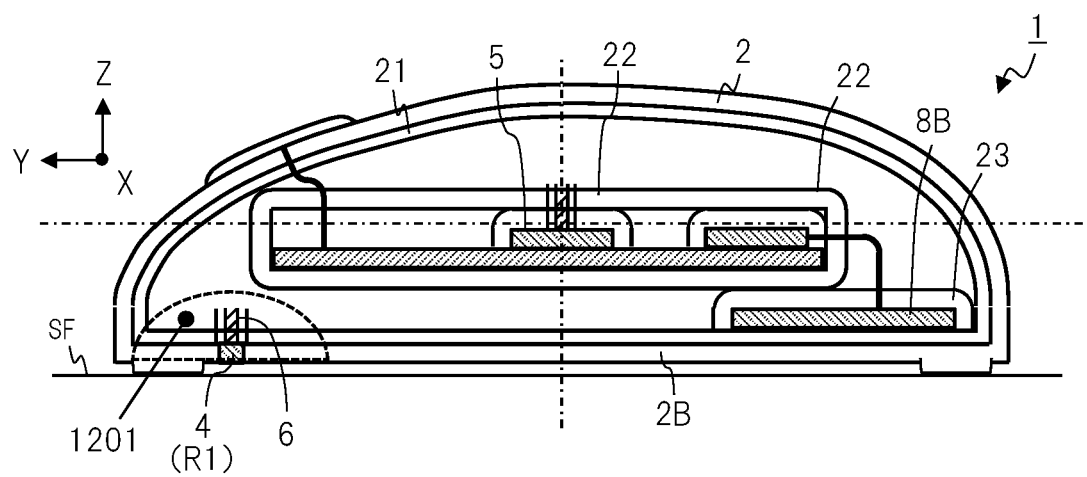
FIG. 12A is a diagram showing a configuration of a mouse according to a modification (fourth modification) of the second embodiment.
Figure 12B:
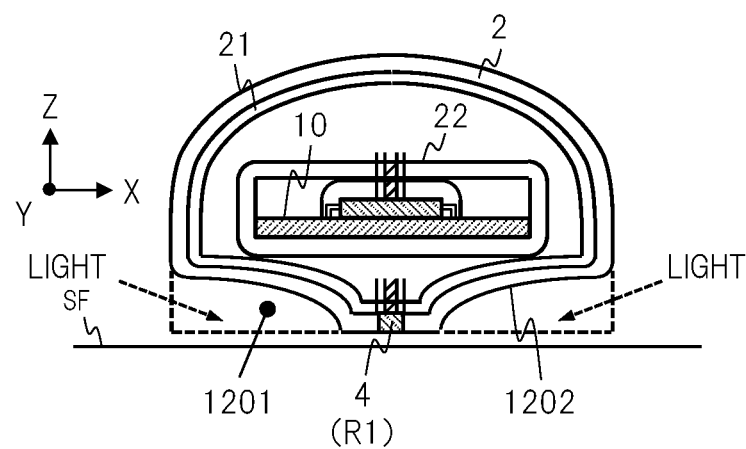
FIG. 12B is a diagram showing the configuration of the mouse according to the modification (fourth modification) of the second embodiment.

FIG. 12 shows a configuration of the mouse 1 according to the fourth modification as a modification of the mouse according to the second embodiment. This fourth modification shows a configuration example in which the light source unit 7 (or illumination device such as LED) is not provided and a light inlet portion including slant portions is provided in the housing 2. FIG. 12A shows the longitudinal cross-section thereof, and FIG. 12B shows the transverse cross-section thereof. The housing 2 is provided with slant portions 1202 serving as the light inlet portion in partial regions 1201 seen from the lateral side. The regions 1201 are regions located on the left and right sides of the opening R1 in FIG. 12B and located near the housing bottom portion 2B in the Z direction and near the left end in FIG. 12A (on the front side in the Y direction), and have curved surfaces easily gripped by a hand. The shape of the housing 2 makes the illumination light of the environment easily enter the lens 4 in the opening R1 through the regions 1201 between the housing 2 and the seating surface SF. Therefore, even when the light source unit 7 is not provided, the indoor illumination light can be efficiently utilized. As a result, heat generation by the light source unit 7 in the housing 2 can be eliminated, and the usable time of the mouse can be extended.

Note that the illustration of the transmission unit 6 and others is omitted in FIG. 12. In this configuration, for example, the wiring of the transmission unit 6 can be the wiring in the front-back direction described later. Also, in this configuration, the substrate 10 and the second thermal insulation layer 22 may be placed or fixed on the slant portions 1202 that are raised with respect to the housing bottom portion 2B. When the third thermal insulation layer 23 is arranged under the substrate 10 as in this example, it can serve to have an important function to support and/or fix the substrate 10 at least partially.

[2-8: Second Wiring Example]

Figure 13A:
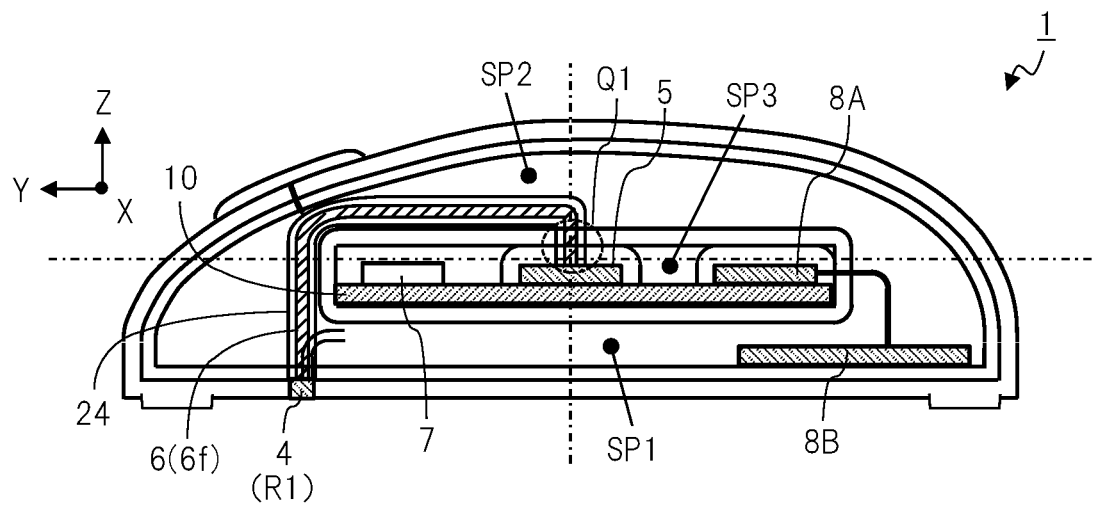
FIG. 13A is a diagram showing a configuration of a mouse according to a modification (second wiring example) of the second embodiment.
Figure 13B:
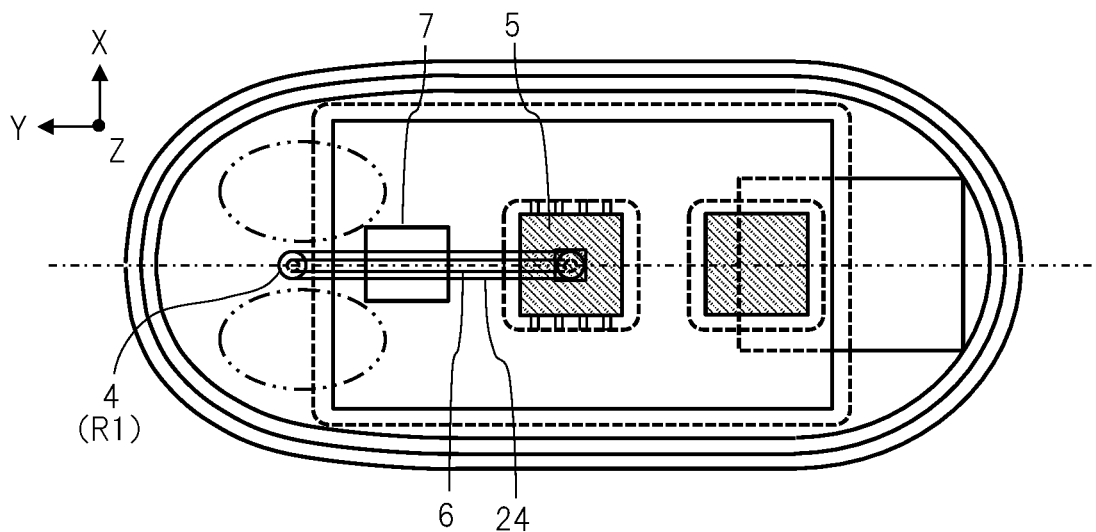
FIG. 13B is a diagram showing the configuration of the mouse according to the modification (second wiring example) of the second embodiment.

FIG. 13 shows another wiring example of the transmission unit 6 and others as a modification of the mouse according to the second embodiment. FIG. 13 shows the case of the front-side layout as the second wiring example. FIG. 13A shows the longitudinal cross-section thereof, and FIG. 13B shows the planar configuration thereof. For example, the optical fiber 6f is used as the transmission unit 6. The optical fiber 6f is covered with the fourth thermal insulation layer 24. The wiring route of the transmission unit 6 is as follows. First, one end of the optical fiber 6f of the transmission unit 6 is connected to the position of the lens 4 in the opening R1 near the left end (front side in the Y direction) of the housing bottom portion 2B in FIG. 13. The optical fiber 6f extends upward from that position in the Z direction in the first space portion SP1 and reaches the position higher than the substrate 10. The optical fiber 6f extends backward from that position in the Y direction on the upper surface side of the second thermal insulation layer 22 in the second space portion SP2 and reaches the position near the center. Then, the other end of the optical fiber 6f enters the third space portion SP3 through the opening Q1 of the second thermal insulation layer 22 and is connected to the upper surface of the image sensor 15 of the electronic circuit component 5.

In the first space portion SP1, for example, the wireless charging unit 8B is arranged in the back side region. As another modification, the configuration in which a region such as a cutout or a through hole is provided in a part of the substrate 10 and the second thermal insulation layer 22 and the wiring of the transmission unit 6 passes through the region is also possible.

[2-9: Third Wiring Example]

Figure 14A:
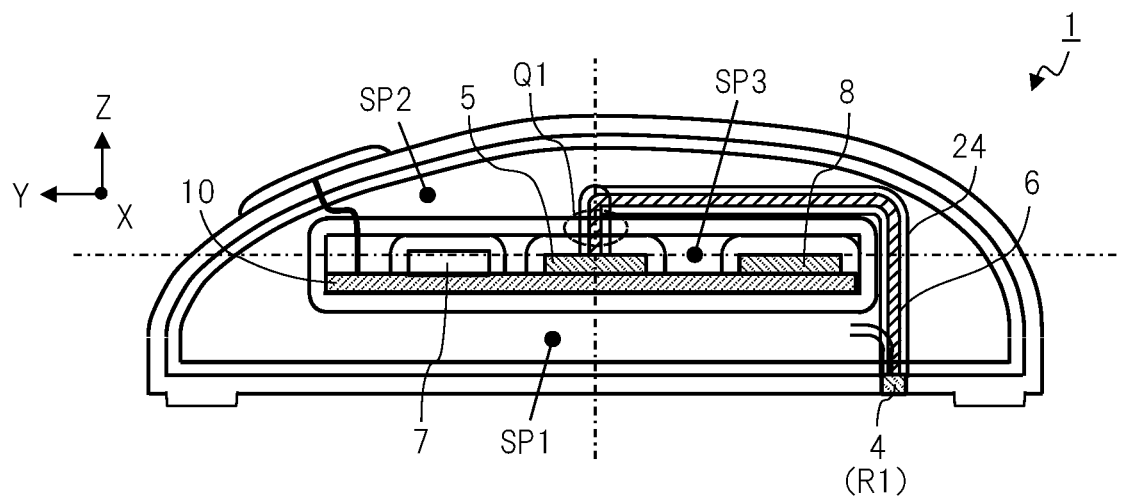
FIG. 14A is a diagram showing a configuration of a mouse according to a modification (third wiring example) of the second embodiment.
Figure 14B:
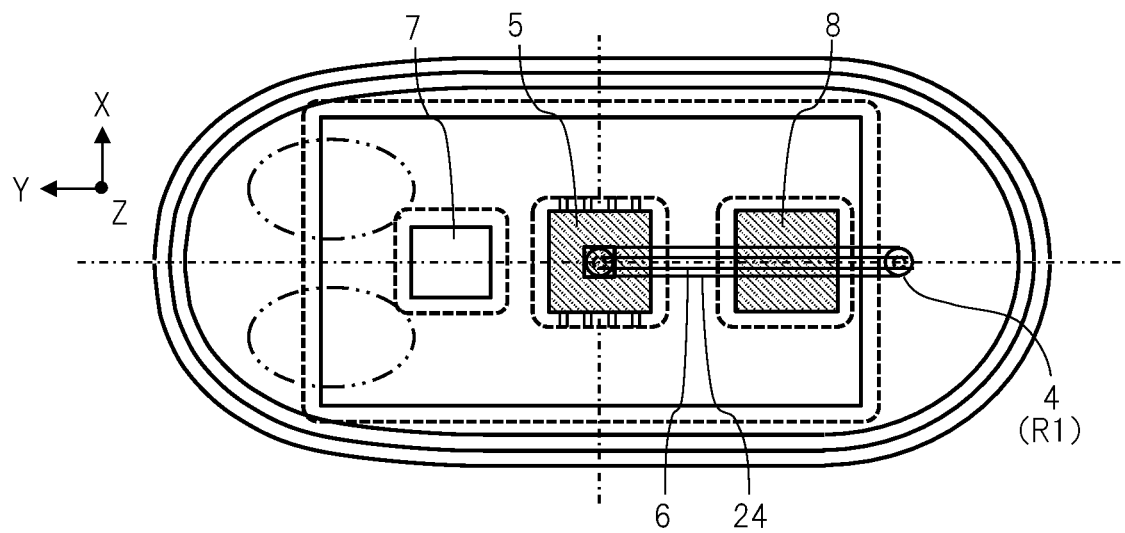
FIG. 14B is a diagram showing the configuration of the mouse according to the modification (third wiring example) of the second embodiment.

FIG. 14 shows the third wiring example of the transmission unit 6 as a modification of the mouse according to the second embodiment. In this example, the part of the opening R1 and the lens 4 is not provided near the left end of the housing bottom portion 2B, but is provided near the right end (back side in the Y direction) on the opposite side in the longitudinal direction in FIG. 14 unlike the other embodiments. Namely, the case of the back-side layout is shown as the third wiring example. FIG. 14A shows the longitudinal cross-section thereof, and FIG. 14B shows the planar configuration thereof. The wiring route of the transmission unit 6 is as follows. First, the optical fiber 6f of the transmission unit 6 extends upward in the Z direction from the position of the lens 4 in the opening R1 near the right end of the housing bottom portion 2B in the first space portion SP1 in FIG. 14 and reaches the position higher than the substrate 10. The optical fiber 6f extends forward from that position in the Y direction on the upper surface side of the second thermal insulation layer 22 in the second space portion SP2 and reaches the position near the center. Then, the other end of the optical fiber 6f enters the third space portion SP3 through the opening Q1 of the second thermal insulation layer 22 and is connected to the upper surface of the image sensor 15 of the electronic circuit component 5. The light source unit 7 is arranged on the substrate 10 and the wiring thereof extends from there to the lens 4 (wiring route is omitted).

[2-10: First Positional Relationship Example]

Figure 15A:
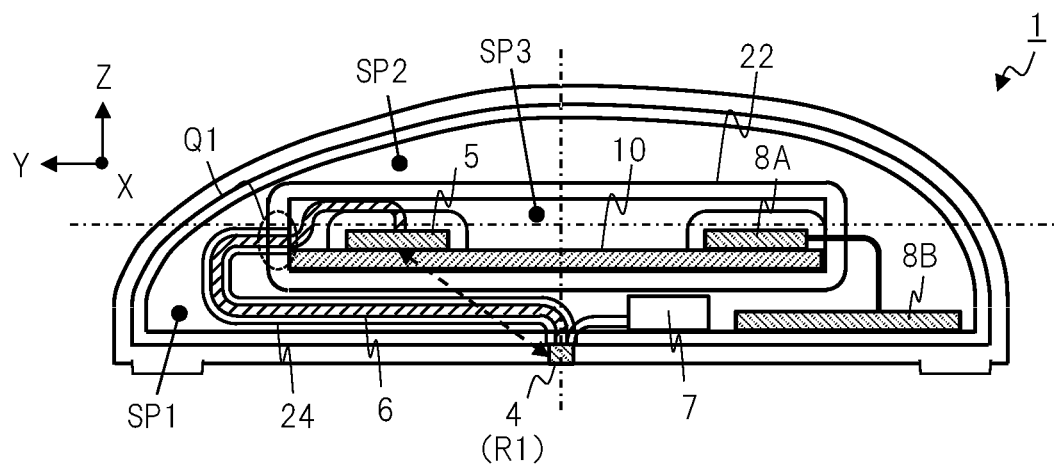
FIG. 15A is a diagram showing a configuration of a mouse according to a modification (first positional relationship example) of the second embodiment.
Figure 15B:
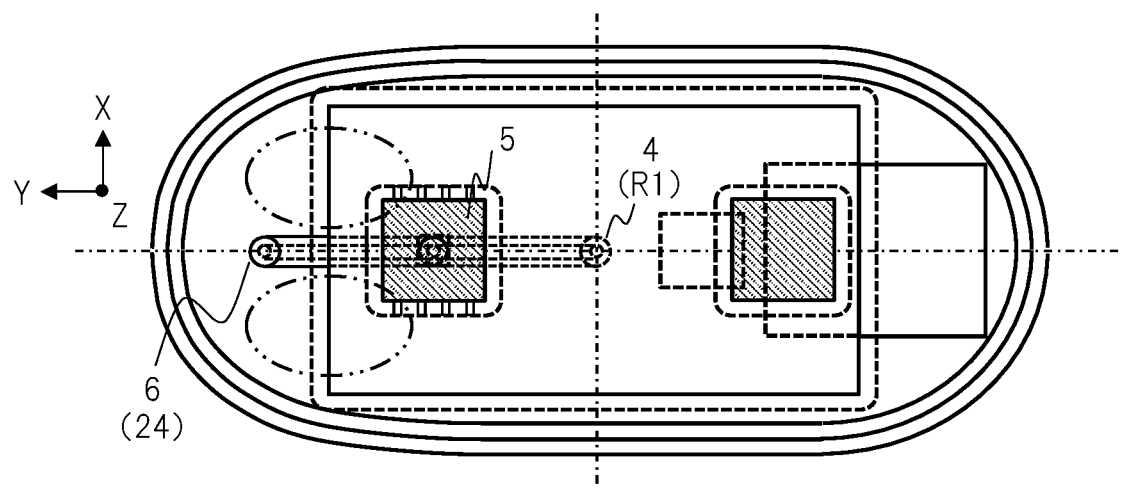
FIG. 15B is a diagram showing the configuration of the mouse according to the modification (first positional relationship example) of the second embodiment.

FIG. 15 shows a configuration example relating to the positional relationship between the lens 4 and the electronic circuit component 5, the wiring, and others as a modification of the mouse according to the second embodiment. FIG. 15A shows the longitudinal cross-section thereof, and FIG. 15B shows the planar configuration thereof. In the configuration example of FIG. 15, the lens 4 in the opening R1 is arranged at the position near the center of the housing 2 in plan view on the horizontal plane, and the electronic circuit component 5 and the image sensor 15 are arranged at the position on the front side as a position different therefrom in the horizontal direction or the planar direction and the vertical direction. The positional relationship therebetween is indicated by a broken line arrow. In this configuration, the electronic circuit component 5 and the like are arranged at the position farther in distance from the lens 4 in the opening R1. In the configuration example of FIG. 15, by using the transmission unit 6, the degree of freedom in the arrangement position relating to the electronic circuit component 5 and the like is high. For example, it is possible to arrange the electronic circuit component 5 and the like at the selected position where the resistance to heat and water can be easily secured. The electronic circuit component 5 and the like can be arranged at such a position for any reason.

In this configuration example, the front-side layout is adopted as the wiring example of the transmission unit 6, and the wiring particularly passes through the opening Q1 in the side surface of the second thermal insulation layer 22. The optical fiber 6f of the transmission unit 6 extends from the position of the lens 4 forward in the first space portion SP1, extends upward from the front-side space, and enters the third space portion SP3 through the opening Q1 in the front side surface of the second thermal insulation layer 22. Then, the other end of the optical fiber 6f is laid in the second thermal insulation layer 22 and is connected to the image sensor 15 of the electronic circuit component 5 on the front side on the substrate 10. The wiring example is not limited to this, and the wiring passing through the vacant region in the housing 2 is possible. Note that the fourth thermal insulation layer 24 may be omitted in the second thermal insulation layer 22. It is also possible to arrange the secondary battery 8A near the center of the substrate 10 and mount other components.

In the modification of FIG. 15, since the opening R1 and the lens 4 and the electronic circuit component 5 and the image sensor 15 are arranged so as to be separated at the positions different in the horizontal direction, even when heat and water enter the mouse 1 through the part of the opening R1 and the lens 4 in the autoclave treatment or the like, it is possible to possible to prevent the water and heat from reaching the electronic circuit component 5 and the image sensor 15.

[2-11: Second Positional Relationship Example]

Figure 16A:
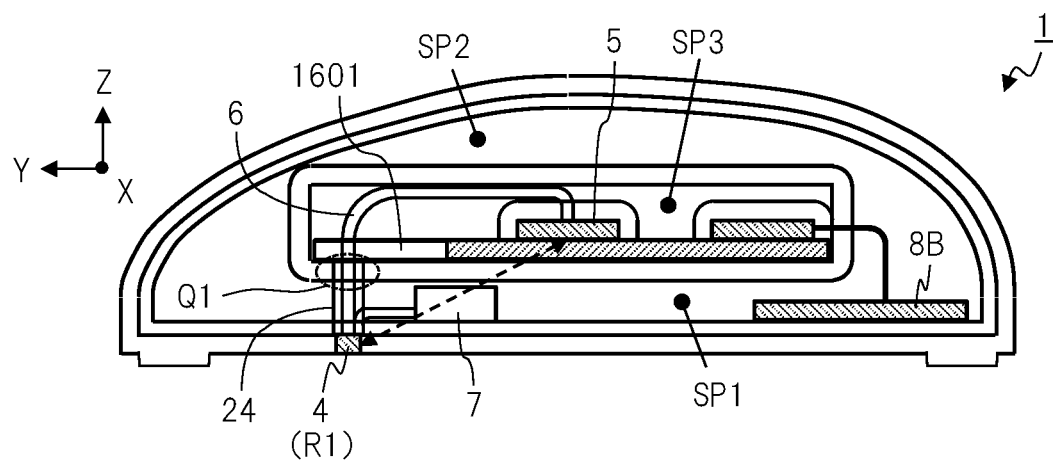
FIG. 16A is a diagram showing a configuration of a mouse according to a modification (second positional relationship example) of the second embodiment.
Figure 16B:
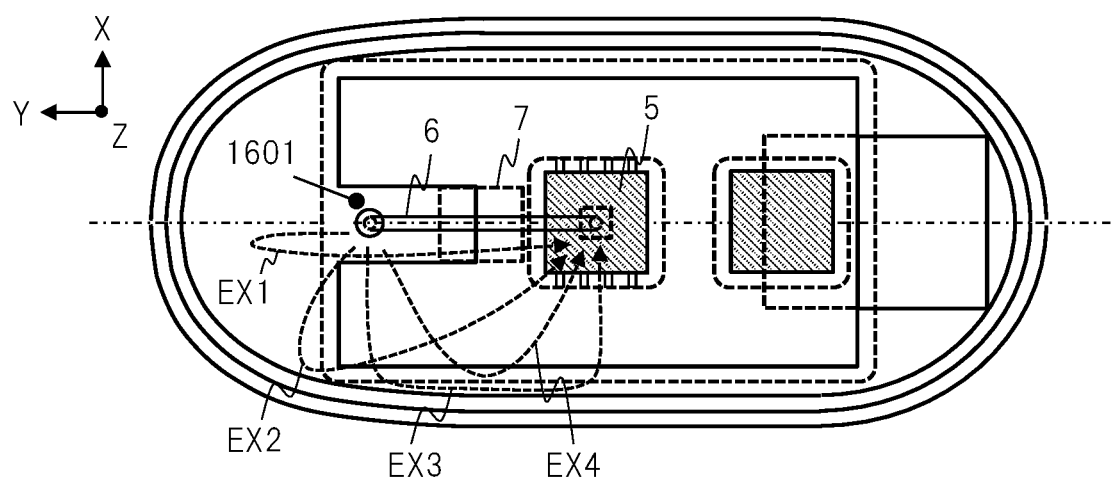
FIG. 16B is a diagram showing the configuration of the mouse according to the modification (second positional relationship example) of the second embodiment.

FIG. 16 shows another configuration example relating to the positional relationship between the lens 4 and the electronic circuit component 5, the wiring, and others as a modification of the mouse according to the second embodiment. FIG. 16A shows the longitudinal cross-section thereof, and FIG. 16B shows the planar configuration thereof. In this configuration example, the electronic circuit component 5 and others are arranged at the position near the center of the housing 2 in plan view on the horizontal plane, and the opening R1 and the lens 4 are arranged at the position on the front side in the housing bottom portion 2B as a position different therefrom in the horizontal direction. Also in this configuration, the electronic circuit component 5 and the like are arranged at the position farther in distance from the opening R1 and the lens 4 in the horizontal direction and the vertical direction.

This modification is slightly similar to the first embodiment, but is different from the first embodiment mainly in that the electronic circuit component 5 and others are arranged at the position near the center of the housing 2 and the opening R1 and the lens 4 are arranged at the intermediate position on the left side (FIG. 16) of the housing bottom portion 2B as a different position separated therefrom in the horizontal direction.

The wiring example of the transmission unit 6 has the following configuration. The optical fiber 6f of the transmission unit 6 extends upward in the first space portion SP1 from the position of the lens 4 in the opening R1, and enters the third space portion SP3 through the opening Q1 in the lower surface of the second thermal insulation layer 22. The optical fiber 6f comes out on the upper side of the substrate 10 through a region 1601 such as the cutout or the through hole formed in the substrate 10. The other end of the optical fiber 6f extends backward in the Y direction on the upper surface side of the substrate 10 to the position near the center and is connected to the image sensor 15 of the electronic circuit component 5. Note that the region such as the cutout or the through hole is provided even in the substrate of the conventional mouse in some cases. Such a region can be utilized for the wiring of the transmission unit 6. Since the lens 4 in the opening R1 is arranged at the position far from the center of the housing bottom portion 2B in the horizontal direction, it is possible to prevent the heat and the water entering the mouse 1 through the part of the opening R1 and the lens 4 from reaching the electronic circuit component 5.

Other wiring examples are schematically indicated by arrows in FIG. 16B. When the region 1601 such as a cutout is not formed in the substrate 10, various types of wirings such as the wiring examples EX1, EX2, EX3, and EX4 are possible. In the wiring example EX1, the optical fiber 6f once extends from the position of the lens 4 to the front side and then passes the second space portion SP2 and others. In the wiring example EX2, the optical fiber 6f passes through the front left position of the side surface of the housing 2. In the wiring example EX3, the optical fiber 6f extends from the position of the lens 4 to the left of the housing 2, extends backward along the left side surface, extends upward to come out on the upper side of the substrate 10, and then extends to the electronic circuit component 5 at the center. In the wiring example EX4, the optical fiber 6f extends from the position of the lens 4 diagonally backward to the left, extends upward on the left side surface of the housing 2 to come out on the upper side of the substrate 10, and then diagonally extends to the electronic circuit component 5 at the center.

[2-12: Fourth Wiring Example]

Figure 17A:
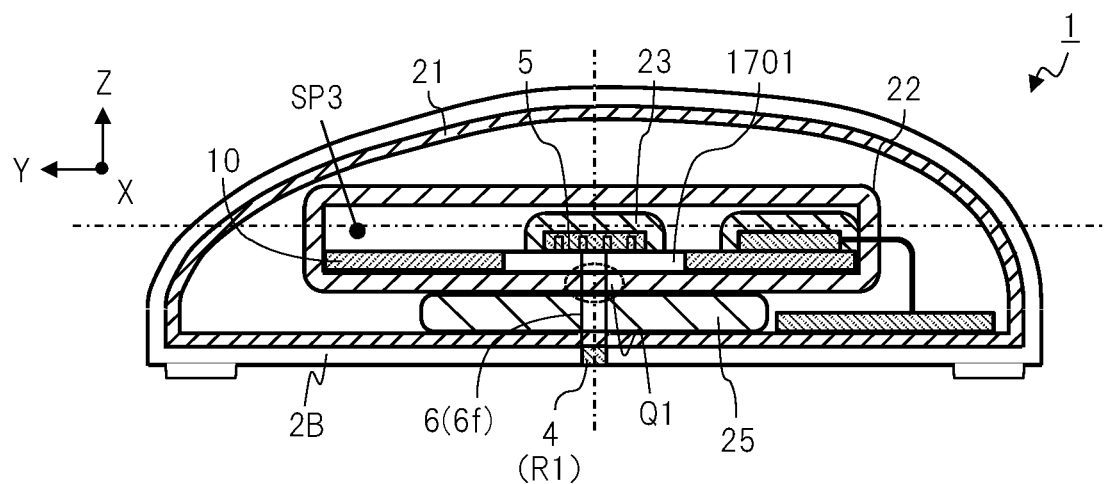
FIG. 17A is a diagram showing a configuration of a mouse according to a modification (fourth wiring example) of the second embodiment.
Figure 17B:
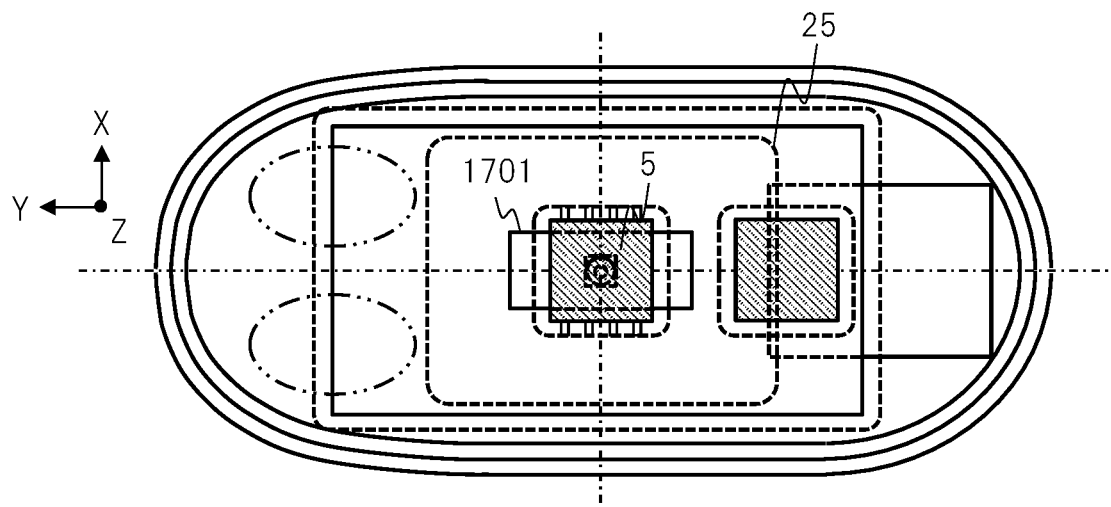
FIG. 17B is a diagram showing the configuration of the mouse according to the modification (fourth wiring example) of the second embodiment.

FIG. 17 shows the fourth wiring example of the transmission unit 6 as a modification of the mouse according to the second embodiment. The case of the upward penetrating linear layout is shown as the fourth wiring example. FIG. 17A shows the longitudinal cross-section thereof, and FIG. 17B shows the planar configuration thereof. The wiring route of the transmission unit 6 is as follows. First, the transmission unit 6 extends upward in the Z direction in the first space portion SP1 from the position of the lens 4 in the opening R1 near the center of the housing bottom portion 2B and reaches the opening Q1 of the second thermal insulation layer 22. In this example, the transmission unit 6 is covered with the fifth thermal insulation layer 25. In other words, the transmission unit 6 penetrates the fifth thermal insulation layer 25. The transmission unit 6 enters the third space portion SP3 through the opening Q1 and penetrates upward a region 1701 such as a through hole of the substrate 10. On the upper surface of the substrate 10, the electronic circuit component 5 is mounted on the through hole and the image sensor 15 is mounted on the lower surface of the electronic circuit component 5 as in the third example in FIG. 5C.

In this modification, the transmission unit 6 just linearly extends upward at the same position, and has the smaller wiring route length as compared with the embodiments above. For example, the optical fiber 6f arranged linearly is used as the transmission unit 6. As the optical fiber 6f, an inflexible component or a rigid cylindrical component may be used, or the optical fiber 6f may be covered with the fourth thermal insulation layer 24. Further, the transmission unit 6 is not limited to the linear optical fiber 6f, and may be composed of other optical components. The transmission unit 6 may be composed of a cylindrical light guide (for example, a lens barrel described later). The transmission unit 6 may be composed of a flexible component or a rigid component. The image light that has entered from the lens 4 travels upward inside the cylindrical light guide while reflecting as necessary, and enters the image sensor 15. The fourth thermal insulation layer 24 may be provided on the light guide. Further, the lens 4 of the housing bottom portion 2B and the light guide may be configured as an integrated component (transmission unit 6 or optical component).

Also, in this modification, the fifth thermal insulation layer 25 is provided in a part of the region between the first thermal insulation layer 21 and the second thermal insulation layer 22 in the first space portion SP1. This fifth thermal insulation layer 25 positions and fixes the second thermal insulation layer 22 surrounding the substrate 10. This fifth thermal insulation layer 25 is provided so as to have an area larger than that of the region 1701 of the through hole in plan view. Consequently, the thermal insulation property between the opening R1 and the electronic circuit component 5 is further enhanced.

Also in this modification, the distance between the lens 4 and the electronic circuit component 5 is sufficiently secured, and further the first thermal insulation layer 21, the fifth thermal insulation layer 25, and the second thermal insulation layer 22 are interposed therebetween, so that the effect of enhancing the thermal insulation property and the like for protecting the electronic circuit component 5 can be obtained. In addition, even when the through hole or the like is formed in the substrate 10, the thermal insulation property is reinforced by the fifth thermal insulation layer 25. Such a configuration is possible if the wiring route length of the transmission unit 6 needs to be shortened.

At the time of manufacturing, the fifth thermal insulation layer 25 is, for example, a deformable material with flexibility, and is positioned and fixed by placing and pressing the second thermal insulation layer 22 including the substrate 10 on the fifth thermal insulation layer 25. The fifth thermal insulation layer 25 is hardened by temperature control or the like, whereby the substrate 10, the second thermal insulation layer 22, and the like are securely fixed. Also, when the fifth thermal insulation layer 25 is arranged under the substrate 10 as in this example, it can serve to have an important function to support and/or fix the substrate 10.

[2-13: Fifth Wiring Example]

Figure 18:
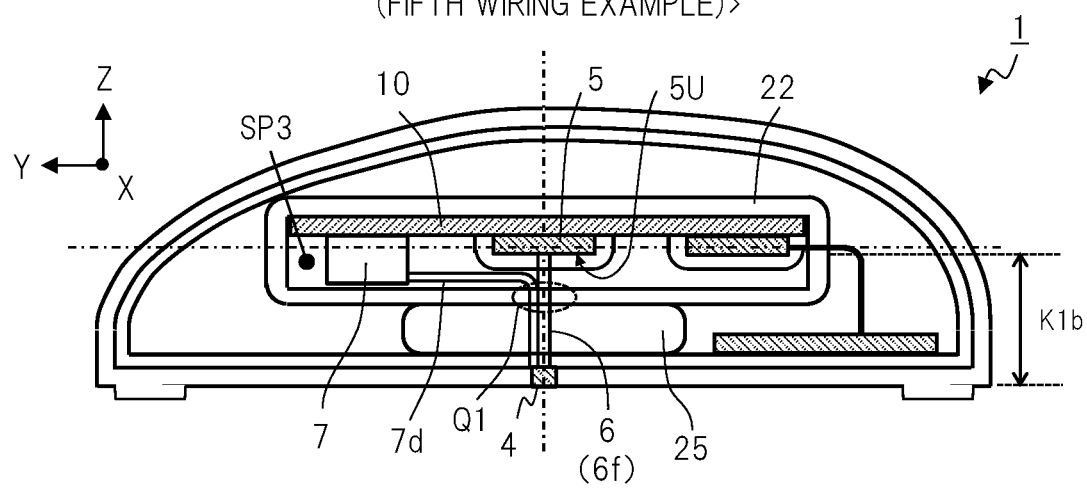
FIG. 18 is a diagram showing a configuration of a mouse according to a modification (fifth wiring example) of the second embodiment.

FIG. 18 shows the fifth wiring example of the transmission unit 6 as a modification of the mouse according to the second embodiment. Another example of the upward penetrating linear layout is shown as the fifth wiring example. In this modification, the substrate 10 is arranged so as to be reversed in the vertical direction with respect to those of the embodiments above. The wiring route of the transmission unit 6 is as follows. First, the optical fiber 6f serving as the transmission unit 6 extends upward in the Z direction in the first space portion SP1 from the position of the lens 4 in the opening R1 near the center of the housing bottom portion 2B and enters the third space portion SP3 through the opening Q1 of the second thermal insulation layer 22. The optical fiber 6f is covered with, for example, the fifth thermal insulation layer 25. The optical fiber 6f extends upward in the third space portion SP3 on the upper surface side (lower surface side in the overall configuration) of the substrate 10 and is connected to the upper surface (lower surface in the overall configuration) of the image sensor 15 (as in the second example in FIG. 5B) on the upper surface 5U of the electronic circuit component 5.

The electronic circuit component 5 on the substrate 10 is arranged on, for example, the lower surface of the substrate 10 at the position near the center in the housing 2. A distance K1b between the lower surface of the housing bottom portion 2B and the upper surface of the electronic circuit component 5 can be selected in consideration of the property relating to the heat and the like. In this modification, since the substrate 10 is reversed, the electronic circuit component 5 and the transmission unit 6 can be connected to each other without providing the through hole or the like in the substrate 10. The wiring of the transmission unit 6 and the like may be arranged under the substrate 10 in the second thermal insulation layer 22 as in this modification.

Also, in this modification, for example, the light source unit 7 is mounted at the position on the front side on the upper surface of the substrate 10 (lower surface in the overall configuration) and is housed and protected in the second thermal insulation layer 22. For example, the light source unit wiring 7d from the light source unit 7 extends in the third space portion SP3 to the position near the center, comes out of the second thermal insulation layer 22 through the opening Q1, extends downward, and is then connected to the lens 4. An optical fiber may be used as the light source unit wiring 7d. The thermal insulation property and the like can be enhanced by bundling two types of wirings (transmission unit 6 and light source unit wiring 7d) in the opening Q1. Note that, when plural wirings are bundled, the fourth thermal insulation layer 24, the fifth thermal insulation layer 25, a binder, or the like may be used. Also, when the fifth thermal insulation layer 25 is arranged under the substrate 10 as in this example, it can serve to have an important function to support and/or fix the substrate 10.

Third Embodiment

A mouse according to the third embodiment of the present invention will be described with reference to FIG. 19. The mouse according to the third embodiment shows another example of the thermal insulation structure.

[3-1: Thermal Insulation Structure]

Figure 19:
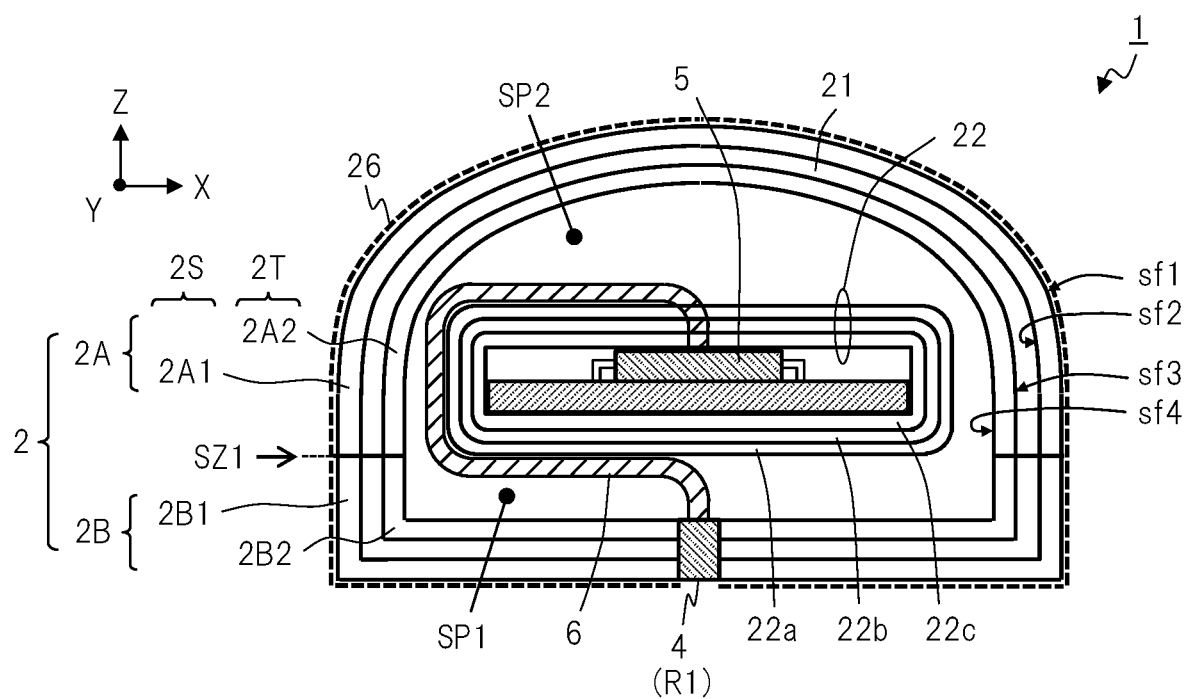
FIG. 19 is a transverse cross-sectional view showing a thermal insulation structure and others of a mouse according to the third embodiment of the present invention.

FIG. 19 shows a transverse cross-section of a thermal insulation structure with plural layers in the mouse according to the third embodiment. First, the housing 2 may be composed of multiple shells including two or more shells (in other words, housing portions). In other words, a subsidiary housing portion (shell, cover, or the like) may be provided outside or inside the main housing 2. The configuration having the outer shell as an outer cover and the inner shell as a main body or the configuration having the outer shell as a main body and the inner shell as an inner cover is also possible. In the configuration example in FIG. 19, the housing 2 has the double-layer structure including an outer shell 2S (outer housing portion) and an inner shell 2T (inner housing portion). More specifically, the outer shell 2S includes an outer shell upper portion 2A1 and an outer shell bottom portion 2B1, and the inner shell 2T includes an inner shell upper portion 2A2 and an inner shell bottom portion 2B2. The housing upper portion 2A includes the outer shell upper portion 2A1 and the inner shell upper portion 2A2, and the housing bottom portion 2B includes the outer shell bottom portion 2B1 and the inner shell bottom portion 2B2. The outer shell and the inner shell may be provided entirely or provided partially. For example, only the housing bottom portion 2B may be composed of the double shells. Each of the housing portions is made of a member having the heat resistance property, the thermal insulation property, the water resistance property, the waterproofing property, the pressure resistance property, etc. Each of the housing portions may have different properties. The sealing material or the like is applied to the bonding position SZ1 of the housing 2 as in the case described above.

In the configuration example in FIG. 19, the first thermal insulation layer 21 is sandwiched and held between the outer shell 2S and the inner shell 2T of the housing 2 (in the region between an inner surface sf2 of the outer shell 2S and an outer surface sf3 of the inner shell 2T). Consequently, the first thermal insulation layer 21 is stably held to the surface of the housing 2 and is less likely to be peeled off.

In addition, members (including the coating) for enhancing the thermal insulation property and others, for example, a bonding material and a sealing material may be provided between respective housing portions and on the outer surface and the inner surface of the respective housing portions. For example, a bonding material such as an adhesive having the heat resistance property may be provided on the inner surface sf2 of the outer shell 2S and the outer surface sf3 of the inner shell 2T. The outer shell 2S, the first thermal insulation layer 21, and the inner shell 2T are in close contact with each other, but the configuration thereof is not limited to this, and an air layer, a vacuum layer, an Ar gas layer, or the like may be provided between respective layers. The outer shell 2S, the first thermal insulation layer 21, the inner shell 2T, and others may be formed by the method other than the injection molding at the time of manufacturing.

Also, a coating layer 26 for enhancing the thermal insulation property and the lubrication property may be provided on an outer surface sf1 of the outer shell 2S (outer shell upper portion 2A1 and outer shell bottom portion 2B1). In other words, the outer shell 2S may be made of a resin or the like including the coating layer 26. A cover having the thermal insulation property and the lubrication property described later may be provided on the outer surface sf1 of the outer shell 2S. Also, a heat absorbing material may be mixed in the outer shell 2S and the inner shell 2T of the housing 2. Consequently, the heat from outside can be absorbed by the housing 2 within a suitable temperature range and the heat conduction into the housing 2 can be suppressed.

Further, a heat barrier structure may be provided to the housing 2. For example, an infrared absorbing layer and an infrared reflection layer on the inner side of the infrared absorbing layer are provided on the outer surface sf1 or the inner surface sf2 of the outer shell 2S, and the first thermal insulation layer 21 is provided on the outer surface sf3 or an inner surface sf4 of the inner shell 2T. Consequently, the heat barrier property against the heat from outside (including infrared) during the sterilization treatment can be provided to the housing 2. A material for making the infrared absorbing layer or the infrared reflection layer may be mixed in the material for making the housing 2. In this case, since the temperature during the autoclave sterilization (sterilization step YS13 in FIG. 25) is constant, the heat absorbed by the infrared absorbing layer is dissipated to the outside of the mouse.

The internal space of the housing 2 (first space portion SP1 and second space portion SP2), the opening R1, and others are sealed by the outer shell 2S, the inner shell 2T, the first thermal insulation layer 21, the sealing material, and the like. Consequently, the heat during the autoclave treatment is less likely to propagate in the housing 2 and the steam is less likely to enter the housing 2. The outer shell 2S may be composed of a cover made of, for example, silicone rubber. The inner shell 2T may be made of, for example, a super engineering plastic.

Further, in this configuration example, the second thermal insulation layer 22 is composed of plural layers, for example, three layers of a layer 22a, a layer 22b, and a layer 22c provided in this order from outside. The other thermal insulation layers may also be composed of plural layers.

Fourth Embodiment

A mouse according to the fourth embodiment of the present invention will be described with reference to FIG. 20. The mouse according to the fourth embodiment shows an example having another thermal insulation structure.

[4-1: Thermal Insulation Structure]

Figure 20A:
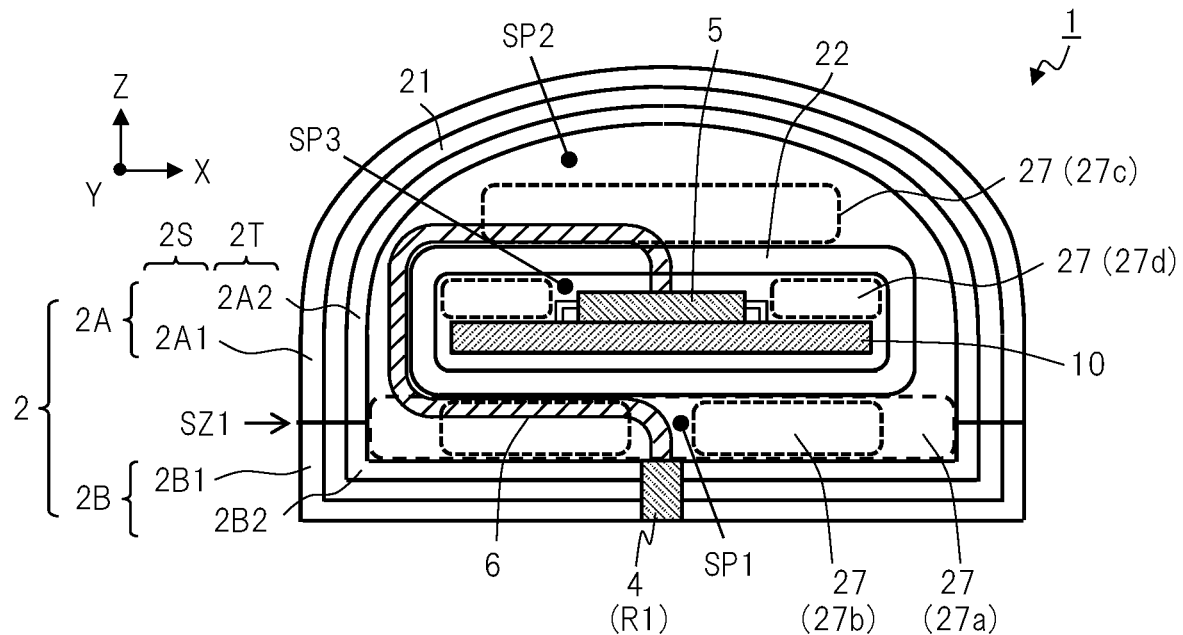
FIG. 20A is a transverse cross-sectional view showing a thermal insulation structure and others of a mouse according to the fourth embodiment of the present invention.

FIG. 20A shows a transverse cross-section of a thermal insulation structure with plural layers in the mouse according to the fourth embodiment. In this mouse 1, as in the case described above, the housing 2 is composed of the outer shell 2S and the inner shell 2T, the first thermal insulation layer 21 is provided between the outer shell 2S and the inner shell 2T, and the substrate 10 is surrounded by the second thermal insulation layer 22 in the internal space inside the inner shell 2T. In the fourth embodiment, in the internal space of the housing 2, a filler 27 is arranged by filling in a predetermined vacant region. The filler 27 is a material having the thermal insulation property and the heat resistance property, and may be considered as an additional thermal insulation layer. The filler 27 is made of, for example, a resin having an electrical insulation property, and it is filled in a predetermined region at the time of manufacturing and is then solidified by temperature control. The filler 27 further enhances the heat resistance property and the like of the mouse. In FIG. 20A, as an arrangement example of the filler 27 (corresponding filling region), the case where the filler 27 is arranged in a part of the internal space of the housing 2 is shown. For example, a filler 27a may be arranged entirely in the first space portion SP1 or a filler 27b may be arranged in a region where there are no parts. The filler 27 like this may be used as the above-mentioned fifth thermal insulation layer 25. The filler 27a or the filler 27b further enhances the heat resistance property and the like with respect to the heat from the lower side to the substrate 10. The filler 27a or the filler 27b may position and fix the second thermal insulation layer 22 surrounding the substrate 10 on the upper side, or may fix the wiring of the transmission unit 6.

Also, a filler 27c may be arranged in the second space portion SP2 on the upper side. The filler 27c further enhances the heat resistance property and the like with respect to the heat from the upper side to the substrate 10. In addition, a filler 27d may be arranged in the third space portion SP3 in the second thermal insulation layer 22. The filler 27d further enhances the heat resistance property and the like of the substrate 10. The filler 27c and the like may have the shape following the inner surface of the housing 2. Further, when the filler is arranged under the substrate 10 like the filler 27a and the filler 27b in this example, it can serve to have an important function to support and/or fix the substrate 10.

Figure 20B:
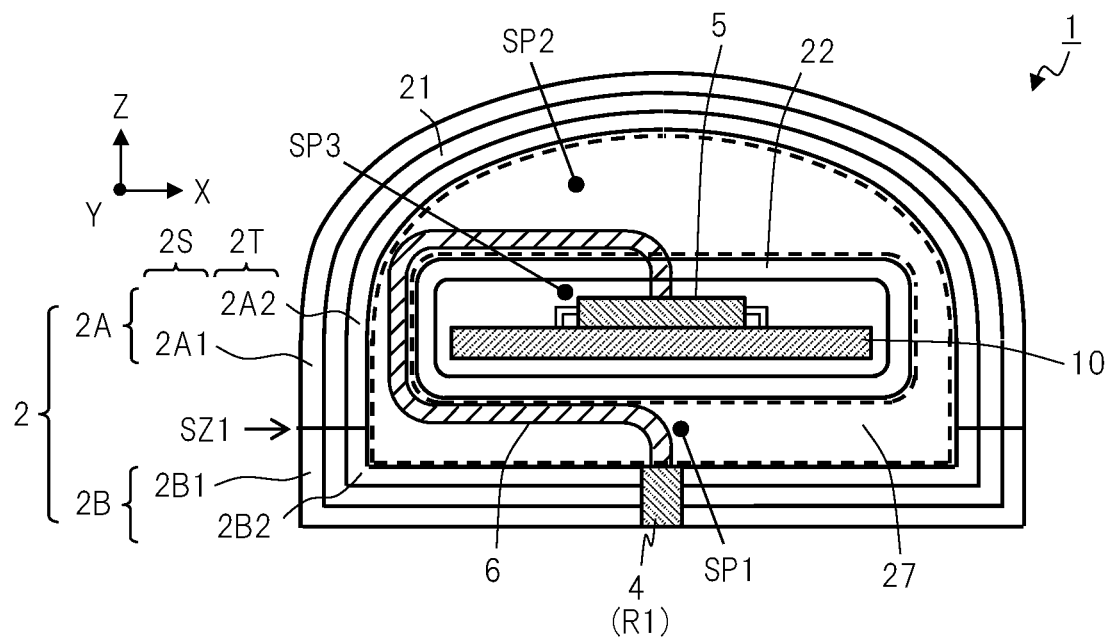
FIG. 20B is a transverse cross-sectional view showing a thermal insulation structure and others of the mouse according to the fourth embodiment of the present invention.

FIG. 20B shows the case where the filler 27 is arranged substantially entirely in the internal space of the housing 2 as another arrangement example of the filler 27. For example, the filler 27 is arranged in the substantially entire region between the inner shell 2T (or first thermal insulation layer 21) and the second thermal insulation layer 22. For example, a foaming medium (foaming thermal insulation material) such as urethane foam may be used as the filler 27. In this case, at the time of manufacturing, the foaming medium is injected into the housing 2 after the components other than the filler 27 are formed. The foaming medium injected into the housing 2 foams and fills the substantially entire region of the internal space (filling region) as shown in FIG. 20B. The activating method is not limited to temperature change, and may be a method using delayed chemical change, light, electromagnetic wave, sound wave, vibration, and others. Further, it is also possible to use a part of the housing 2 (for example, the opening R1) as an injection port of the foaming medium and adjust the internal pressure by finally closing the opening. It is also possible to adopt the method in which the substrate 10 and the second thermal insulation layer 22 are lifted upward by the injection and filling of the filler 27 from the injection port of the housing bottom portion 2B, thereby forming the arrangement shown in the drawing.

[4-2: Modification]

As a modification of the fourth embodiment shown in FIG. 20, the following configuration is also possible though different in the thermodynamic concept from each of the above-described embodiments. In this modification, a heat absorbing material may be arranged instead of the first thermal insulation layer 21 described above. The heat absorbing material is made of a material having the heat absorbing property with a large heat storage or a large heat capacity. This heat absorbing material absorbs heat from the outside of the housing 2 within a predetermined temperature range and retains it at that location. Consequently, the heat conduction from that location to the inner electronic circuit component 5 or the like is reduced or suppressed. Similarly, the inner shell 2T may be made of the heat absorbing material. Further, the fifth thermal insulation layer 25 or the filler 27 may be made of the heat absorbing material. A part of the second thermal insulation layer 22 may be made of the heat absorbing material. Each of the thermal insulation layer, the filler, and the heat absorbing material may be provided with adhesiveness to other members.

Fifth Embodiment

A mouse according to the fifth embodiment of the present invention will be described with reference to FIG. 21. The mouse according to the fifth embodiment shows a modification relating to the transmission unit 6.

[5-1: Transmission Unit]

Figure 21A:
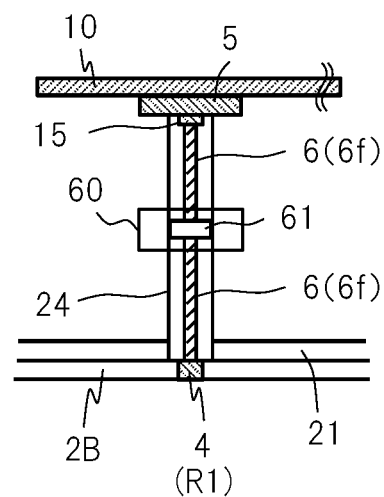
FIG. 21A is a diagram showing a configuration of a transmission unit of a mouse according to the fifth embodiment of the present invention.
Figure 21B:
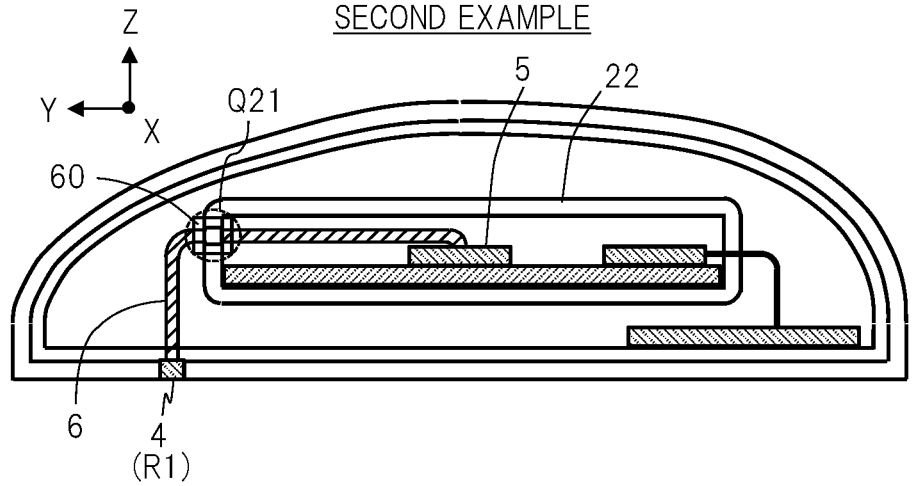
FIG. 21B is a diagram showing a configuration of a transmission unit of the mouse according to the fifth embodiment of the present invention.

FIG. 21 shows a configuration example of the transmission unit 6 in the mouse according to the fifth embodiment. FIG. 21A shows the first example, and FIG. 21B shows the second example. In FIG. 21A, the transmission unit 6 is composed of the optical fiber 6f and an optical coupler 60. The optical fiber 6f may be covered with the fourth thermal insulation layer 24. The optical fiber 6f extends upward from the position of the lens 4 in the opening R1 of the housing bottom portion 2B and is connected to the image sensor 15 of the electronic circuit component 5 of the substrate 10. The optical coupler 60 is arranged so as to be interposed at the intermediate position of the optical fiber 6f. In other words, the optical fiber 6f of the transmission unit 6 may be composed of a plurality of optical fibers, and the optical coupler 60 forms one transmission path by coupling the plurality of optical fibers. In this example, the optical coupler 60 physically and optically couples an end of a lower optical fiber and an end of an upper optical fiber. The optical coupler 60 relays the direct transmission of image light through the optical fiber. The optical coupler 60 may couple the optical fibers with the inclusion of the fourth thermal insulation layer 24. The optical coupler 60 may bundle a plurality of optical fibers as a binder.

Also, the optical coupler 60 may have the thermal insulation property and the like. A light transparent thermal insulation portion 61 may be provided in the optical coupler 60. The light transparent thermal insulation portion 61 transmits the image light, and it also has the thermal insulation property and thus thermally separates the transmission path. The light transparent thermal insulation portion 61 may be formed as a light transparent thermal insulation material or a layer such as an air layer, a vacuum layer, or an Ar gas layer. Consequently, the thermal insulation property in the transmission unit 6 is enhanced, and the heat conduction to the electronic circuit component 5 and others can be further suppressed.

In the example of FIG. 21B, the front-side layout is adopted, and the transmission unit 6 extends from the position of the lens 4 in the opening R1 provided on the front side of the mouse 1, that is, near the left end of the housing bottom portion 2B. The optical coupler 60 is similarly arranged at the intermediate position of the transmission path of the optical fiber 6f constituting the transmission unit 6. Also, the optical coupler 60 may be fixed at a predetermined position such as the side surface of the second thermal insulation layer 22. Consequently, the wiring of the transmission unit 6 can be suitably positioned so as to be thermally more advantageous. Note that the wiring of the transmission unit 6 may be fixed by other components. In this configuration example, the optical coupler 60 is arranged in an opening Q21 in the side surface of the second thermal insulation layer 22 and also has the sealing function. The part of the optical fiber 6f subsequent to the optical coupler 60 is laid in the second insulation layer 22.

Sixth Embodiment

A mouse according to the sixth embodiment of the present invention will be described with reference to FIG. 22. The mouse according to the sixth embodiment shows a configuration example relating to the optical element of the housing bottom portion 2B.

[6-1: Optical Element]

Figure 22A:
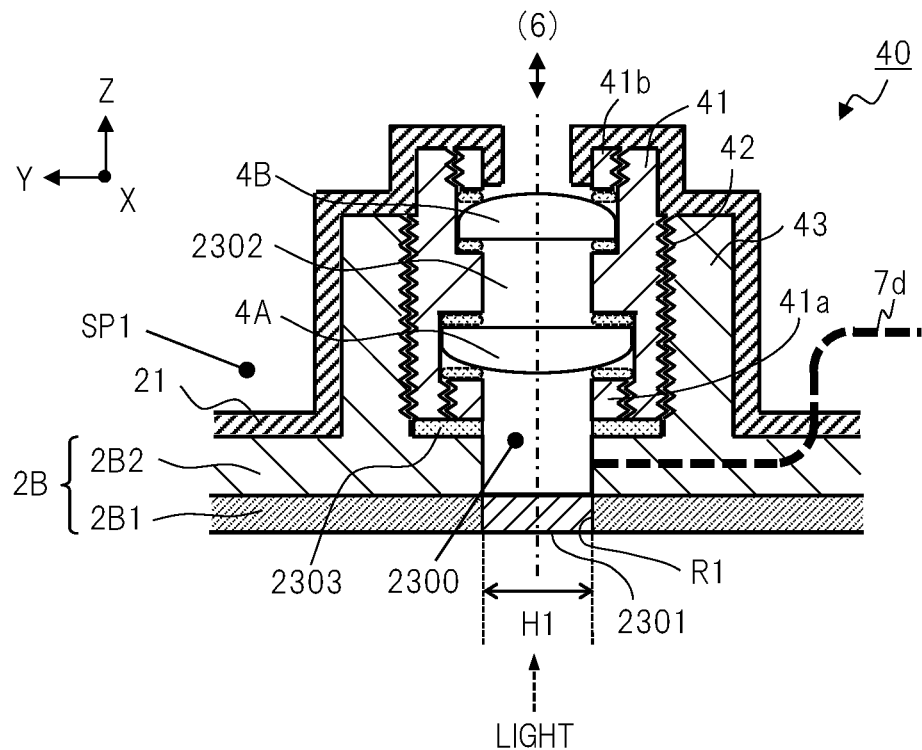
FIG. 22A is a diagram showing a configuration of an optical element at a housing bottom portion in a mouse according to the sixth embodiment of the present invention.

FIG. 22A is a schematic diagram showing a longitudinal cross-section of the configuration example relating to the lens 4 in the opening R1 of the housing bottom portion 2B in the mouse according to the sixth embodiment. In this configuration example, the sealing thermal insulation structure is additionally provided for the lens 4 which is the optical element of the housing bottom portion 2B. In this configuration example, the optical element corresponding to the lens 4 described above is composed as a lens structure 40 having a lens barrel 41. The lens structure 40 includes one or more lenses. In other words, this lens structure 40 is an image light entering unit.

The housing bottom portion 2B is composed of, for example, the outer shell bottom portion 2B1 and the inner shell bottom portion 2B2. At a part of the inner shell bottom portion 2B2, the lens barrel 41 of the lens structure 40 is formed so as to protrude inward. In this example, the lens barrel 41 is fixed in a fixing portion (screw hole) 43 protruding upward from the inner shell bottom portion 2B2 by a screw thread portion 42. The screw thread portion 42 is formed on the inner peripheral surface of the fixing portion 43 and the corresponding outer peripheral surface of the lens barrel 41. The first thermal insulation layer 21 is formed on the upper side of the inner shell bottom portion 2B2 so as to cover the lens barrel 41 and the fixing portion 43. The lens structure 40 has a substantially axisymmetric shape. The axis is indicated by a one-dot chain line. A space portion 2300 near the axis of the lens barrel 41 is a region corresponding to the width H1 of the opening R1, and is divided by a plurality of lenses 4A and 4B. In this example, the case where two lenses are provided is shown, but the number and shape of the lenses are not particularly limited. On the inner surface of the lens barrel 41, the lens 4A is fixed at the lower position via a component 41a having a screw thread portion and a sealing material, and the lens 4B is fixed at the upper position via a component 41b having a screw thread portion and a sealing material. The lens 4A is a lens having a curved surface convex downward, and the lens 4B is a lens having a curved surface convex upward. The space portion 2300 of the lens barrel 41 is divided by the lenses 4A and 4B, thereby forming a light transparent thermal insulation portion 2302. The light transparent thermal insulation portion 2302 is an air layer, a vacuum layer, an Ar gas layer, or a layer made of a light transparent thermal insulation material. One end of the transmission unit 6 (not shown) is connected to the upper portion of the lens barrel 41.

In the region corresponding to the opening R1 of the outer shell bottom portion 2B1, a heat barrier filter 2301 is provided so as to be smooth with respect to the lower surface of the outer shell bottom portion 2B1. The heat barrier filter 2301 is a filter or a cover which has the image light transparent property and functions to block the heat from outside and prevent water (steam) from entering. It is also possible to provide the heat barrier filter 2301 in the inner shell bottom portion 2B2 or the lens barrel 41.

At the time of manufacturing, the lenses 4A and 4B are fixed to the lens barrel 41, and the lens barrel 41 is fixed to the fixing portion 43 with the sealing material 2303 interposed therebetween. The screw thread portion 42 has the sealing property and the thermal insulation property. For example, the sealing material 2303 is provided on a part of the lower region where the lens barrel 41 abuts on the fixed portion 43. A thermal insulation material may be provided in addition to the sealing material 2303.

With the configuration having the lens barrel 41 and others as in the sixth embodiment, the waterproofing property around the opening R1 can be enhanced, and the positioning of the lens and the connection between the lens and the transmission unit 6 can be facilitated. Since the first space portion SP1 (distance K2 in FIG. 2) is also secured by the transmission unit 6, it is possible to provide the lens barrel 41 or the like having a certain height. As another configuration example, when a cover having the image light transparent property is used as the outer shell bottom portion 2B1, the opening R1 may be covered with the cover. The light source unit wiring 7d from the light source unit 7 may be connected to the lens structure 40. For example, the light source unit wiring 7d is laid through the fixing portion 43 and is optically connected to the space portion 2300.

[6-2: Modification]

Figure 22B:
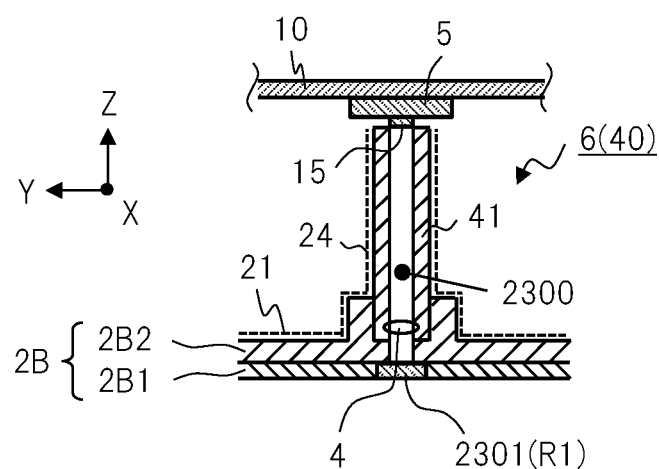
FIG. 22B is a diagram showing a configuration of a mouse according to a modification (fifth modification) of the sixth embodiment of the present invention.

FIG. 22B shows a configuration of the mouse according to the modification (fifth modification) of the sixth embodiment. In this modification, the lens structure 40 described above is extended upward in the Z direction, in other words, the length of the lens barrel 41 in the Z direction is increased to reach the vicinity of the image sensor 15 of the electronic circuit component 5 of the substrate 10. Consequently, the lens structure 40 of the linear lens barrel type is made to function as the transmission unit 6. The transmission unit 6 has both a function as the image light entering unit and a function as the transmission path to the image sensor 15. In the lens barrel 41 of the transmission unit 6, the upper end in the Z direction extends to, for example, the surface of the image sensor 15 of the electronic circuit component 5 of the substrate 10, and the optical axis of the lens barrel 41 and the optical axis of the image sensor 15 are aligned with each other. Note that the upper end of the lens barrel 41 may be fixed to the image sensor 15, the electronic circuit component 5, the substrate 10, the second thermal insulation layer 22, or the like. The light transparent thermal insulation material may be provided in the space portion 2300 in the lens barrel 41 entirely or partially.

Seventh Embodiment

Figure 23A:
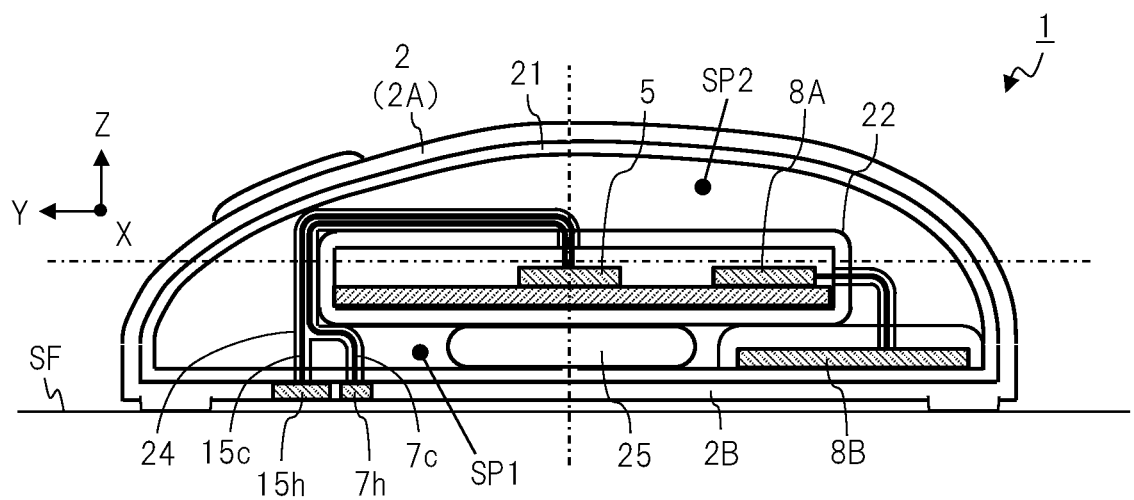
FIG. 23A is a diagram showing a configuration of a mouse according to the seventh embodiment of the present invention.

A mouse according to the seventh embodiment of the present invention will be described with reference to FIG. 23. The mouse according to the seventh embodiment shows a configuration example in the case where the image sensor 15 and others are arranged in the housing bottom portion 2B.
[Image Sensor in Housing Bottom Portion]
FIG. 23A shows a longitudinal cross-section of the mouse 1 according to the seventh embodiment. In the mouse 1 according to the seventh embodiment, an image sensor 15*h* and a light source unit 7*h* are arranged adjacent to each other in parallel at a position near the left end (position on the front side in the Y direction) in the housing bottom portion 2B in FIG. 23. The image sensor 15*h* is an imaging element (in other words, an image detection unit) that is arranged in the housing bottom portion 2B and converts the image light entering from outside (seating surface SF) into an image signal. The light source unit 7*h* is a light emitting element that is arranged in the housing bottom portion 2B and emits illumination light to the outside (seating surface SF). The outer surfaces of the image sensor 15*h* and the light source unit 7*h* are exposed to the outside from the housing bottom portion 2B. In this configuration example, the lens 4 is not provided. Further, the image sensor 15*h* and the light source unit 7*h* are connected to the electronic circuit component 5 of the substrate 10 through wirings 15*c* and 7*c*, which are electrical wirings, respectively. In this configuration example, based on the control from the electronic circuit component 5, the illumination light is emitted downward from the light source unit 7*h*, and the image sensor 15*h* converts the image light, which is the reflected light entering from the seating surface SF, into the image signal.

In the seventh embodiment, the transmission unit 6 is not the light transmission means, but is the wirings 15*c* and 7*c* serving as the electric signal transmission means. The image signal from the image sensor 15*h* is transmitted to the electronic circuit component 5 through the wiring 15*c*. The light source control signal from the electronic circuit component 5 is transmitted to the light source unit 7*c* through the wiring 7*c*. Note that, in this example, the other end of the transmission unit 6 is electrically connected to the electronic circuit component 5, but the configuration is not limited to this, and the other end of the transmission unit 6 may be connected to the substrate 10 if the electrical connection to the electronic circuit component 5 and others can be established through the circuit of the substrate 10. The wiring 15*c* and the wiring 7*c* may be bundled together and covered with the fourth thermal insulation layer 24. Although the front-side layout is adopted for the wiring 15*c* and the wiring 7*c* serving as the transmission unit 6 in this example, the layout is not limited to this, and various types of layout described above are also applicable.

In the configuration of the seventh embodiment shown in FIG. 23A, for example, the thermal insulation property, the heat resistance property, the waterproofing property, the water resistance property, the pressure resistance property, the stain resistance property, the easy cleanability, etc. are provided to the image sensor 15*h* and the light source unit 7*h* corresponding to a part of components arranged so as to be separated from the center of the housing bottom portion 2B toward the front side of the mouse 1 in the longitudinal direction and the horizontal direction. The electronic circuit component 5 and others sensitive to heat corresponding to the other part of components are arranged at the position separated from the image sensor 15*h* and the like, for example, the position near the center of the internal space of the housing 2, through the wiring 15*c* and the like serving as the transmission unit 6. Consequently, the electronic circuit component 5 and others are sufficiently protected from the heat and the like that may enter the mouse 1 from the part of the image sensor 15*h* and the light source unit 7*h* during the sterilization treatment. The sealing material and the thermal insulation material may be provided in the vicinity of the image sensor 15*h* and the light source unit 7*h*.

Figure 23B:
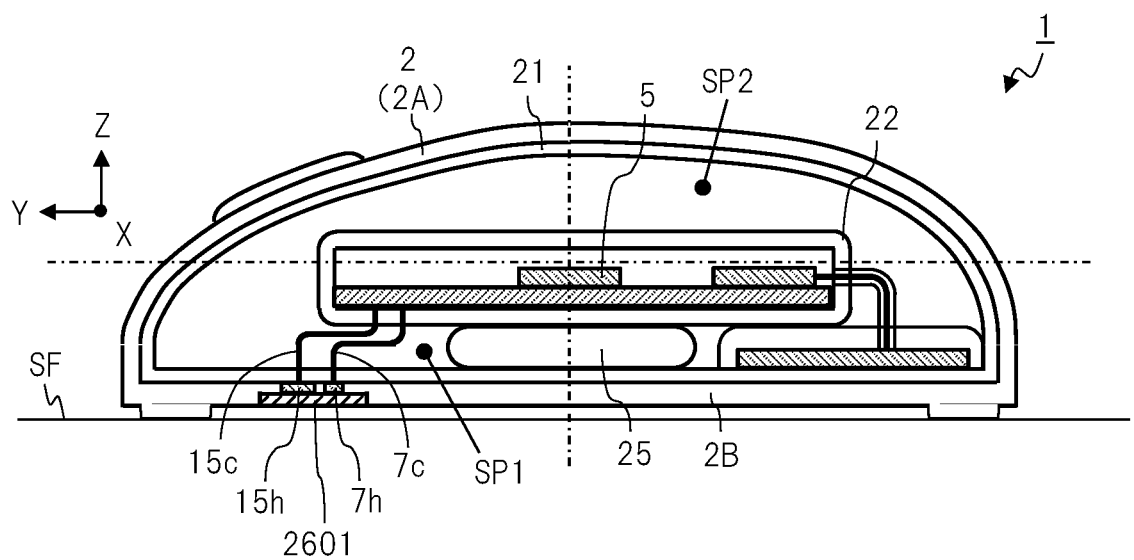
FIG. 23B is a diagram showing a configuration of a mouse according to a modification of the seventh embodiment of the present invention.

Further, when the third thermal insulation layer 23 and the fifth thermal insulation layer 25 are arranged under the substrate 10 as in this example, they can serve to have an important function to support and/or fix the substrate 10.
[7-2: Modification]
FIG. 23B shows a modification of the seventh embodiment. In this modification, the image sensor 15*h*, the light source unit 7*h*, and a cover 2601 below them are provided in the housing bottom portion 2B. The wiring 15*c* and the wiring 7*c* extend upward, are covered with the fifth thermal insulation layer 25, and are connected to the lower surface of the substrate 10 in the second thermal insulation layer 22. In this modification, in order to prevent the image sensor 15*h* and the light source unit 7*h* from lacking the thermal insulation property, the heat resistance property, the waterproofing property, the water resistance property, the pressure resistance property, the stain resistance property, the easy cleanability, etc. with respect to the heat and water during the sterilization treatment as compared with the configuration of FIG. 23A, the cover 2601 for reinforcing such potentially lacking properties is provided under the image sensor 15*h* and the light source unit 7*h*. The cover 2601 also has the light transparent property, and the illumination light and the image light can pass through it. The sealing material and the thermal insulation material may be provided in the vicinity of the cover 2601. Also, the cover 2601 is provided so as to have the area capable of covering at least the lower surfaces of the image sensor 15*h* and the light source unit 7*h* and so as to be smooth with respect to the lower surface of the housing bottom portion 2B. Namely, the cover 2601 has, for example, the light transparent property, the thermal insulation property, the heat resistance property, the waterproofing property, the water resistance property, the pressure resistance property, the stain resistance property, the easy cleanability, etc. The cover 2601 is not limited to this and may be provided so as to entirely cover the housing bottom portion 2B. The number of the covers 2601 is not limited to one, and may be composed of plural layers including a cover having the thermal insulation property and a cover having the water resistance property. As described above, in this modification, the required heat resistance property, water resistance property, etc. can be secured by the combination of the arrangement position of the image sensor 15*h* and others provided near the left end of the housing bottom portion 2B in FIG. 23 and the provision of the cover 2601.

Further, when the third thermal insulation layer 23 and the fifth thermal insulation layer 25 are arranged under the substrate 10 as in this example, they can serve to have an important function to support and/or fix the substrate 10.

Eighth Embodiment

A mouse according to the eighth embodiment of the present invention will be described with reference to FIG.

24. The mouse according to the eighth embodiment shows a configuration example in which the substrate 10 described above is formed to have a box shape or the like.

[8-1: Substrate with Box Shape]

Figure 24A:
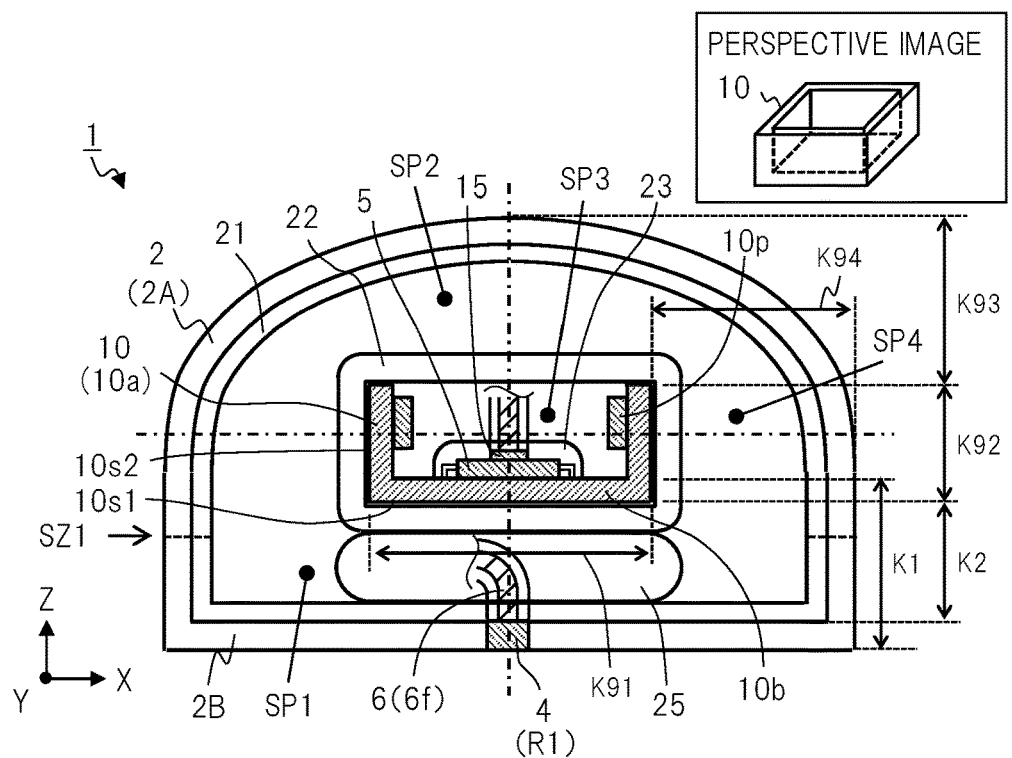
FIG. 24A is a diagram showing a configuration of a mouse according to the eighth embodiment of the present invention.

FIG. 24A shows a transverse cross-sectional view of the mouse 1 according to the eighth embodiment. Though not shown, in the internal space of the housing 2 and the first thermal insulation layer 21, the transmission unit 6 is connected to the lens 4 of the housing bottom portion 2B and the image sensor 15 of the electronic circuit component 5 on the substrate 10. Each of the layouts described above can be applied to the wiring of the transmission unit 6. The housing bottom portion 2B and the substrate 10 are arranged so as to be separated by the distance K2 with the fifth thermal insulation layer 25 and the second thermal insulation layer 22 interposed therebetween. This substrate 10 substantially has a box shape, and includes a bottom surface portion 10b arranged on the horizontal plane and four side surface portions 10a standing in the Z direction (side surface portions on the Y-Z plane are shown in FIG. 24). An upper surface portion (in other words, a lid portion) of the box-shaped substrate 10 is not provided. Components such as the electronic circuit component 5 and others are mounted on the bottom surface portion 10b of the substrate 10. For example, the electronic circuit component 5 is arranged at the position near the center of the housing 2 and is covered with the third thermal insulation layer 23. Further, another component 10p may be mounted on an inner surface of the side surface portion 10a of the substrate 10.

In this example, the box shape of the substrate 10 is defined as a rectangular parallelepiped shape having four side surface portions 10a or a shape forming a quadrangle when viewed in a cross-section on the horizontal plane, but the box shape is not limited to this and may be a polyhedral shape or a shape forming a polygon when viewed in a cross-section on the horizontal plane. Further, the box-shaped structure of the substrate 10 needs to have the size and form capable of reducing the surface area of the box shape as much as possible to minimize the heat intrusion and capable of increasing the distance between the box-shaped structure of the substrate 10 and the inner surface of the housing 2 as much as possible to achieve the reduction in the heat conduction and the increase in the amount of thermal insulation material interposed in the space in the housing 2, in particular, the first space portion SP1 in which the fifth insulation layer 25 is provided. For this purpose, it is preferable that the size of the box shape of the substrate 10 is as small as possible compared to the three-dimensional form composed by the inner surface of the housing 2, and also the form of the box shape of the substrate 10 is spherical, ellipsoidal (spheroidal), spherical or ellipsoidal with a partial plane, or polyhedral similar to those. Specifically, the shortest distance between the inner surface of the housing 2 and the outer surface of the box shape or the like of the substrate 10 is 3 to 20 mm, preferably 13 to 20 mm.

For example, the bottom surface portion 10b has a predetermined distance K91 in the X direction. For example, the side surface portion 10a has a predetermined height (distance K92) in the Z direction. There is a distance K93 from the upper end of the side surface portion 10a to the upper surface of the housing upper portion 2A. The third space portion SP3 is formed in the box-shaped substrate 10. The fourth space portion SP4 is formed outside the side surface 10a, more specifically, between the side surface 10a and the housing 2. For example, the fourth space portion SP4 has a distance K94 from the side surface portion 10a to the outer surface of the housing 2 in the X direction. As described above, the box-shaped substrate 10 is concentrated and compactly arranged near the center of the internal space of the housing 2. Consequently, in this configuration, the heat conduction is less likely to occur in each direction from the outer surface of the housing 2 to components such as the electronic circuit component 5. In particular, in this configuration, since the distance K94 of the fourth space portion SP4 and the like are secured and the side surface portion 10a is interposed in the horizontal direction, the heat conduction is less likely to occur in the horizontal direction. By reducing the surface area of the substrate 10 (the surface area of the outer surface of the box shape), the amount of heat conduction is reduced, so that the heat insulation relating to the protection of the electronic circuit component 5 and the like is enhanced.

In the configuration example of FIG. 24A, the substrate 10 is surrounded by the second thermal insulation layer 22. As a modification, the second thermal insulation layer 22 may be omitted. Alternatively, thermal insulation coating may be applied to the outer surface of the box-shaped substrate 10, for example, an outer surface 10s1 of the bottom surface portion 10b and an outer surface 10s2 of the side surface portion 10a. It is also possible to close the third space portion SP3 by providing an upper surface portion of the box shape. As described above, in the eighth embodiment, by forming the box-shaped substrate 10, the volume ratio of the substrate 10 to the entire internal space of the mouse is reduced, the thermal insulation property of the substrate 10 itself is improved, and the heat conduction to components such as the electronic circuit component 5 is suppressed, so that the overall thermal insulation effect is enhanced. Further, it is thus possible to reduce the provision of other members such as the thermal insulation layers and the like.

Figure 24B:
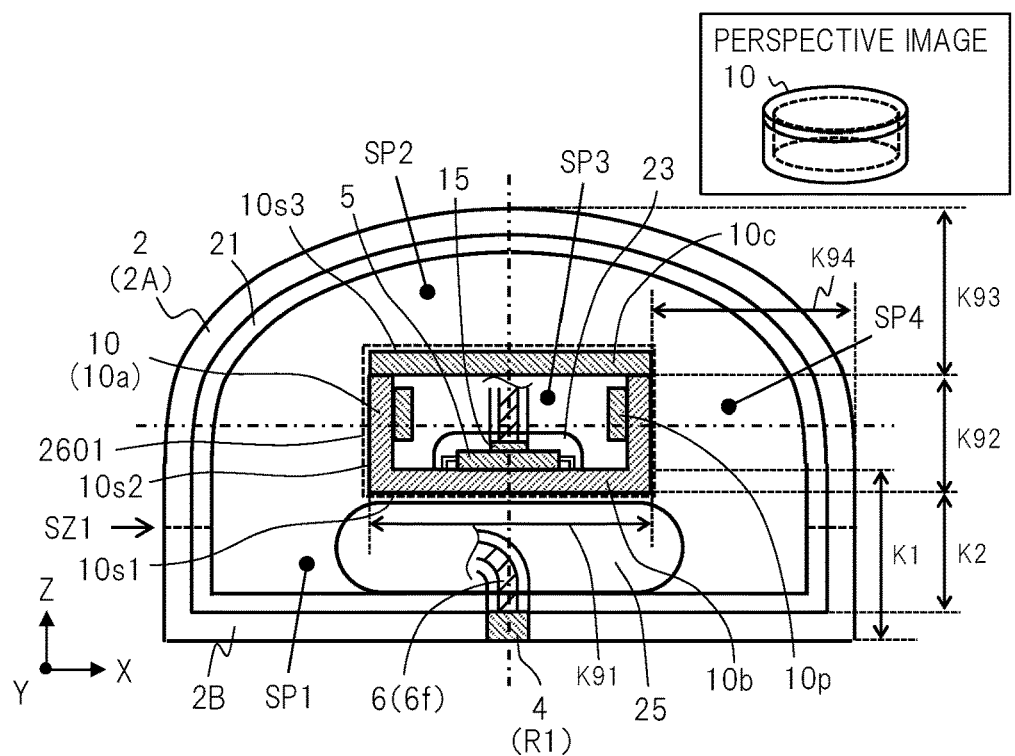
FIG. 24B is a diagram showing a configuration of a mouse according to a modification of the eighth embodiment of the present invention.

FIG. 24B shows a modification of the eighth embodiment. The substrate 10 according to this modification schematically has a cylindrical or columnar shape and includes a cylindrical upper surface portion 10c (in other words, lid portion). The third space portion SP3 is closed by the upper surface portion 10c. The side surface portion 10a of the cylindrical substrate 10 has a curved surface, and it may be formed by, for example, rolling a flexible (elastic) component such as a flexible printed circuit board into a cylindrical shape. Components may be mounted on the inner surface side of the upper surface portion 10c as well. The upper surface portion 10c of the cylindrical shape may be omitted. The box-shaped or cylindrical substrate 10 may be configured by connecting a plurality of substrates.

In this modification, this cylindrical closed substrate 10 makes it possible to suppress the heat conduction to the electronic circuit component 5 and others in the third space portion SP3 from outside. Accordingly, in this modification, the second thermal insulation layer 22 is not provided. The thermal insulation coating may be applied to the outer surface of the cylindrical substrate 10, for example, the outer surface 10s1 of the bottom surface portion 10b, the outer surface 10s2 of the side surface portion 10a, and an outer surface 10s3 of the upper surface portion 10c. In this example, the case where the thermal insulation coating 2601 indicated by the broken line is provided on all the outer surfaces of the substrate 10 is shown. The thickness of the thermal insulation coating 2601 is smaller than the thickness of the second thermal insulation layer 22 of FIG. 24A. Further, in this example, the substrate 10 and the like are positioned by the fifth thermal insulation layer 25 provided in the first space portion SP1. Namely, when the fifth thermal insulation layer 25 is arranged under the substrate 10 as in this example, it can serve to have an important function to support and/or fix the substrate 10. The configuration is not limited to this, and the substrate 10 and the like may be positioned by arranging the thermal insulation material, the heat absorbing material, or the filler in the second space portion SP2 and the fourth space portion SP4.

Ninth Embodiment

Figure 26:
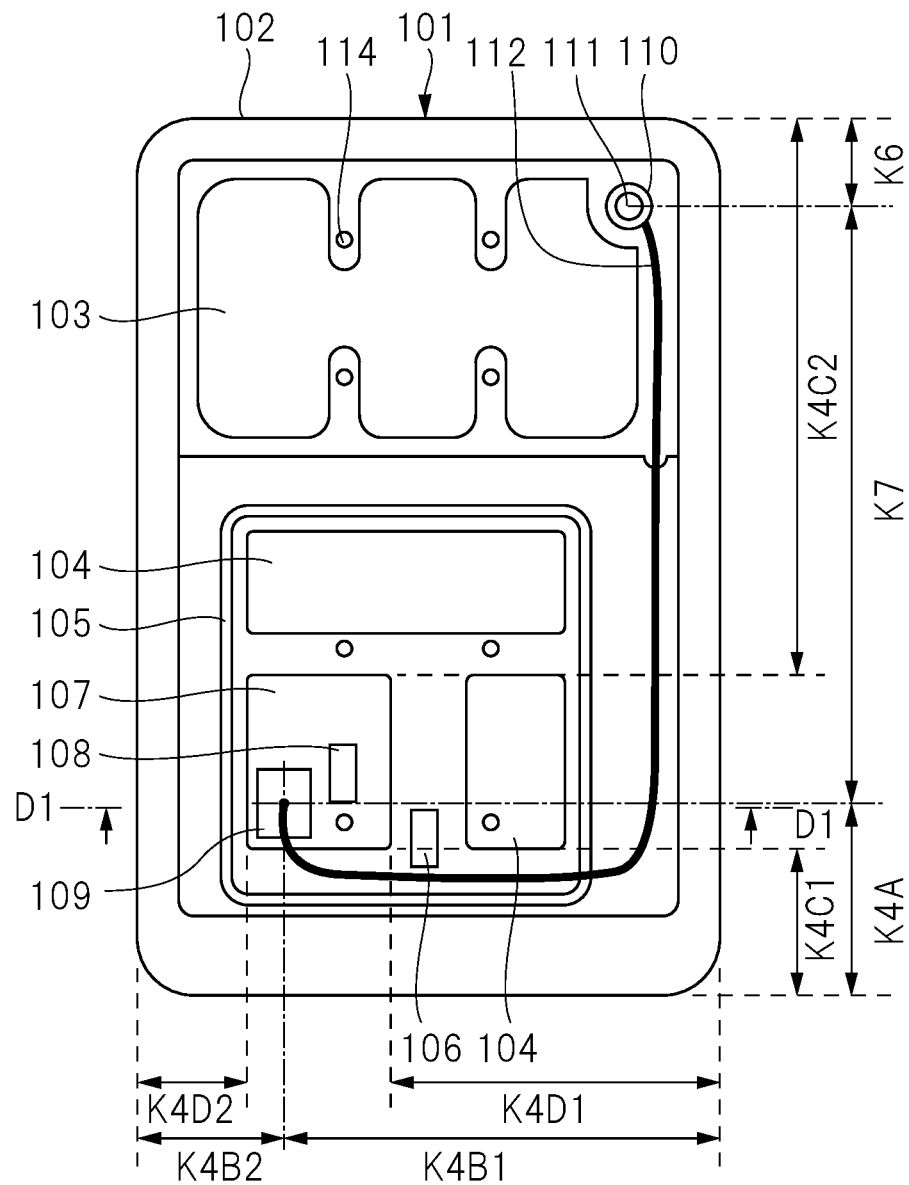
FIG. 26 is a schematic cross-sectional view in a planar direction, showing a tablet terminal or a PC according to an embodiment as another example of the electronic equipment of the present invention.
Figure 27:
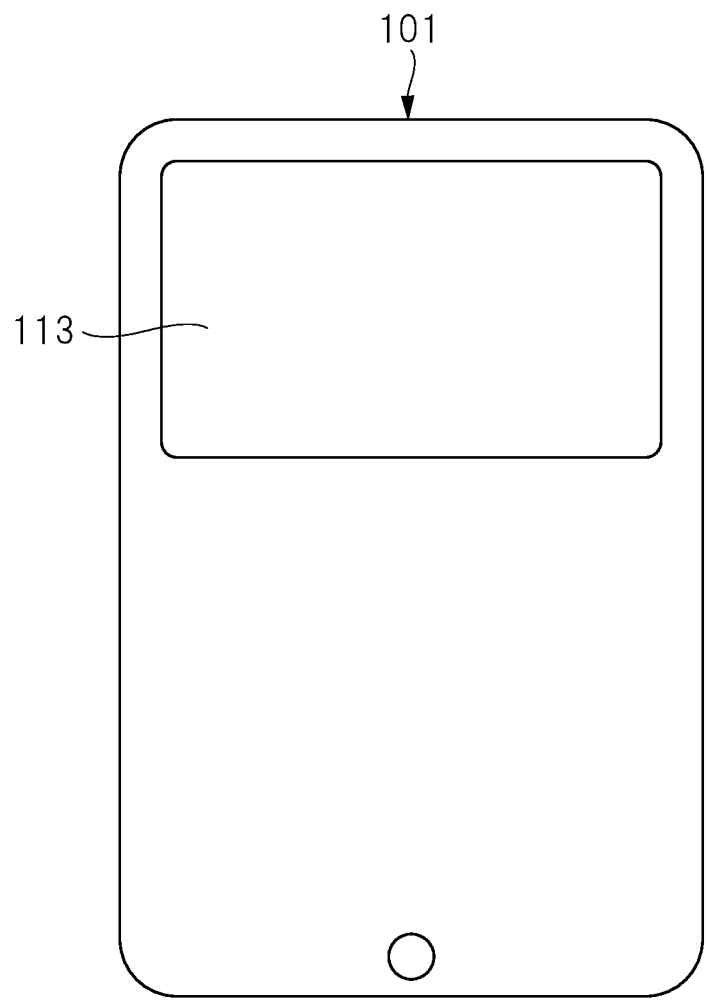
FIG. 27 is a plan view of the tablet terminal in FIG. 26.
Figure 28:
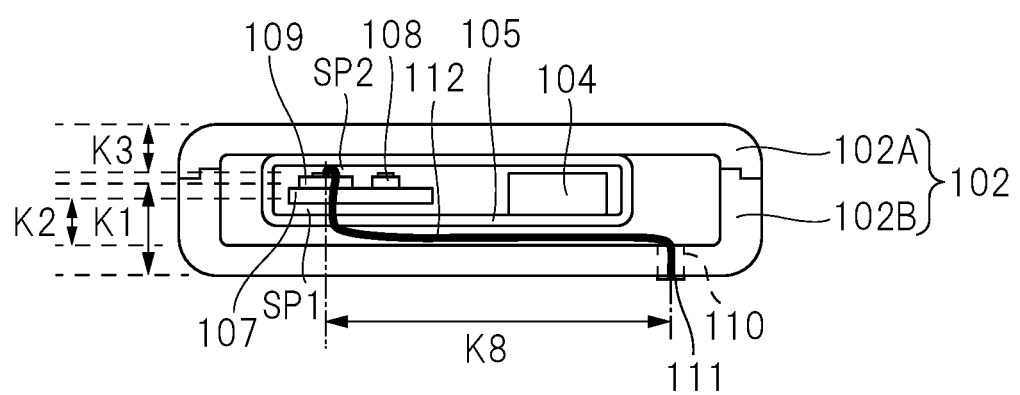
FIG. 28 is a schematic cross-sectional view taken along a line D1-D1 in FIG. 26 and seen along the arrows.

FIG. 26 is a schematic cross-sectional view in a planar direction, showing a tablet terminal or a PC according to the ninth embodiment as another example of the electronic equipment of the present invention. FIG. 27 is a plan view of the tablet terminal in FIG. 26, and FIG. 28 is a schematic cross-sectional view taken along a line D1-D1 in FIG. 26.

This example is a tablet terminal represented by a terminal called iPad (product name: registered trademark).

Note that the tablet terminal of this example may be replaced with a mobile terminal as the electronic equipment of the present invention. In this case, since the structure of the mobile terminal, the arrangement of the optical element or the imaging element and the electronic circuit component, and the like are similar to those of the case of the tablet terminal and are substantially the same, the illustration and detailed description thereof are omitted.

In this embodiment, a tablet terminal 101 includes a housing 102 composed of a housing upper portion 102A and a housing bottom portion 102B and various electronic elements arranged in the internal space of the housing 102, for example, a charging coil 103, two secondary batteries 104, an electromagnetic sensor 106 for receiving identification information of a subject or the like, a substrate 107, an IC chip 108 as an electronic circuit component arranged on the substrate 107, and an image capture 109 as an electronic circuit component similarly mounted on the substrate 107.

In this embodiment, the two secondary batteries 104, the electromagnetic sensor 106, the substrate 107, the IC chip 108, and the image capture 109 as electronic elements are surrounded by the thermal insulation material 105, and the thermal insulation material 105 is configured so as to enhance the thermal insulation effect of these electronic elements. Note that the thermal insulation material 105 and similar thermal insulation materials not only surround the electronic elements but also are provided as a stacked structure inside or outside the housing 102. Alternatively, it is also possible to form the housing 102 so as to have plural layers and to provide the thermal insulation material 105 as an intermediate layer thereof. Further, it can be used in combination with the thermal insulation structure similar to or relating to those of the embodiments described with reference to FIG. 1 to FIG. 25.

Also, on the back surface side of the tablet terminal 101, that is, at one corner portion (upper right in FIG. 26) of the housing bottom portion 102A in this embodiment, an opening 110 is formed, and a photography camera lens 111 as an optical element or an imaging element is fit into this opening 110.

This camera lens 111 is optically connected to the image capture 109 by a transmission unit 112. The transmission unit 112 can be composed of an optical fiber such as a glass fiber.

On the front surface side of the tablet terminal 101, that is, the planar surface side thereof, a monitor screen 113 (FIG. 27) is provided. This monitor screen 113 has a small area, for example, half of the planar area of the housing 102 or smaller, unlike the case of the electronic equipment such as a normal tablet terminal or mobile terminal. The reason is as follows. That is, in order to ensure the thermal insulation structure against high temperature during the sterilization in the autoclave equipment, the part where the monitor screen is present is reduced in the volume or thickness inside the housing. If the monitor screen is enlarged, the thickness will also increase and it will be hard to use. Therefore, by making the monitor screen 113 smaller, a strong thermal insulation structure is established in a thick portion where the monitor screen 113 is not present, with the intention to protect electronic components and the like from heat by housing them in that portion. However, with the improvement in thermal insulation technology and heat resistance property of electronic equipment, it is expected that the tablet terminal 101 becomes thinner and the monitor screen 113 becomes larger such that they become easier to use. Therefore, the thickness of the tablet terminal 101, the size of the monitor screen 113, and the like are shown by way of examples, and are not limited to these examples.

Also, the reference sign 114 in FIG. 26 indicates a screw for a support column in the housing 102, and a plurality of the screws 114 are arranged in the housing 102.

Like the mouse 1 according to the embodiments described above, the tablet terminal 101 according to this embodiment is also a tablet terminal as the special electronic equipment capable of withstanding severe treatment conditions of the sterilization treatment by the high temperature and high pressure steam in the medical autoclave equipment and suitable for use in medical settings and others, totally different from the general electronic equipment for input and operation in the computer for office work.

Therefore, in the tablet terminal 101, in order to prevent the influence by the heat, high pressure, and others due to the high temperature and high pressure steam during the autoclave treatment to the maximum, the substrate 107 on which the IC chip 108 and the image capture 109 are mounted, in particular, the IC chip 108 and the image capture 109 as electronic circuit components are arranged so as to be separated as far as possible by the first space portion SP1 from the opening 110 and the photography camera lens 111 upward in the Z direction, so that it is possible to prevent the influence by the heat, high pressure, and others due to the high temperature and high pressure steam during the autoclave treatment to the maximum.

Namely, as shown in FIG. 28, the distance K1 which is the distance between the lower surface of the housing bottom portion 102B and the lower surfaces of the IC chip 108 and the image capture 109 which are the electronic circuit components in the Z direction corresponding to the vertical direction in FIG. 28 and the distance K2 between the upper surface of the housing bottom portion 102B and the lower surface of the substrate 107 in the Z direction are increased to the maximum with respect to the distance K3 between the upper surfaces of the IC chip 108 and the image capture 109 and the outer surface of the housing upper portion 102A in the Z direction in relation to the second space portion SP2 above the IC chip 108 and the image capture 109.

Note that the IC chip 108 and the image sensor 109 as electronic circuit components are arranged so as to be separated from the housing upper portion 102A of the housing 102 by the second space portion SP2 downward in the Z direction, and it is thus possible to prevent the influence by the heat, high pressure, and others due to the high temperature and high pressure steam during the autoclave treatment.

Further, also in the tablet terminal 101 according to this embodiment, the substrate 107 and the IC chip 108 and the image capture 109 as electronic circuit components are arranged so as to be separated as far as possible by a distance K8 (FIG. 28) in the X direction (left-right direction or transverse direction in FIG. 26 and FIG. 28) from the opening 110 and the photography camera lens 111 as an optical element or an imaging element. In other words, as to distances K4B1 and K4B2 from the outer surfaces on both of left and right sides of the housing 102 of the tablet terminal 101 to the image capture 109, the distance K4B1 on the side closer to the camera lens 111 is increased to the maximum as compared with the distance K4B2 on the opposite side.

Further, also in the tablet terminal 101 according to this embodiment, the substrate 107 and the IC chip 108 and the image capture 109 as electronic circuit components are arranged so as to be separated as far as possible by the distance K7 (FIG. 26) in the Y direction (vertical direction or longitudinal direction in FIG. 26) orthogonal to the X direction from the opening 110 and the photography camera lens 111 as an optical element or an imaging element. Namely, in the longitudinal direction of the tablet terminal 101, as shown in FIG. 26, as compared with a distance K4A from the end surface of the housing 102 on the near side in the longitudinal direction to the image capture 109, a distance K7+K6 obtained by adding the distance K7 from the image capture 109 to the camera lens 111 and the distance K6 from the camera lens 111 to the end surface of the housing 102 on the opposite side in the longitudinal direction is increased to the maximum (K7+K6>K4A).

Therefore, when viewed in the three directions of the Z direction, the X direction, and the Y direction described above, the substrate 107 and the IC chip 108 and the image capture 109 as electronic circuit components are arranged so as to be separated as far as possible by the first space portion SP1 upward in the Z direction from the opening 110 and the photography camera lens 111 as an optical element or an imaging element, separated as far as possible by the distance K8 (FIG. 28) in the X direction, and separated as far as possible by the distance K7 (FIG. 26) in the Y direction.

Namely, in the tablet terminal 101 according to this embodiment, the substrate 107 on which the IC chip 108 and the image capture 109 are mounted, in particular, the IC chip 108 and the image capture 109 as electronic circuit components are arranged so as to be separated as far as possible from the opening 110 and the photography camera lens 111 upward in the Z direction, the X direction, and the Y direction, respectively. Accordingly, they are three-dimensionally separated as far as possible, so that the influence by the heat, high pressure, and others due to the high temperature and high pressure steam during the autoclave treatment can be prevented to the maximum.

In other words, the tablet terminal 101 according to the ninth embodiment is the medical tablet terminal to which the autoclave sterilization can be applied, and with which the hygienic environment in the medical settings such as a hospital can be improved. For example, when a medical equipment system to which a tablet terminal is connected is desired to be used for examination or surgery, infection prevention can be ensured by using the sterilized tablet terminal, and advanced medical treatment can be realized by using the function of the system such as navigation surgery. For example, by operating the tablet terminal by the surgeon himself/herself, the picture of the three-dimensional image can be acquired more reliably, and the quality of surgery and the like can be improved. Not only does this tablet terminal have the function of the optical table terminal, but the sterilization treatment such as autoclave treatment can be applied to the tablet terminal together with medical instruments in the usage environment such as medical settings, thereby bringing the effects of the infection prevention and the improvement in medical efficiency.

Tenth Embodiment

Figure 29:
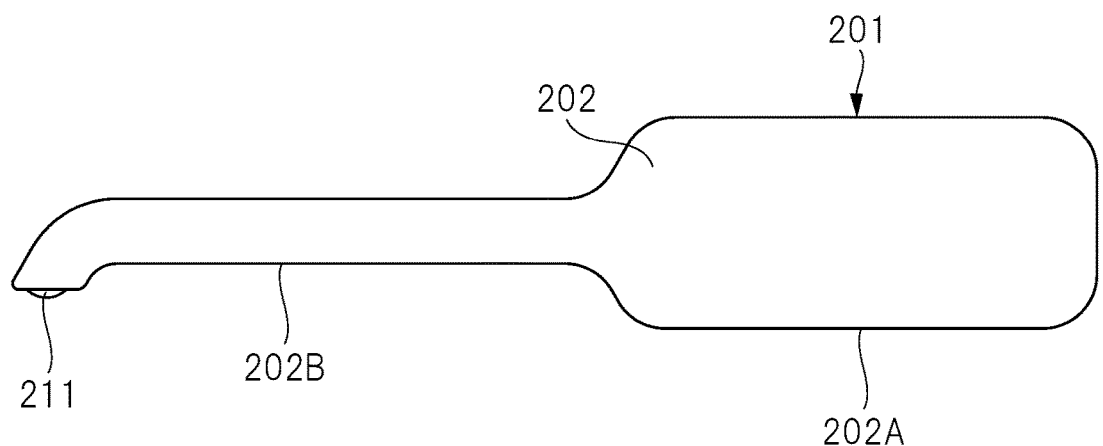
FIG. 29 is a schematic cross-sectional view in a planar direction, showing an intraoral camera according to an embodiment as another example of the electronic equipment of the present invention.
Figure 30:
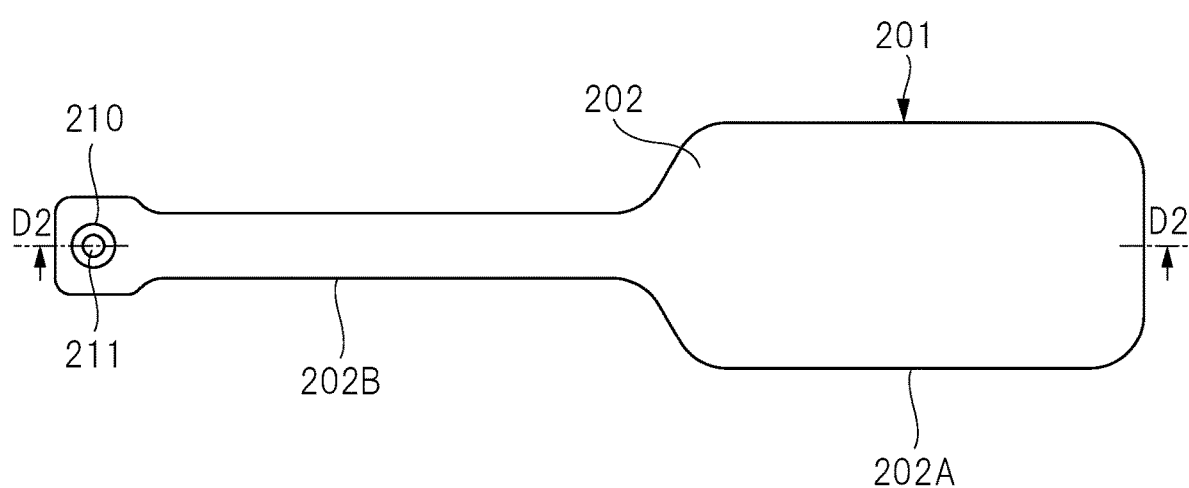
FIG. 30 is a bottom view of the intraoral camera in FIG. 29.
Figure 31:
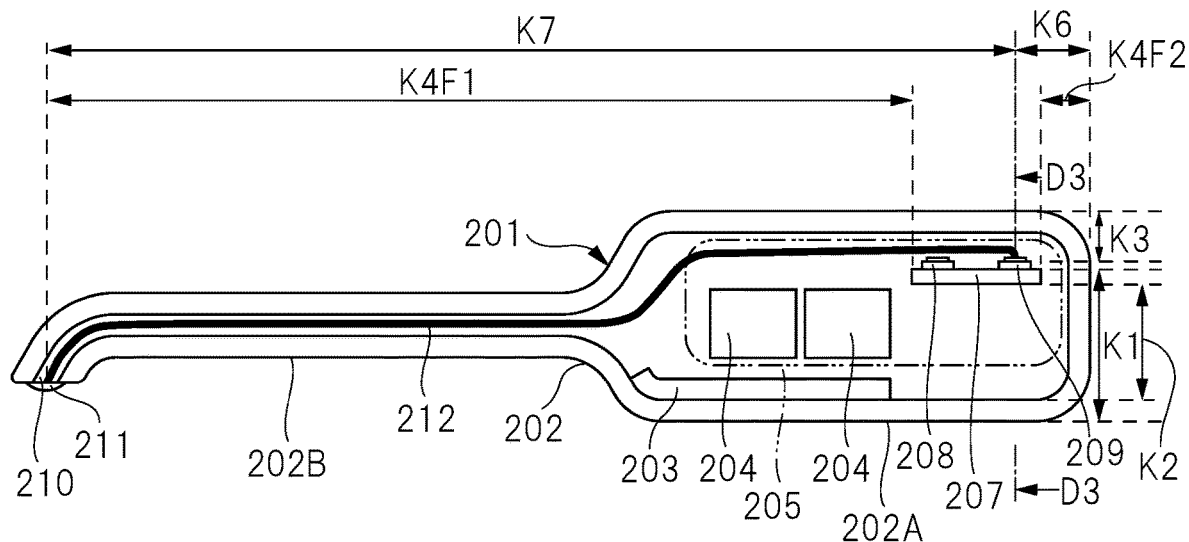
FIG. 31 is a cross-sectional view taken along a line D2-D2 in FIG. 30 and seen along the arrows.
Figure 32:
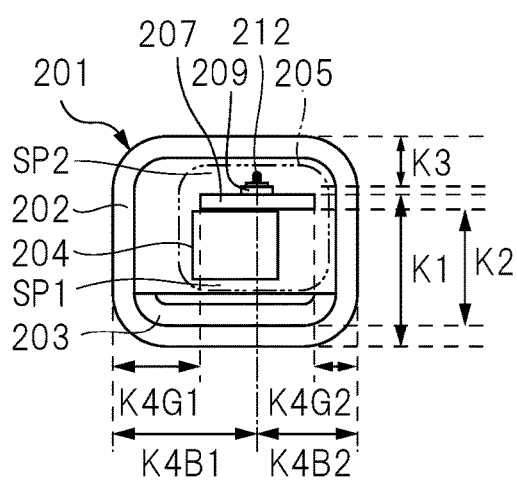
FIG. 32 is a cross-sectional view taken along a line D3-D3 in FIG. 31 and seen along the arrows.

FIG. 29 is a schematic cross-sectional view in a planar direction, showing an intraoral camera according to the tenth embodiment as still another example of the electronic equipment of the present invention. FIG. 30 is a bottom view of the intraoral camera in FIG. 29. FIG. 31 is a cross-sectional view taken along a line D2-D2 in FIG. 30. FIG. 32 is a cross-sectional view taken along a line D3-D3 in FIG. 31 and seen along the arrows.

In this example, the present invention is applied to the so-called intraoral camera as another example of the medical electronic equipment.

In this embodiment, an intraoral camera 201 includes a housing 202 composed of a main body portion 202A and an extension portion 202B extending from the main body portion 202A and various electronic elements arranged in the housing 202, for example, a charging coil 203, two secondary batteries 204, a thermal insulation material 205, an electromagnetic sensor 206, a substrate 207, an IC chip 208 as an electronic circuit component arranged on the substrate 207, and an image capture 209 as an electronic circuit component similarly mounted on the substrate 207.

Also in this embodiment, the two secondary batteries 204, the electromagnetic sensor 206, the substrate 207, the IC chip 208, and the image capture 209 as electronic elements are surrounded by the thermal insulation material 205 schematically shown by a two-dot chain line, and the thermal insulation material 205 is configured so as to enhance the thermal insulation effect of these electronic elements. Note that the thermal insulation material 205 and similar thermal insulation materials not only surround the electronic elements but also are provided as a stacked structure inside or outside the housing 202. Alternatively, it is also possible to form the housing 202 so as to have plural layers and to provide the thermal insulation material 205 as an intermediate layer thereof. Further, it can be used in combination with the thermal insulation structure similar to or relating to those of the embodiments described with reference to FIG. 1 to FIG. 25 or the embodiment described with reference to FIG. 26 to FIG. 28.

Also, on the back surface side of the tip end of the extension portion 202B of the intraoral camera 201, an opening 210 is formed, and a photography camera lens 211 as an optical element or an imaging element is fit into this opening 210.

This camera lens 211 is optically connected to the image capture 209 by a transmission unit 212 inserted through the inside of the extension portion 202B. The transmission unit 212 can be composed of an optical fiber such as a glass fiber.

Like the mouse 1 and the tablet terminal 101 according to the embodiments described above, the intraoral camera 201 according to this embodiment is also an intraoral camera as the special electronic equipment capable of withstanding severe treatment conditions of the sterilization treatment by the high temperature and high pressure steam in the medical autoclave equipment and suitable for use in medical settings and others, totally different from the general electronic equipment for input and operation in the computer for office work.

Therefore, in the intraoral camera 201, the substrate 207 on which the IC chip 208 and the image capture 209 are mounted, in particular, the IC chip 208 and the image capture 209 as electronic circuit components are arranged so as to be separated as far as possible from the opening 210 and the photography camera lens 211 at the tip end of the extension portion 202B in the Y direction (longitudinal direction of the intraoral camera 201). Consequently, in the intraoral camera 201 according to this embodiment, it is possible to prevent the influence by the heat, high pressure, and others due to the high temperature and high pressure steam during the autoclave treatment to the maximum.

Further, also in the intraoral camera 201 according to this embodiment, the IC chip 208 and the image capture 209 are arranged so as to be separated as far as possible from the outer surface (bottom surface) of the lower portion of the housing 202 by the first space portion SP1 upward in the Z direction, and it is thus possible to prevent the influence by the heat, high pressure, and others due to the high temperature and high pressure steam during the autoclave treatment to the maximum. Namely, the distance K1 from the outer surface (bottom surface) of the lower portion of the housing 202 to the lower surface of the substrate 207 is increased to the maximum with respect to the distance K3 from the outer surface (upper surface) of the upper portion of the housing 202 to the upper surface of the substrate 207.

Note that the IC chip 208 and the image capture 209 as electronic circuit components are arranged so as to be separated from the outer surface of the upper portion of the housing 202 by the second space portion SP2 downward in the Z direction, so that it is possible to prevent the influence by the heat, high pressure, and others due to the high temperature and high pressure steam during the autoclave treatment.

Further, also in the intraoral camera 201 according to this embodiment, the substrate 207 and the IC chip 208 and the image capture 209 as electronic circuit components are arranged so as to be separated as far as possible from the opening 210 and the photography camera lens 211 as an optical element or an imaging element in the X direction (left-right direction or transverse direction in FIG. 32).

For example, as shown in FIG. 32, the image capture 209 is separated from the outer left side surface of the housing 202 by the distance K4B1 in the X direction and from the outer right side surface of the housing 202 by the distance K4B2, the distance K4B1 is larger than the distance K4B2 (K4B1>K4B2), the distance K4B1 becomes larger as compared with the case where the image capture 209 is located at the center of the housing 202 in the X direction, and the image capture 209 is separated as far as possible from the camera lens 211 also in the X direction.

Further, also in the substrate 207, as shown in FIG. 32, a distance K4G1 between the left end of the substrate 207 and the outer left side surface of the housing 202 is larger than a distance K4G2 between the right end of the substrate 207 and the outer right side surface of the housing 202 (K4G1>K4G2).

Accordingly, also in this embodiment, when viewed in the three directions of the Z direction, the X direction, and the Y direction described above, the substrate 207 and the IC chip 208 and the image capture 209 as electronic circuit components are arranged so as to be separated as far as possible from the opening 210 and the photography camera lens 211 as an optical element or an imaging element in all of the X direction, the Y direction, and the Z direction.

Namely, in the intraoral camera 201 according to this embodiment, the substrate 207 on which the IC chip 208 and the image capture 209 are mounted, in particular, the IC chip 208 and the image capture 209 as electronic circuit components are arranged so as to be separated as far as possible from the opening 210 and the photography camera lens 211 upward in the Z direction, the X direction, and the Y direction, respectively. Accordingly, they are three-dimensionally separated as far as possible, so that the influence by the heat, high pressure, and others due to the high temperature and high pressure steam during the autoclave treatment can be prevented to the maximum.

In other words, the intraoral camera 201 according to the tenth embodiment also can withstand the use for the autoclave sterilization treatment and the like, and it is thus possible to bring the effects of the infection prevention and the improvement in medical efficiency because the sterilized intraoral camera can be used in the medical settings.

In particular, in the case of the intraoral camera 201 according to this embodiment, in addition to the above-described separation structure between the opening 210 and the camera lens 211 and the electronic circuit components such as the image capture 209, the distance from the opening 210 and the photography camera lens 211 as an optical element or an imaging element to the substrate 207 and the IC chip 208 and the image capture 209 as electronic circuit components is very long owing to the presence of the extension portion 202B, so that it is possible to more effectively prevent the high heat, high pressure, and the like from being transmitted from the opening 210 and the camera lens 211 to the substrate 207 and the IC chip 208 and the image capture 209 as electronic circuit components even in the sterilization treatment in the autoclave equipment.

In the foregoing, the present invention has been specifically described based on the embodiments, but the present invention is not limited to the embodiments described above and can be changed within the range not departing from the gist thereof.

Also, the contents disclosed in each of the embodiment shown in FIG. 1 to FIG. 25, the embodiment shown in FIG. 26 to FIG. 28, and the embodiment shown in FIG. 29 to FIG. 32 can be combined and used commonly in terms of, for example, the thermal insulation structure and the optical lens structure, and these are also included in the range of the present invention.

The present invention can be widely applied to the electronic equipments other than the mouse, the tablet terminal, and the intraoral camera.

For example, the present invention can be applied to the following electronic equipments.

That is, medical equipments to which the autoclave sterilization has not been applicable until now because of the presence of the electronic component therein but is desired to be applicable (in the field of healthcare for all living things such as human, animals, and microorganisms).

First, it is assumed that the parts that are frequently contaminated only are detached and sterilized when the equipment is so large in size that cannot be stored in the autoclave sterilizer. For example, this can be easily applied to the operation panel. Alternatively, the case in which other parts are improved to be downsized by disassembly such that they can be sterilized in the autoclave equipment is also included in this category. This is because, when these equipments are contaminated with pathogens of serious infectious diseases, it may be necessary to prevent the spread of infection by using strong chemicals, gas disinfection, incineration, etc., except for the parts that can be sterilized by the autoclave equipment or the like. In addition, the medical treatment is not limited to that for humans, but includes that for animals and microorganisms and indicates general healthcare and studies for all living things such as veterinary medicine, biotechnology, gene therapy, genetic engineering, pharmacology, pharmaceuticals, pharmacy, and researches for other infections.

1. Operation panel of large-scale medical equipment (surgery robot, CT, MRI, PET, SPECT, scintigraphy, gamma camera, angiography, mammography, X-ray equipment, ultrasonography equipment, 3D simulation medical equipment such as enterocyte velocity system, radiation irradiation equipment such as γ-ray irradiation equipment, physiotherapy equipment, physiotherapeutic medical equipment, rehabilitation medical equipment, bathing medical equipment, beds, surgical tables, equipment relating to pharmaceutical and drug packaging and dispensing, etc.).

Large-scale equipments will be listed in each field described later, but the same applies to this case.

2. Medical testing equipment (general living things)

(2-A) Testing equipments for living things

Medical equipments for testing biological physiology, biochemistry, morphology, function, exercise, load, tolerance, response to stimuli and loads, etc. (for example, testing equipment for immunobiochemistry, urine, blood drugs, plasma protein, blood coagulation, blood gas, etc., bone density measuring device, blood oxygen concentration meter, brain wave testing equipment, power tester, electrocardiographic testing equipment, implantable electrocardiogram recorder, myoelectric meter, cardiopulmonary function testing equipment, pulse wave testing equipment, respiratory metabolism measuring device, respiratory function test device, breath gas measuring device, thermometer, blood pressure monitor, endoscope, capsule endoscope, various cameras, microscope, biological information monitor, health examination machine, muscular strength meter, fundus test device, artery curing test equipment, DPN test equipment, sleep polygraphy, auditory test equipment, optometer, dental intraoral scanner, affected area observation mirror, etc.).

(2-B) Medical equipments for examining specimens, environment, gases, poisons, etc., and storing the specimens and information.

Equipments for testing not only humans and living things but all specimens relating to health, illness, infection, and others in medical institutions, working environment, living environment, etc. chemically, physically, physiologically, pathologically, clinically, and life environmentally (for example, various chromatography, spectrometric equipment, mass meter, volume meter, illuminance meter, radiometer, non-destructive tester, general blood test equipment for blood cell count, CRP, immunoluminescence, blood glucose level and others, dissymmetry analyzer, clinical Chemical analyzer, blood coagulation analyzer, histopathological examination equipment, urine examination equipment, bacterial examination equipment, bacterial incubator, centrifuge, thermo-hygrometer, detectors for various gas such as aldehyde gas, mouth odor inspection machine, alcohol checker, dentistry Technical scanners, metal detectors, etc.).

3. Medical equipments for diagnosis and recording

Medical equipments for supporting the medical and research decisions by integrating medical information from tests and inspections.

4. Equipments for treatment, nursing care, and disability assistance of living things including humans (animals, microorganisms, etc.).

(4-A) Surgical equipments (for example, navigation system for various surgical operations, various ablation treatment equipments, catheter surgery related equipments such as intravascular ablation and stent graft insertion device, pacemaker, ICM, ICD, CRT-D/CRT-P, VAD, and TRVR/ TRVI, electric scalpel (high frequency surgical equipment), electric stapler, bipolar RFA system, ultrasonic coagulation and incision device, vessel sealing device, microsurgery device, intraoperative 3D image monitoring system, dental implant implantation guidance system, endoscope, drill, anesthesia equipment, root tube treatment related equipment, ion introduction equipment, photopolymerization lighting, etc.).

(4-B) Physiotherapy equipments (for example, deep brain stimulation (DBS) equipment, spinal cord stimulation (SCS) equipment, ultrasonic therapy device, laser irradiation therapy device, electromagnetic wave therapy device, infrared therapy device, acupuncture and moxibustion therapy device, ultrasonic fracture therapy device, potential therapy device etc.).

(4-C) Physiotherapeutic equipments and exercise practice equipments (for example, particle beam accelerator, inhaler, respiratory trainer, massage machine, compression therapy device, rehabilitation therapy device, tread mill, ergometer, ultrasonic scaler, etc.).

(4-D) Medical equipments for rest and fixation (for example, biometric information monitor, incubator, rollover sensor, bed leaving sensor, etc.).

(4-E) Medical equipments that substitute for or assist biological functions and morphology (for example, artificial heart and lung, artificial ventilator, oxygen inhalers, various transfusion devices, CPAP, ASV, oxygen concentrators, exercise equipment that assists muscle contraction, cochlear implants, hearing aids, sleep introducers, electric wheelchairs, dental impression-related equipment, dental technique CAD/CAM equipment, etc.).

(4-F) Medical equipments that perform sterilization, disinfection, cleansing, cleaning, storage, preservation, and experiments in biologically closed space (for example, low temperature plasma sterilization system, gas sterilization system, ozone sterilizer, autoclave equipment, aspirator, air purifier, hypo-based functional water generator, chemical and detergent discharger, medical refrigerator/heat storage/ freezer, medical equipment washer, CPWS, electric toothbrush, etc.).

(4-G) Medical equipments that monitor ecology and environmental information and transmit abnormal values or the like with alarms (for example, clinical polygraph, biological monitor, wind speed/air flow meter, ultrasonic blood flow meter, activity meter, cell culture environment analyzer, etc.).

(4-H) Medical equipments that act over or support pharmaceuticals, pharmacy, self-administered medication, test, injection, food supply, various therapies, and others (for example, pharmaceutical equipment, dispensing robot, automatic tablet packaging machine, powdered drug audit system, packaged drug audit support system, injectable drug dispensing system, electronic balance, tablet crusher, salt meter, serving system, cleaning car, hair washing car, sewage disposer, etc.).

5. Medical equipments as a method for increasing the protection level for hygiene, nosocomial infections, and exposure in medical institutions and relating institutions such as medical information management storage, medical office work and payment, reservation, mutual communication, flow line management, and environmental management (for example, environmental radiation monitor, personal computer, keyboard, monitor, register, automatic change dispenser, printer, FAX, telephone, transceiver, mobile phone, uninterruptible power device, waiting ticket dispensing and calling system, uniform disinfection machine, various security devices, barcode reader, individual identification device, compressor, vacuum device, air and water filter, water purifier, electric toothbrush, television, radio, etc.).

Examples of medical equipments and others listed above are merely specific examples and those having similar function and form are also included in this category.

6. Though partially overlapping, examples of the equipments in the research laboratory which are desired to be sterilizable include, as general experimental equipments, pure water equipment, chromatograph equipment, mass analyzer, structural analysis/element analysis equipment, organic synthesizer, concentrator, pump, microorganism testing equipment, physical property measurement equipment, component analysis equipment, environmental analysis equipment, shaking stirring, crushing and heating equipment, constant temperature bath, refrigerating and freezing storage equipment, washing sterilization and drying equipment, constant temperature and humidity equipment, culture equipment, centrifuge, absorption/emission fluorescence RI related equipment, microscope, imaging equipment, electrophoresis equipment, gene testing equipment, protein testing equipment, dispensing equipment, cell tissue testing equipment, electric pipetter, GBWS, clean ventilator, gene testing equipment, etc.

As equipments relating to the genetic research, examples include gene testing equipments such as single cell analysis/nucleic acid extraction purification equipment, PCR, and sequencer, electrophoresis equipment, blotting/imaging related equipment, structural analysis/element analysis equipment, testing equipment of physical properties, components and others, organic synthesis/concentration pump, etc.

Also, the electronic equipment according to the present invention is not always limited to the electronic equipment used in medical settings, and is similarly applicable when used in an environment in which resistance to heat, water and pressure is required other than the medical settings. In the case of an environment in which there is no or low requirement for heat resistance, the above-described thermal insulation structure and the like may be reduced, and in the case of an environment in which there is no or low requirement for water resistance, the above-described sealing structure and the like may be reduced.

The present invention can be applied not only to the mouse, the tablet terminal, and the intraoral camera but also to other electronic equipments capable of having the similar structure, for example, mobile terminals. Since the structure of the mobile terminal, the arrangement of the optical element, the imaging element, and the electronic circuit component, and others are similar to those of the tablet terminal described above, the illustrations and detailed descriptions thereof are omitted, but they are included in the range of the present invention. In an example of the embodiment of the present invention, the mouse having buttons has been described, but the present invention can be similarly applied to other input devices having elements such as a wheel, a trackball, and a joystick in the housing. In this case, measures for the heat resistance property and the water resistance property are similarly added to the elements such as the wheel. It is also possible to apply the present invention to a mouse of a type other than the optical type. In addition, the present invention can be similarly applied not only to the electronic equipment operated by hand, but also to equipment operated by feet such as a foot switch, equipment operated by voice input, and equipment operated using an acceleration sensor, a vibration sensor, an inclination sensor, and the like.

What is claimed is:

1. An electronic equipment which can be used in medical settings where a sterilization treatment by a high temperature and high pressure steam in an autoclave equipment is applied, the electronic equipment comprising:
   a housing;
   a substrate which is arranged in an internal space of the housing and on which an electronic circuit component is mounted; and
   an optical element or an imaging element through which image light from outside enters,
   wherein the optical element or the imaging element and the electronic circuit component are connected by a transmission unit capable of transmitting the image light or an electric signal corresponding to the image light so as to be separated from each other, and
   the substrate is arranged so as to be separated from a bottom portion of the housing upward in a Z direction by a distance K1 corresponding to a distance between a lower surface of the bottom portion of the housing and a lower surface of the electronic circuit component in the Z direction and/or by a distance K2 corresponding to a distance between an upper surface of the bottom portion of the housing and a lower surface of the substrate in the Z direction.

2. The electronic equipment according to claim 1, wherein the substrate is separated from an outer surface of an upper portion of the housing by a distance K3 corresponding to a distance between an upper surface of the electronic circuit component and the outer surface of the upper portion of the housing in the Z direction.

3. The electronic equipment according to claim 1, wherein the electronic circuit component is separated from a lower side surface of an upper portion of the housing by a distance K4A corresponding to a distance between a center of the electronic circuit component and the lower side surface of the upper portion of the housing in a Y direction, and
   the center of the electronic circuit component in a transverse direction is separated from the lower side surface of the upper portion of the housing by a distance K4B in a transverse direction of the housing.

4. The electronic equipment according to claim 1, wherein the substrate is separated from an outer surface of an upper portion of the housing by a distance K4C1 corresponding to a distance from one end surface of the substrate in a longitudinal direction to the outer surface of the upper portion of the housing on one side in the Y direction and by a distance K4C2 corresponding to a distance from the other end surface of the substrate in the longitudinal direction to the outer surface of the upper portion of the housing on the other side in the Y direction, respectively, and
   as separation distances of the substrate in an X direction orthogonal to the Y direction of a horizontal direction, the substrate is separated from the outer surface of the upper portion of the housing by a distance K4D1 corresponding to a distance from one side surface of the substrate in a transverse direction to the outer surface of the upper portion of the housing of the electronic equipment on one side in the transverse direction and by a distance K4D2 corresponding to a distance from the other side surface of the substrate in the transverse direction to the outer surface of the upper portion of the housing of the electronic equipment on the other side in the transverse direction, respectively.

5. The electronic equipment according to claim 1, wherein the substrate is separated from an outer surface of an upper portion of the housing by a distance K5 corresponding to a distance between one end portion of the substrate and the outer surface of the upper portion of the housing closest to the one end portion.

6. The electronic equipment according to claim 1, wherein the electronic circuit component and the optical element or the imaging element are arranged so as to be separated from each other in a vertical direction and a horizontal direction.

7. The electronic equipment according to claim 1, wherein the electronic circuit component and the optical element or the imaging element are arranged so as to be separated from each other in the Z direction of a vertical direction, in a Y direction of a horizontal direction, and in an X direction of the horizontal direction.

8. The electronic equipment according to claim 1, wherein the electronic circuit component and the optical element or the imaging element are arranged so as to be separated from each other in the Z direction of a vertical direction, in a Y direction of a horizontal direction, and in an X direction of the horizontal direction, and
the electronic circuit component and the optical element or the imaging element are arranged at diagonal positions on opposite sides in the X direction of the horizontal direction.

9. The electronic equipment according to claim 1, wherein the optical element or the imaging element is arranged in the bottom portion of the housing on one end side of the housing so as to be located at a position with a distance K6 from a lower side surface of an upper portion of the housing on one end side of the housing, the electronic circuit component is arranged at a position with a distance K4A from the lower side surface of the upper portion of the housing on the other end side of the housing, and the optical element or the imaging element and the electronic circuit component are separated from each other by a distance K7 in a Y direction of a horizontal direction.

10. The electronic equipment according to claim 1, wherein at least one or both of a power source unit and a light source unit are mounted on the substrate.

11. An electronic equipment which can be used in medical settings where a sterilization treatment by a high temperature and high pressure steam in an autoclave equipment is applied, the electronic equipment comprising:
a housing; and
a substrate which is arranged in an internal space of the housing and on which an electronic circuit component is mounted,
wherein the substrate is arranged so as to be separated from a bottom portion of the housing upward in a Z direction by a distance K1 corresponding to a distance between a lower surface of the bottom portion of the housing and a lower surface of the electronic circuit component in the Z direction and/or by a distance K2 corresponding to a distance between an upper surface of the bottom portion of the housing and a lower surface of the substrate in the Z direction,
the substrate is separated from an outer surface of an upper portion of the housing by a distance K3 corresponding to a distance between an upper surface of the electronic circuit component and the outer surface of the upper portion of the housing in the Z direction,
the electronic circuit component is separated from a lower side surface of the upper portion of the housing by a distance K4A corresponding to a distance between a center of the electronic circuit component and the lower side surface of the upper portion of the housing in a Y direction,
the center of the electronic circuit component in a transverse direction is separated from the lower side surface of the upper portion of the housing by a distance K4B in a transverse direction of the housing,
the substrate is separated from the outer surface of the upper portion of the housing by a distance K4C1 corresponding to a distance from one end surface of the substrate in a longitudinal direction to the outer surface of the upper portion of the housing on one side in the Y direction and by a distance K4C2 corresponding to a distance from the other end surface of the substrate in the longitudinal direction to the outer surface of the upper portion of the housing on the other side in the Y direction, respectively,
as separation distances of the substrate in an X direction orthogonal to the Y direction of a horizontal direction, the substrate is separated from the outer surface of the upper portion of the housing by a distance K4D1 corresponding to a distance from one side surface of the substrate in a transverse direction to the outer surface of the upper portion of the housing of the electronic equipment on one side in the transverse direction and by a distance K4D2 corresponding to a distance from the other side surface of the substrate in the transverse direction to the outer surface of the upper portion of the housing of the electronic equipment on the other side in the transverse direction, respectively,
the substrate is separated from the outer surface of the upper portion of the housing by a distance K5 corresponding to a distance between one end portion of the substrate and the outer surface of the upper portion of the housing closest to the one end portion, and
the electronic circuit component and the optical element or the imaging element are arranged so as to be separated from each other in the horizontal direction and a vertical direction.

12. An electronic equipment which can be used in medical settings where a sterilization treatment by a high temperature and high pressure steam in an autoclave equipment is applied, the electronic equipment comprising:
a housing; and
a substrate which is arranged in an internal space of the housing and on which an electronic circuit component is mounted,
wherein the substrate is arranged so as to be separated from a bottom portion of the housing upward in a Z direction by a distance K1 corresponding to a distance between a lower surface of the bottom portion of the housing and a lower surface of the electronic circuit component in the Z direction and/or by a distance K2 corresponding to a distance between an upper surface of the bottom portion of the housing and a lower surface of the substrate in the Z direction,
the substrate is separated from an outer surface of an upper portion of the housing by a distance K3 corresponding to a distance between an upper surface of the electronic circuit component and the outer surface of the upper portion of the housing in the Z direction,
the electronic circuit component is separated from a lower side surface of the upper portion of the housing by a distance K4A corresponding to a distance between a center of the electronic circuit component and the lower side surface of the upper portion of the housing in a Y direction, the center of the electronic circuit component in a transverse direction is separated from the lower side surface of the upper portion of the housing by a distance K4B in a transverse direction of the housing, the substrate is separated from the outer surface of the upper portion of the housing by a distance K4C1 corresponding to a distance from one end surface of the substrate in a longitudinal direction to the outer surface of the upper portion of the housing on one side in the Y direction and by a distance K4C2 corresponding to a distance from the other end surface of the substrate in the longitudinal direction to the outer surface of the upper portion of the housing on the other side in the Y direction, respectively, as separation distances of the substrate in an X direction orthogonal to the Y direction of a horizontal direction, the substrate is separated from the outer surface of the upper portion of the housing by a distance K4D1 corresponding to a distance from one side surface of the substrate in a transverse direction to the outer surface of the upper portion of the housing of the electronic equipment on one side in the transverse direction and by a distance K4D2 corresponding to a distance from the other side surface of the substrate in the transverse direction to the outer surface of the upper portion of the housing of the electronic equipment on the other side in the transverse direction, respectively, the substrate is separated from the outer surface of the upper portion of the housing by a distance K5 corresponding to a distance between one end portion of the substrate and the outer surface of the upper portion of the housing closest to the one end portion, and the optical element or the imaging element is arranged in the bottom portion of the housing on one end side of the housing so as to be located at a position with a distance K6 from the lower side surface of the upper portion of the housing on one end side of the housing, the electronic circuit component is arranged at a position with the distance K4A from the lower side surface of the upper portion of the housing on the other end side of the housing, and the optical element or the imaging element and the electronic circuit component are separated from each other by a distance K7 in the Y direction of the horizontal direction.

13. An electronic equipment which can be used in medical settings where a sterilization treatment by a high temperature and high pressure steam in an autoclave equipment is applied, the electronic equipment comprising:
a housing;
a substrate which is arranged in an internal space of the housing and on which an electronic circuit component is mounted; and
an optical element or an imaging element which is arranged in a part of a bottom portion of the housing and through which image light from outside enters,
wherein the optical element or the imaging element and the electronic circuit component are connected by a transmission unit capable of transmitting the image light or an electric signal corresponding to the image light so as to be separated from each other,
the substrate is separated from the bottom portion of the housing upward in a Z direction by a distance K1 corresponding to a distance between a lower surface of the bottom portion of the housing and a lower surface of the electronic circuit component in the Z direction and/or by a distance K2 corresponding to a distance between an upper surface of the bottom portion of the housing and a lower surface of the substrate in the Z direction,
the substrate is separated from an outer surface of an upper portion of the housing by a distance K3 corresponding to a distance between an upper surface of the electronic circuit component and the outer surface of the upper portion of the housing in the Z direction,
the electronic circuit component is separated from a lower side surface of the upper portion of the housing by a distance K4A corresponding to a distance between a center of the electronic circuit component and the lower side surface of the upper portion of the housing in a Y direction, and is separated from an outer side surface of the upper portion of the housing in a transverse direction by a distance K4B corresponding to a distance between the center of the electronic circuit component and the outer side surface of the upper portion of the housing in the transverse direction, in an X direction orthogonal to the Y direction,
the substrate is separated from the outer surface of the upper portion of the housing by a distance K5 corresponding to a distance between one end portion of the substrate and the outer surface of the upper portion of the housing closest to the one end portion, and
a ratio among the distances K1 to K5 is K1:K2:K3:K4A:K4B:K5=3:2:4:5:5:11 to 14.

14. An electronic equipment which can be used in medical settings where a sterilization treatment by a high temperature and high pressure steam in an autoclave equipment is applied, the electronic equipment comprising:
a housing;
a substrate which is arranged in an internal space of the housing and on which an electronic circuit component is mounted; and
an optical element or an imaging element which is arranged in a part of a bottom portion of the housing and through which image light from outside enters,
wherein the optical element or the imaging element and the electronic circuit component are connected by a transmission unit capable of transmitting the image light or an electric signal corresponding to the image light so as to be separated from each other,
the substrate is separated from a bottom portion of the housing upward in a Z direction by a distance K1 corresponding to a distance between a lower surface of the bottom portion of the housing and a lower surface of the electronic circuit component in the Z direction and/or by a distance K2 corresponding to a distance between an upper surface of the bottom portion of the housing and a lower surface of the substrate in the Z direction,
the substrate is separated from an outer surface of an upper portion of the housing by a distance K3 corresponding to a distance between an upper surface of the electronic circuit component and the outer surface of the upper portion of the housing in the Z direction,
the electronic circuit component is separated from a lower side surface of the upper portion of the housing by a distance K4A corresponding to a distance between a center of the electronic circuit component and the lower side surface of the upper portion of the housing in a Y direction, and is separated from an outer side surface of the upper portion of the housing in a transverse direction by a distance K4B corresponding to a distance between the center of the electronic circuit component and the outer side surface of the upper portion of the housing in the transverse direction, in an X direction orthogonal to the Y direction, the substrate is separated from the outer surface of the upper portion of the housing by a distance K5 corresponding to a distance between one end portion of the substrate and the outer surface of the upper portion of the housing closest to the one end portion, the optical element or the imaging element is arranged in the bottom portion of the housing on one end side of the housing so as to be located at a position with a distance K6 from the lower side surface of the upper portion of the housing on one end side of the housing, the electronic circuit component is arranged at a position with the distance K4A from the lower side surface of the upper portion of the housing on the other end side of the housing, and the optical element or the imaging element and the electronic circuit component are separated from each other by a distance K7 in the Y direction of the horizontal direction, and a ratio among the distances K4A, K6, and K7 is K4A: K6:K7=2:1:6.

15. An electronic equipment which can be used in medical settings where a sterilization treatment by a high temperature and high pressure steam in an autoclave equipment is applied, the electronic equipment being a mouse for input and operation of a computer, the mouse comprising:

a housing;

a substrate which is arranged in an internal space of the housing and on which an electronic circuit component for calculating and controlling a state of the electronic equipment is mounted; and an optical element or an imaging element which is arranged in a part of a bottom portion of the housing and through which image light from outside enters, wherein the optical element or the imaging element and the electronic circuit component are connected by a transmission unit capable of transmitting the image light or an electric signal corresponding to the image light so as to be separated from each other, the substrate is separated from the bottom portion of the housing upward in a Z direction by a distance K1 corresponding to a distance between a lower surface of the bottom portion of the housing and a lower surface of the electronic circuit component in the Z direction and/or by a distance K2 corresponding to a distance between an upper surface of the bottom portion of the housing and a lower surface of the substrate in the Z direction, the substrate is separated from an outer surface of an upper portion of the housing by a distance K3 corresponding to a distance between an upper surface of the electronic circuit component and the outer surface of the upper portion of the housing in the Z direction, the electronic circuit component is separated from a lower side surface of the upper portion of the housing by a distance K4A corresponding to a distance between a center of the electronic circuit component and the lower side surface of the upper portion of the housing in a Y direction, and is separated from an outer side surface of the upper portion of the housing in a transverse direction by a distance K4B corresponding to a distance between the center of the electronic circuit component and the outer side surface of the upper portion of the housing in the transverse direction, in an X direction orthogonal to the Y direction, the substrate is separated from the outer surface of the upper portion of the housing by a distance K5 corresponding to a distance between one end portion of the substrate and the outer surface of the upper portion of the housing closest to the one end portion, and dimensions of the distances K1 to K5 are as follows: the distance K1 is 10 to 25 mm, the distance K2 is 5 to 20 mm, the distance K3 is 20 to 35 mm, the distance K4A is 15 to 50 mm, the distance K4B is 22.5 to 37.5 mm, and the distance K5 is 13 to 90 mm.

16. The electronic equipment according to claim 15, wherein the distance K1 is 12 to 20 mm, the distance K2 is 7 to 15 mm, the distance K3 is 12 to 25 mm, the distance K4A is 20 to 30 mm, the distance K4B is 22.5 to 37.5 mm, the distance K5 is 45 to 85 mm, the distance K6 is 8 to 50 mm, and the distance K7 is 30 to 90 mm.

17. The electronic equipment according to claim 15, wherein an overall height of the electronic equipment is 30 to 50 mm, an overall length thereof is 80 to 130 mm, and an overall width thereof is 45 to 75 mm.

18. An electronic equipment which can be used in medical settings where a sterilization treatment by a high temperature and high pressure steam in an autoclave equipment is applied, the electronic equipment comprising:

a housing;

a substrate arranged in an internal space of the housing;

an electronic circuit component mounted on the substrate;

an optical element or an imaging element which is arranged in a part of the housing and through which image light from outside enters; and a transmission unit which connects the optical element or the imaging element and the electronic circuit component and can transmit the image light or an electric signal corresponding to the image light between the optical element or the imaging element and the electronic circuit component, wherein the substrate and the electronic circuit component are arranged so as to be separated from the part of the housing where the optical element or the imaging element is arranged, via a space portion;

wherein a lens is arranged as the optical element in a part of the bottom portion of the housing, an image sensor is connected to or mounted in the electronic circuit component, and the transmission unit is composed of at least one of an optical fiber, a light guide, and a lens barrel.

19. An electronic equipment which can be used in medical settings where a sterilization treatment by a high temperature and high pressure steam in an autoclave equipment is applied, the electronic equipment comprising:

a housing;

a substrate arranged in an internal space of the housing;

an electronic circuit component mounted on the substrate;

an optical element or an imaging element which is arranged in a part of the housing and through which image light from outside enters; and a transmission unit which connects the optical element or the imaging element and the electronic circuit component and can transmit the image light or an electric signal corresponding to the image light between the optical element or the imaging element and the electronic circuit component, wherein the substrate and the electronic circuit component are arranged so as to be separated from the part of the housing where the optical element or the imaging element is arranged, via a space portion;

wherein an image sensor as the imaging element is arranged in a part of a bottom portion of the housing, the image sensor and the electronic circuit component are connected by an electrical wiring as the transmission unit, and the image sensor has at least a heat resistance property, a waterproofing property, and a pressure resistance property or a cover having at least a heat resistance property, a waterproofing property, a pressure resistance property, and a light transparent property is arranged under the image sensor.

20. The electronic equipment according to claim 19, wherein the light source unit is arranged in a part of the bottom portion of the housing, and the light source unit has at least a heat resistance property, a waterproofing property, and a pressure resistance property or a cover having at least a heat resistance property, a waterproofing property, a pressure resistance property, and a light transparent property is arranged under the light source unit.

21. An electronic equipment which can be used in medical settings where a sterilization treatment by a high temperature and high pressure steam in an autoclave equipment is applied, the electronic equipment comprising:

a housing;

a substrate arranged in an internal space of the housing;

an electronic circuit component mounted on the substrate;

an optical element or an imaging element which is arranged in a part of the housing and through which image light from outside enters; and a transmission unit which connects the optical element or the imaging element and the electronic circuit component and can transmit the image light or an electric signal corresponding to the image light between the optical element or the imaging element and the electronic circuit component, wherein the substrate and the electronic circuit component are arranged so as to be separated from the part of the housing where the optical element or the imaging element is arranged, via a space portion;

wherein a lens structure including one or more lenses and a lens barrel is arranged as the optical element in an opening formed in a part of the bottom portion of the housing, the lens barrel is fixed to a fixing portion provided in the part of the bottom portion, a sealing material is interposed between the fixing portion and the lens barrel, a space portion of the lens barrel is divided by the lenses to form a light transparent thermal insulation portion, and a thermal insulation filter or a cover having at least a heat resistance property, a waterproofing property, a pressure resistance property, and a light transparent property is provided to the opening or the opening of the lens structure.

22. An electronic equipment which can be used in medical settings where a sterilization treatment by a high temperature and high pressure steam in an autoclave equipment is applied, the electronic equipment comprising:

a housing;

a substrate arranged in an internal space of the housing;

an electronic circuit component mounted on the substrate;

an optical element or an imaging element which is arranged in a part of the housing and through which image light from outside enters; and a transmission unit which connects the optical element or the imaging element and the electronic circuit component and can transmit the image light or an electric signal corresponding to the image light between the optical element or the imaging element and the electronic circuit component, wherein the substrate and the electronic circuit component are arranged so as to be separated from the part of the housing where the optical element or the imaging element is arranged, via a space portion;

wherein the substrate is formed to have a box shape or a cylindrical shape including a bottom surface portion and a side surface portion, a spherical shape, an ellipsoidal shape, or a polyhedral shape similar to those, and components including the electronic circuit component are arranged in an internal space of the substrate having the box shape, the cylindrical shape, the spherical shape, the ellipsoidal shape, or the polyhedral shape similar to those; and wherein a shortest distance between an inner surface of the housing and an outer surface of the substrate having the box shape, the cylindrical shape, the spherical shape, the ellipsoidal shape, or the polyhedral shape similar to those is 3 to 20 mm.

23. The electronic equipment according to claim 22, wherein a shortest distance between the inner surface of the housing and the outer surface of the substrate having the box shape, the cylindrical shape, the spherical shape, the ellipsoidal shape, or the polyhedral shape similar to those is 13 to 20 mm.

24. An electronic equipment which can be used in medical settings where a sterilization treatment by a high temperature and high pressure steam in an autoclave equipment is applied, the electronic equipment comprising:

a housing;

a substrate arranged in an internal space of the housing;

an electronic circuit component mounted on the substrate;

an optical element or an imaging element which is arranged in a part of the housing and through which image light from outside enters; and a transmission unit which connects the optical element or the imaging element and the electronic circuit component and can transmit the image light or an electric signal corresponding to the image light between the optical element or the imaging element and the electronic circuit component, wherein the substrate and the electronic circuit component are arranged so as to be separated from the part of the housing where the optical element or the imaging element is arranged, via a space portion;

wherein a light source unit is not provided in the housing; and wherein a light inlet portion for taking light into the housing is provided as a slant portion of a bottom surface of the housing.

* * * * *